US012677651B2

(12) United States Patent
Zhou et al.

(10) Patent No.: US 12,677,651 B2
(45) Date of Patent: Jul. 7, 2026

(54) SELF-ALIGNED BURIED POWER RAIL FORMATION FOR SEMICONDUCTOR DEVICES

(71) Applicant: International Business Machines Corporation, Armonk, NY (US)

(72) Inventors: Huimei Zhou, Albany, NY (US); Huiming Bu, Glenmont, NY (US); Miaomiao Wang, Albany, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 754 days.

(21) Appl. No.: 17/506,365

(22) Filed: Oct. 20, 2021

(65) Prior Publication Data

US 2023/0117743 A1 Apr. 20, 2023

(51) Int. Cl.
*H10W 20/41* (2026.01)
*H10D 84/83* (2025.01)
*H10W 20/00* (2026.01)

(52) U.S. Cl.
CPC .......... *H10W 20/427* (2026.01); *H10D 84/83* (2025.01); *H10D 84/834* (2025.01); *H10W 20/056* (2026.01); *H10W 20/089* (2026.01)

(58) Field of Classification Search
CPC ............... H01L 23/5286; H01L 21/743; H01L 21/76816–76877; H10D 84/83–834; H10W 20/427; H10W 20/056; H10W 20/089
See application file for complete search history.

(56) References Cited

U.S. PATENT DOCUMENTS

| | | | |
|---|---|---|---|
| 10,388,519 B2 | 8/2019 | Smith et al. |
| 10,720,391 B1 | 7/2020 | Paul et al. |
| 10,811,415 B2 | 10/2020 | Sengupta et al. |
| 10,833,078 B2 | 11/2020 | Smith et al. |
| 10,957,575 B2 | 3/2021 | Yakimets et al. |
| 11,101,348 B2 | 8/2021 | Xie et al. |
| 2018/0145030 A1 | 5/2018 | Beyne et al. |

(Continued)

FOREIGN PATENT DOCUMENTS

| | | |
|---|---|---|
| EP | 4420162 A1 | 8/2024 |
| JP | 2020-524907 A | 8/2020 |

(Continued)

OTHER PUBLICATIONS

International Search Report and Written Opinion dated Mar. 3, 2023, received in a corresponding foreign application, 9 pages.

(Continued)

*Primary Examiner* — Britt Hanley
*Assistant Examiner* — Casey Paul Boatman
(74) *Attorney, Agent, or Firm* — Scully, Scott, Murphy & Presser, P.C.; Samuel Waldbaum

(57) ABSTRACT

A self-aligned buried power rail having an adjustable height is formed between a first semiconductor device region and a second semiconductor device region. The self-aligned buried power rail having the adjustable height has improved conductivity. Notably, the self-aligned buried power rail has a first portion having a first height that is present in a gate cut trench and a second portion having a second height, which is greater than the first height, that is present in a source/drain cut trench.

9 Claims, 46 Drawing Sheets

(56) References Cited

U.S. PATENT DOCUMENTS

| | | | |
|---|---|---|---|
| 2018/0151494 | A1 | 5/2018 | Ohtou et al. |
| 2018/0294367 | A1 | 10/2018 | Sun et al. |
| 2018/0374791 | A1 | 12/2018 | Smith et al. |
| 2019/0080969 | A1 | 3/2019 | Tsao |
| 2019/0348367 | A1 | 11/2019 | Fu et al. |
| 2020/0006112 | A1 | 1/2020 | Licausi et al. |
| 2020/0098681 | A1* | 3/2020 | Kim ..................... H01L 23/528 |
| 2020/0111798 | A1 | 4/2020 | Paul et al. |
| 2020/0135578 | A1 | 4/2020 | Ching et al. |
| 2020/0411436 | A1 | 12/2020 | Xie et al. |
| 2021/0028112 | A1 | 1/2021 | Kim et al. |
| 2021/0035860 | A1 | 2/2021 | Dentoni Litta et al. |
| 2021/0082815 | A1 | 3/2021 | Doornbos |
| 2021/0098294 | A1 | 4/2021 | Smith et al. |
| 2022/0093647 | A1* | 3/2022 | Sung .................... H10D 84/038 |
| 2022/0157722 | A1* | 5/2022 | Bouche ............. H01L 21/76897 |

FOREIGN PATENT DOCUMENTS

| | | |
|---|---|---|
| JP | 2023-061913 A | 5/2023 |
| WO | 2021/075540 A1 | 4/2021 |
| WO | 2023/066796 A1 | 4/2023 |

OTHER PUBLICATIONS

Weckx, P., et al., "Novel forksheet device architecture as ultimate logic scaling device towards 2nm", 2019 IEEE International Electron Devices Meeting (IEDM), Date of Conference: Dec. 7-11, 2019, 4 pages.

Chehab, B., et al. "Standard cell architectures for N2 node: transition from FinFET to nanosheet and to forksheet device", Proceedings of SPIE 11328, Mar. 23, 2020, 9 pages.

Japan Patent Office, "Decision to Grant a Patent" Mar. 17, 2026, 04 Pages, JP Application No. 2022-166995.

* cited by examiner

SELF-ALIGNED BURIED POWER RAIL FORMATION FOR SEMICONDUCTOR DEVICES

BACKGROUND

The present application relates to semiconductor technology, and more particular to a semiconductor structure having a self-aligned buried power rail that is located between a first semiconductor device region and a second semiconductor device region.

When forming a structure including a plurality of complementary metal oxide semiconductor (CMOS) devices, such as integrated circuits, standard cells may be used as a base unit for designing and manufacturing the integrated circuits. The standard cell(s) may be used to form one or more functional circuits, and each standard cell may have the same footprint (e.g., may have a standard footprint). Using standard cells when designing complex circuits and components reduces design and manufacture costs.

In use, each standard cell of a semiconductor device requires power input (Vdd) and ground (Vss) connections. To power the various components thereof, each standard cell is generally coupled to a buried power rail which is electrically connected to an active layer of the standard cell to provide the power (Vdd). In some instances, a plurality of buried power rails may be provided for each standard cell to respectively provide the power (Vdd) and the ground (Vss).

Buried power rails are typically embedded in a shallow trench isolation structure that is located between adjacent semiconductor device containing regions. However, typical buried power rail formation is limited, in terms of its conductivity, by contact overlay issues with other conductive elements/components of the cell.

SUMMARY

A self-aligned buried power rail having an adjustable height is formed between a first semiconductor device region and a second semiconductor device region. The self-aligned buried power rail having the adjustable height has improved conductivity. Notably, the self-aligned buried power rail has a first portion having a first height that is present in a gate cut trench and a second portion having a second height, which is greater than the first height, that is present in a source/drain cut trench. The term "gate cut trench" is used throughout the present application to denote an area between the first and second device regions in which a gate is cut, while the term "source/drain cut trench" is used throughout the present application to denote an area between the first and second device regions in which the source/drain region is cut.

In one aspect of the present application, a semiconductor structure containing a self-aligned buried power rail is provided. In one embodiment of the present application, the semiconductor structure includes a first semiconductor device region including at least one semiconductor device and a second semiconductor device region including at least one other semiconductor device. A buried power rail is located between the first semiconductor device region and the second semiconductor device region, wherein a first portion of the buried power rail having a first height is present in a gate cut trench and a second portion of the buried power rail having a second height, which is greater than the first height, is present in a source/drain cut trench. A conductive contact structure is also present that directly contacts at least a source/drain region of the at least one first semiconductor device that is present in the first semiconductor device region and the second portion of the buried power rail that is present in the source/drain cut trench. In some embodiments, the conductive contact structure also directly contacts a source/drain region of the at least one other semiconductor device that is present in the second semiconductor device region.

In one example, the first semiconductor device region includes a first combined sheet device including a first nanosheet device and a second nanosheet device, wherein the first nanosheet device is located on a first side of a first dielectric pillar and the second nanosheet device is located on a second side of the first dielectric pillar, and the first side of the first dielectric pillar is opposite the second side of the first dielectric pillar. In this example, the second semiconductor device region includes a second combined sheet device that includes a third nanosheet device and a fourth nanosheet device, wherein the third nanosheet device is located on a first side of a second dielectric pillar and the fourth nanosheet device is located on a second side of the second dielectric pillar, and the first side of the second dielectric pillar is opposite the second side of the second dielectric pillar, and wherein the second nanosheet device of the first combined sheet device faces the third nanosheet device of the second combined sheet device. In this example, the buried power rail is located between the first combined sheet device and the second combined sheet device. In this one example, the conductive contact structure directly contacts at least a source/drain region of the second nanosheet device of the first combined sheet device and the second portion of the buried power rail that is present in the source/drain cut trench. In some embodiments and in this example, the conductive contact structure also directly contacts a source/drain region of the third nanosheet device of the second combined sheet device.

In yet another embodiment of the present application, the semiconductor structure includes a first semiconductor device region including at least one semiconductor device and a second semiconductor device region including at least one other semiconductor device. A buried power rail is located between the first semiconductor device region and the second semiconductor device region, wherein a first portion of the buried power rail having a first height is present in a gate cut trench and a second portion of the buried power rail having a second height, which is greater than the first height, is present in a source/drain cut trench. A first conductive contact structure is present that directly contacts a source/drain region of the at least one semiconductor device present in the first semiconductor device region, but not the second portion of the buried power rail, and a second conductive contact structure is present that directly contacts a source/drain region of the at least one other semiconductor device present in the second semiconductor device region, but not the second portion of the buried power rail.

In one example, the first semiconductor device region includes a first combined sheet device including a first nanosheet device and a second nanosheet device, wherein the first nanosheet device is located on a first side of a first dielectric pillar and the second nanosheet device is located on a second side of the first dielectric pillar, and the first side of the first dielectric pillar is opposite the second side of the first dielectric pillar. In this example, the second semiconductor device region includes a second combined sheet device that includes a third nanosheet device and a fourth nanosheet device, wherein the third nanosheet device is located on a first side of a second dielectric pillar and the fourth nanosheet device is located on a second side of the second dielectric pillar, and the first side of the second dielectric pillar is opposite the second side of the second dielectric pillar, and wherein the second nanosheet device of the first combined sheet device faces the third nanosheet device of the second combined sheet device. In this one example, the buried power rail is located between the first combined sheet device and the second combined sheet device. In this one example, the first conductive contact structure directly contacts a source/drain region of the second nanosheet device of the first combined sheet device, but not the second portion of the buried power rail, and the second conductive contact structure directly contacts a source/drain region of the third nanosheet device of the second combined sheet device, but not the second portion of the buried power rail.

In a further embodiment of the present application, the semiconductor structure includes a first semiconductor device region including at least one semiconductor device and a second semiconductor device region including at least one other semiconductor device. A buried power rail is located between the first semiconductor device region and the second semiconductor device region, wherein a first portion of the buried power rail having a first height is present in a gate cut trench and a second portion of the buried power rail having a second height, which is greater than the first height, is present in a source/drain cut trench. A conductive contact structure is also present that directly contacts the second portion of the buried power rail that is present in the source/drain cut trench, but not a source/drain region present in the first semiconductor device region, or a source/drain region present in the second semiconductor device region.

In one example, the first semiconductor device region includes a first combined sheet device including a first nanosheet device and a second nanosheet device, wherein the first nanosheet device is located on a first side of a first dielectric pillar and the second nanosheet device is located on a second side of the first dielectric pillar, and the first side of the first dielectric pillar is opposite the second side of the first dielectric pillar. In this example, the second semiconductor device region includes a second combined sheet device that includes a third nanosheet device and a fourth nanosheet device, wherein the third nanosheet device is located on a first side of a second dielectric pillar and the fourth nanosheet device is located on a second side of the second dielectric pillar, and the first side of the second dielectric pillar is opposite the second side of the second dielectric pillar, and wherein the second nanosheet device of the first combined sheet device faces the third nanosheet device of the second combined sheet device. In this one example, the buried power rail is located between the first combined sheet device and the second combined sheet device. In this one example, the conductive contact structure directly contacts the second portion of the buried power rail that is present in the source/drain cut trench, but not a source/drain region present in the first semiconductor device region, or a source/drain region present in the second semiconductor device region.

In another aspect of the present application, various methods of providing the above mentioned semiconductor structures are provided. In one embodiment, the method includes the use of a sacrificial material as a buried power rail placeholder material. In yet another embodiment, the method does not include the use of such a sacrificial material layer. In either embodiment, the method allows for providing a self-aligned buried power rail having an adjustable height. The various methods of the present application will become apparent in the following drawings and detailed discussion to follow which illustrate a combined sheet device as one non-limiting example.

BRIEF DESCRIPTION OF THE DRAWINGS

FIGS. 24A, 24B and 24C are cross sectional views of the exemplary structure shown in FIGS. 23A, 23B and 23C, respectively, after performing a source/drain cut in which a source/drain cut trench is formed that physically exposes the buried power rail conductive material layer.

DETAILED DESCRIPTION

Figure 1:
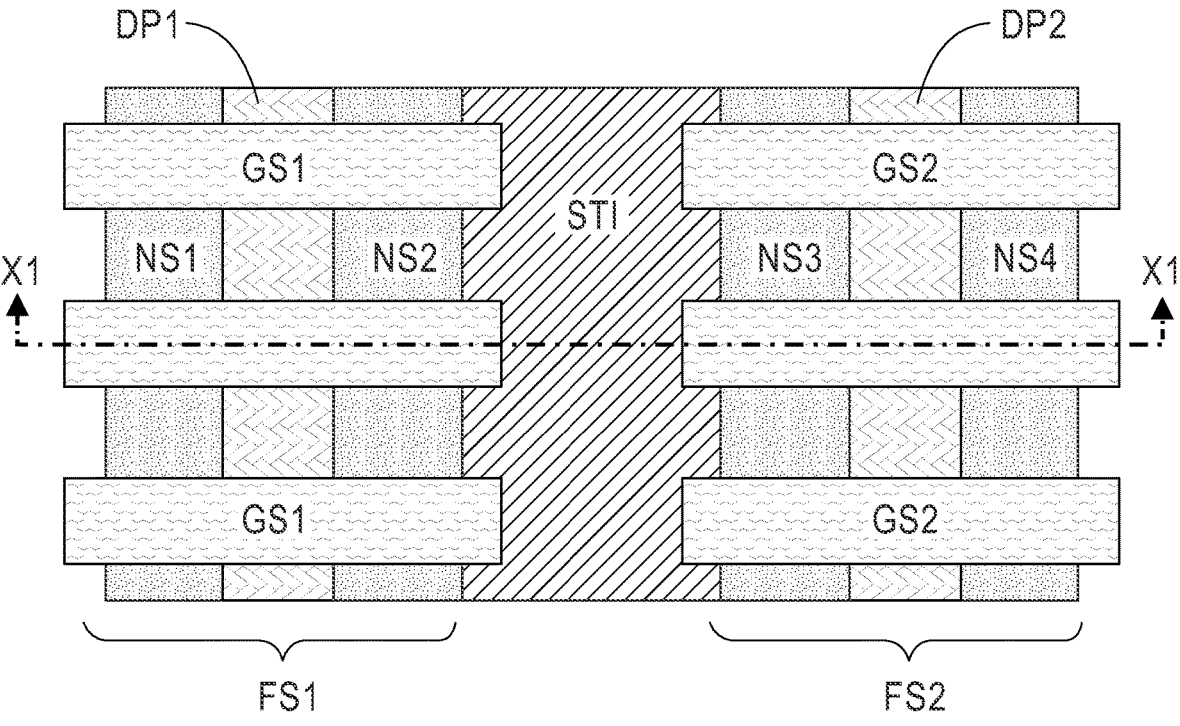
FIG. 1 is cell layout including two combined sheet devices regions separated by a trench isolation structure that can be employed in the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

In the following description, and by way of one example, the present application illustrates that the buried power rail is formed between a first semiconductor device region containing a first combined sheet device and a second semiconductor device region containing a second combined sheet device. Although the present application describes and illustrates, such a structure, the present application is not limited to the same. Instead, the buried power rail of the present application can be formed between a first semiconductor device region and a second semiconductor device region including any type of semiconductor device including, but not limited to, nanosheet containing devices (including, for example, combined nanosheet devices (such as, for example, combined sheet devices) or non-combined nanosheet devices), finFET containing semiconductor devices, semiconductor nanowire containing devices, or at least planar semiconductor devices. In nanosheet containing devices, semiconductor channel material nanosheets are employed as the semiconductor channel material containing structures. In finFET containing devices, semiconductor fins are employed as the semiconductor channel material containing structures. In semiconductor nanowire containing devices, semiconductor nanowires are employed as the semiconductor channel material containing structures. In planar semiconductor devices, a planar semiconductor material can be employed as the semiconductor channel material containing structures. The semiconductor device present in the first semiconductor device region can be the same or different from the semiconductor device present in the second semiconductor device region. Typically, the first and second semiconductor device regions include a same type of semiconductor device.

Referring first to FIG. 1, there is illustrated a cell layout including two combined sheet devices regions FS1 and FS2, respectively, separated by a trench isolation structure STI that can be employed in the present application. Although such a cell layout is described and illustrated, other cell layouts including any number of combined sheet devices can be employed in the present application.

Referring back to FIG. 1, the first combined sheet device region FS1 includes a first dielectric pillar DP1 that separates a first vertical stack of suspended semiconductor channel material nanosheets NS1 from a second vertical stack of suspended semiconductor channel material nanosheets NS2. First functional gate structures GS1 are shown in the first combined sheet device region FS1, which straddle over, and wrap around, the first and second vertical stacks of suspended semiconductor channel material nanosheets NS1 and NS2, respectively. Collectively, each vertical stack of suspended semiconductor channel material nanosheets and the functional gate structure provides a nanosheet device of the present application. The second combined sheet device region FS2, includes a second dielectric pillar DP2, that separates a third vertical stack of suspended semiconductor channel material nanosheets NS3 from a fourth vertical stack of suspended semiconductor channel material nanosheets NS4. Second functional gate structures GS2 are shown in the second combined sheet device region FS2 which straddle over, and wrap around, the third and fourth vertical nanosheet stacks of suspended semiconductor channel material nanosheets NS3 and NS4, respectively. FIG. 1 also shows a cut X1-X1 that passes through each of the first and second combined sheet device regions FS1 and FS2, and is present along an area that corresponds to a length-wise direction of laterally adjacent first and second functional gate structures GS1 and GS2.

Figure 2:
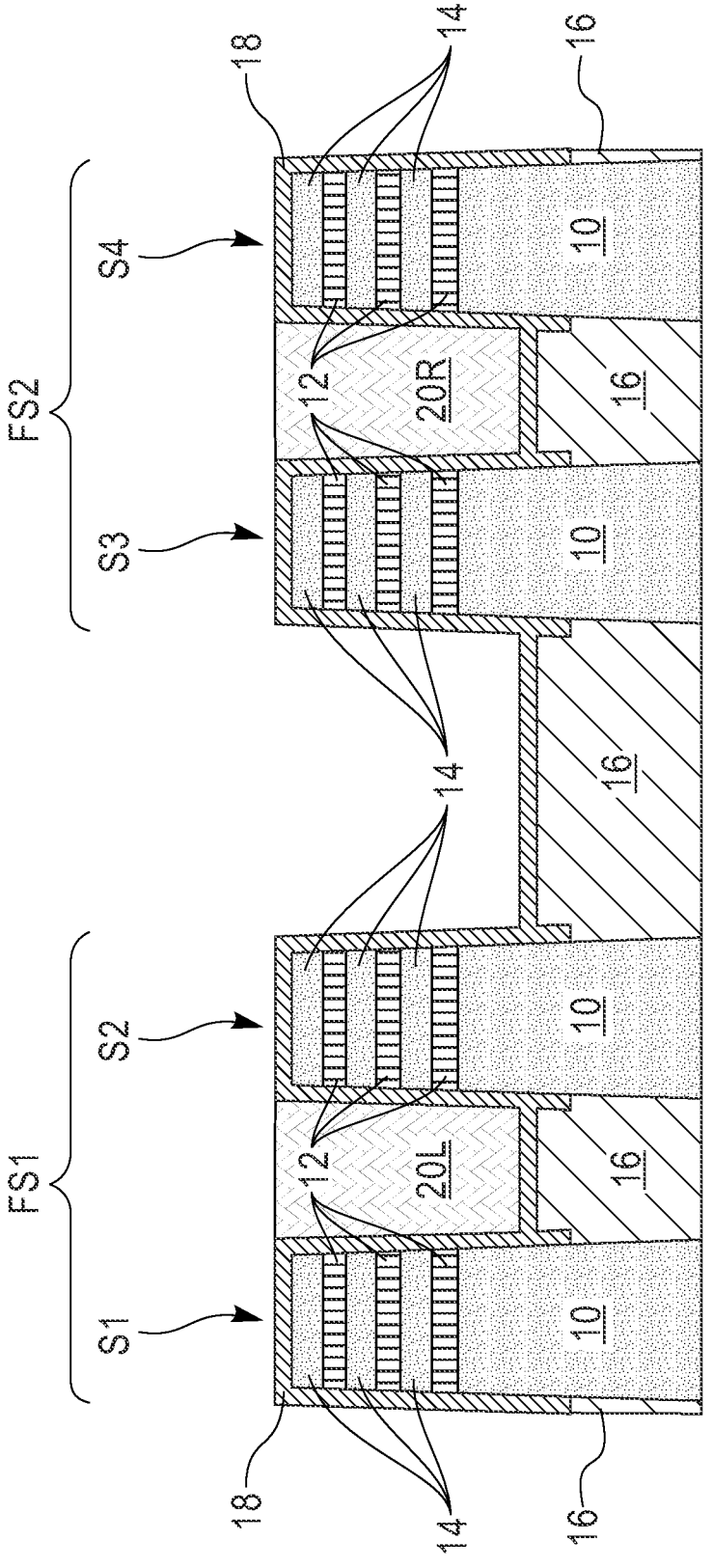
FIG. 2 is an exemplary structure along cut X1-X1 shown in FIG. 1 of the present application, the exemplary structure includes a shallow trench isolation structure separating a first combined sheet device region from a second combined sheet device region, the first sheet device region includes a first nanosheet stack and a second nanosheet stack separated by a first dielectric pillar, and the second combined sheet device region includes a third nanosheet stack and a fourth nanosheet stack separated by a second dielectric pillar, the structure further includes a first dielectric material layer located atop and laterally adjacent each of the first, second, third and fourth nanosheet stacks.

Referring now to FIG. 2, there is illustrated an exemplary structure along cut X1-X1 shown in FIG. 1 of the present application. The exemplary structure includes a shallow trench isolation structure 16 separating a first combined sheet device region FS1 from a second combined sheet device region FS2. The first sheet device region FS1 includes a first nanosheet stack S1 and a second nanosheet stack S2 separated by a first dielectric pillar 20L, and the second combined sheet device region FS2 includes a third nanosheet stack S3 and a fourth nanosheet stack S4 separated by a second dielectric pillar 20R. The exemplary structure shown in FIG. 1 further includes a first dielectric material layer 18 located atop and laterally adjacent each of the first, second, third and fourth nanosheet stacks S1, S2, S3 and S4.

As is shown in FIG. 2, each of the first, second, third and fourth nanosheet stacks S1, S2, S3 and S4 is located on a pedestal portion 10 of a semiconductor substrate. Each pedestal portion 10 is composed of a semiconductor material including, for example, silicon (Si), a silicon germanium (SiGe) alloy, a silicon germanium carbide (SiGeC) alloy, germanium (Ge), a III/V compound semiconductor, an II/VI compound semiconductor or a multilayered stack including at least two semiconductor materials (e.g., a multilayered stack of Si and SiGe).

In some embodiments, the semiconductor substrate can be a bulk semiconductor substrate. By "bulk semiconductor substrate" it is meant a substrate that is composed entirely of one or more semiconductor materials. In embodiments in which a bulk semiconductor substrate is employed, the pedestal portions 10 are formed from an upper semiconductor material of the bulk semiconductor substrate. In other embodiments, the semiconductor substrate can be a semiconductor-on-insulator (SOI) substrate. A SOI substrate includes a dielectric material (e.g., silicon dioxide and/or boron nitride) sandwiched between bottom semiconductor material and a top semiconductor material. In such an embodiment, the pedestal portions 10 are formed from the top semiconductor material of the SOI substrate.

As is further shown in FIG. 2 each of first, second, third and fourth nanosheet stacks S1, S2, S3 and S4 includes alternating sacrificial semiconductor material nanosheets 12 and semiconductor channel material nanosheets 14. Each of the first, second, third and fourth nanosheet stacks S1, S2, S3 and S4 includes an equal number of sacrificial semiconductor material nanosheets 12 and semiconductor channel material nanosheets 14. As shown in FIG. 2 and by way of one embodiment of the present application, each of the first, second, third and fourth nanosheet stacks S1, S2, S3 and S4 can include three sacrificial semiconductor material nanosheets 12 and three semiconductor channel material nanosheets 14. Each sacrificial semiconductor material nanosheet 12 is composed of a first semiconductor material, while each semiconductor channel material nanosheet 14 is composed of a second semiconductor material that is compositionally different from the first semiconductor material. In some embodiments, the second semiconductor material that provides each semiconductor channel material nanosheet 14 is a semiconductor material that is capable of providing high channel mobility for nFET devices. In other embodiments, the second semiconductor material that provides each semiconductor channel material nanosheet 14 is a semiconductor material that is capable of providing high channel mobility for pFET devices.

The first semiconductor material that provides each sacrificial semiconductor material nanosheet 12 and the second semiconductor material that provides each semiconductor channel material nanosheet 14 can include one of the semiconductor materials mentioned above for the pedestal portions 10 of the semiconductor substrate. In the present application, the first semiconductor material that provides each sacrificial semiconductor material nanosheet 12 is compositionally different from the pedestal portions 10 of the semiconductor substrate. The second semiconductor material that provides each semiconductor channel material nanosheet 14 can be compositionally the same as, or compositionally different from, the pedestal portions 10 of the semiconductor substrate. Typically, the second semiconductor material that provides each semiconductor channel material nanosheet 14 is compositionally the same as the pedestal portions 10 of the semiconductor material portion of the semiconductor substrate. In one example, the pedestal portions 10 of the semiconductor substrate are composed of S1, the first semiconductor material that provides each sacrificial semiconductor material nanosheet 12 is composed of a SiGe alloy, and the second semiconductor material that provides each semiconductor channel material nanosheet 14 is composed of S1. Other combinations of semiconductor materials are possible as long as the first semiconductor material that provides each sacrificial semiconductor material nanosheet 12 is compositionally different from the second semiconductor material that provides each semiconductor channel material nanosheet 14.

The width of each sacrificial semiconductor material nanosheet 12 may be the same or different. A typical width for each sacrificial semiconductor material nanosheet 12 is from 1 nm to 20 nm. Other widths are contemplated and can be used as the width of each sacrificial semiconductor material nanosheet 12. The width of each semiconductor channel material nanosheet 14 may be the same or different. A typical width for each semiconductor channel material nanosheet 14 is from 1 nm to 20 nm. Other widths are contemplated and can be used as the width of each semiconductor channel material nanosheet 14. The thickness (i.e., vertical height) of each sacrificial semiconductor material nanosheet 12 may be the same or different. A typical thickness for each sacrificial semiconductor material nanosheet 12 is from 1 nm to 20 nm. Other thicknesses are contemplated and can be used as the thickness of each sacrificial semiconductor material nanosheet 12. The thickness of each semiconductor channel material nanosheet 14 may be the same or different. A typical thickness for each semiconductor channel material nanosheet 14 is from 1 nm to 20 nm. Other thicknesses are contemplated and can be used as the thickness of each semiconductor channel material nanosheet 14.

The shallow trench isolation structure 16 can be composed of a trench dielectric material such as, for example, silicon dioxide, silicon nitride, silicon oxynitride, or any suitable combination of those dielectric materials. As shown in FIG. 2, the shallow trench isolation structure 16 typically has a topmost surface that is recessed below a topmost surface of each pedestal portion 10 of the semiconductor substrate.

The first dielectric material layer 18 can be composed of a same or different dielectric material as the shallow trench isolation structure 16. Exemplary dielectric materials for the first dielectric material layer 18 include, but are not limited to, silicon dioxide of silicon oxynitride. The first dielectric material layer 18 can be a conformal layer. By "conformal layer" it is meant that a material layer has a thickness along horizontal surfaces that is the same as a thickness of the same material layer along vertical surfaces. The first dielectric material layer 18 can have a thickness from 2 nm to 15 nm; although other thicknesses for the first dielectric material layer 18 are contemplated and can be used as the thickness of the first dielectric material layer 18.

The first and second dielectric pillars 20L, 20R are composed of a dielectric material that is compositionally different from the dielectric material that provides the first dielectric material layer 18. In one example, and when the first dielectric material layer 18 is composed of silicon dioxide, the first and second dielectric pillars 20L, 20R are composed of silicon nitride. The first and second dielectric pillars 20L, 20R can have a topmost surface that is coplanar with a topmost horizontal surface of the first dielectric material layer 18 that is present atop each of the first, second, third and fourth nanosheet stacks S1, S2, S3 and S4.

The exemplary structure shown in FIG. 2 can be formed utilizing techniques well known to those skilled in the art. In one example, the exemplary structure shown in FIG. 2 can be formed by first providing a bulk substrate or SOI substrate. Next, patterned material stacks of alternating layers of sacrificial semiconductor material and semiconductor channel material are formed on the surface of the bulk substrate or the SOI substrate. The patterned material stacks can be formed by epitaxial growth of blanket and alternating layers of sacrificial semiconductor material and semiconductor channel material, followed patterning the blanket layers by lithography and etching to provide each of the first, second, third and fourth nanosheet stacks S1, S2, S3 and S4. A trench opening can then be formed into the bulk substrate or SOI substrate by lithography and etching; during formation of the trench opening the pedestal portions 10 are formed. The trench opening is then filled with a trench dielectric material and recessed to provide the shallow trench isolation structure 16. First dielectric material layer 18 is then formed utilizing a deposition process such as, for example, chemical vapor deposition (CVD), plasma enhanced chemical vapor deposition (PECVD), physical vapor deposition (PVD) or atomic layer deposition (ALD). As is shown in FIG. 2, the first dielectric material layer 18 is formed on physically exposed surfaces of each of the first, second, third and fourth nanosheet stacks S1, S2, S3 and S4, physically exposed surfaces of each of the pedestal portions 10, and a physically exposed topmost surface of the shallow trench structure 16. After forming the first dielectric material layer 18, the first and second dielectric pillars 20L, 20R are formed by deposition and a recess etch.

Figure 3:
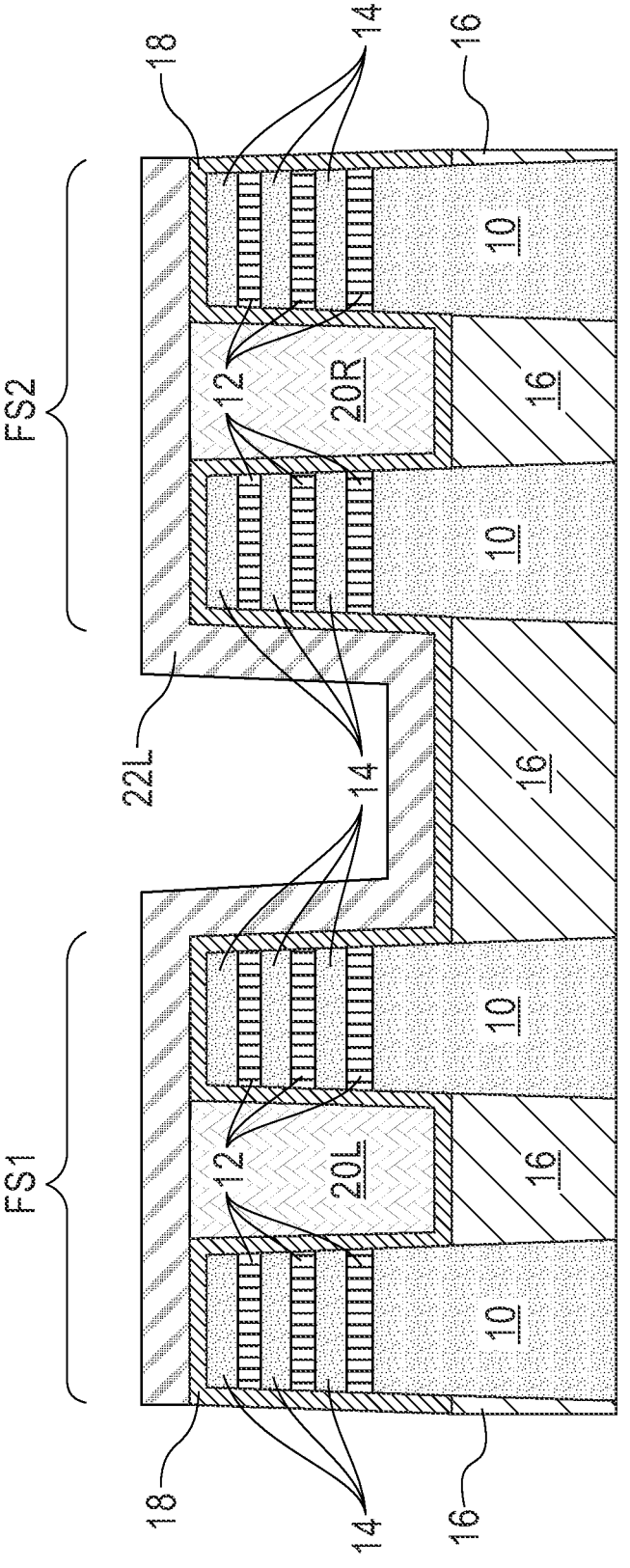
FIG. 3 is cross sectional view of the exemplary structure shown in FIG. 2 after forming a spacer material layer.

Referring now to FIG. 3, there is illustrated the exemplary structure shown in FIG. 2 after forming a spacer material layer 22L. Spacer material layer 22L is formed on physically exposed surfaces of the first dielectric material layer 18 and the first and second dielectric pillars 20L, 20R. The spacer material layer 22L can be composed of a spacer material such as, but not limited to, polysilicon, silicon nitride, or a dielectric material including atoms of Si, O, C and N. The spacer material is typically compositionally different from at least the first dielectric material layer 18. The spacer material layer 22L can be formed by deposition of the spacer material. The deposition of the spacer material can include CVD, PECVD, PVD, or ALD. The spacer material layer 22L can have a thickness from 1 nm to 40 nm; although other thicknesses for the spacer material layer 22L are contemplated and can be used as the thickness of the spacer material layer 22L.

Figure 4:
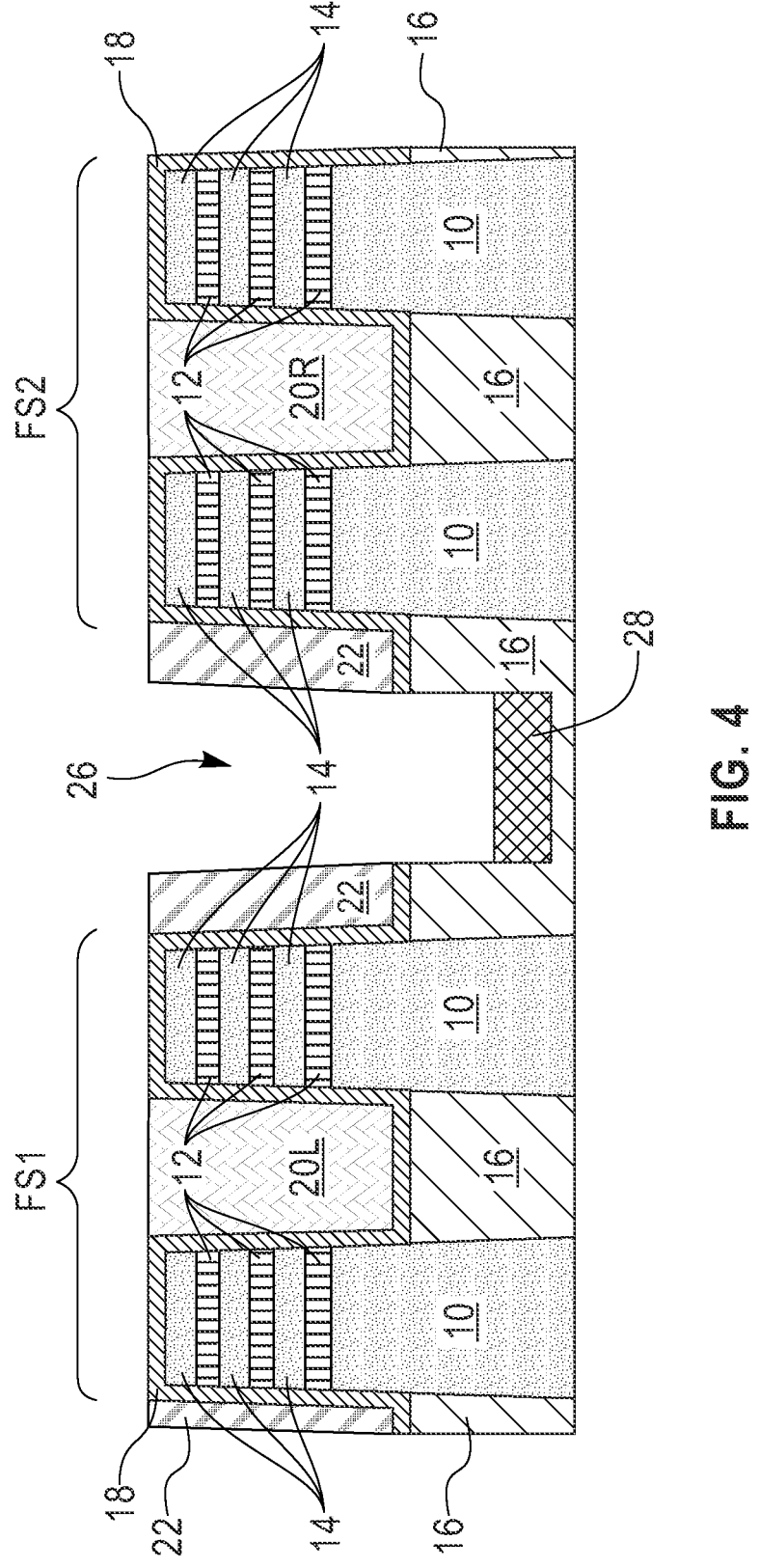
FIG. 4 is a cross sectional view of the exemplary structure shown in FIG. 3 after forming spacers from the spacer material layer, removing a physically exposed portion of the first dielectric material layer and a portion of the shallow trench isolation structure not protected by the spacers, and forming a placeholder material layer on a subsurface of the shallow trench isolation structure.

Referring now to FIG. 4, there is illustrated the exemplary structure shown in FIG. 3 after forming spacers 22 from the spacer material layer 22L, removing a physically exposed portion of the first dielectric material layer 18 and a portion of the shallow trench isolation structure 16 not protected by the spacers 22, and forming a placeholder material layer 28 on a subsurface of the shallow trench isolation structure 16. The placeholder material layer 28 is formed in a region between the second nanosheet stack S2 and the third nanosheet stack S3.

The formation of the spacers 22 includes performing a spacer etch on the spacer material layer 22L. In one embodiment, the spacer etch can include a reactive ion etch (RIE). The spacers 22 are formed in the shallow trench isolation area of the structure and along the sidewall of each nanosheet stack that faces the shallow trench isolation structure 16. The spacers 22 can have a topmost surface that is coplanar with a topmost horizontal surface of the first dielectric material layer 18 that is present atop each of the first, second, third and fourth nanosheet stacks S1, S2, S3 and S4.

After spacer 22 formation, the first dielectric material layer 18 and a portion of the shallow trench isolation structure 16 are removed in the shallow trench isolation area of the structure as shown in FIG. 4. The removal of the first dielectric material layer 18 and a portion of the shallow trench isolation structure 16 in the shallow trench isolation area of the structure can include one or more etching processes. In one example, one or more RIE processes can be used to remove the first dielectric material layer 18 and a portion of the shallow trench isolation structure 16 in the shallow trench isolation area of the structure.

The removal of the first dielectric material layer 18 and a portion of the shallow trench isolation structure 16 in the shallow trench isolation area of the structure provides an opening that physically exposes a subsurface of the shallow trench isolation structure 16. The term "subsurface" is used throughout the present application to denote a surface of a material that is located between a topmost surface of the material and a bottommost surface of the material.

Placeholder material layer 28 is then formed on the subsurface of the shallow trench isolation structure 16. The placeholder material layer 28 can include any sacrificial material including a metal oxide such as, for example, titanium dioxide. Other sacrificial materials such as elemental metals can be used as the placeholder material layer 28. The sacrificial material that provides the placeholder material layer 28 can be formed by a deposition process such as, for example, CVD, PECVD, PVD, ALD, plating, or sputtering, without the use of any additional mask. A recess etch can follow the deposition of the sacrificial material. The placeholder material layer 28 that is formed has a topmost surface that is vertically offset and located beneath a topmost surface of the shallow trench isolation structure 16.

Figure 5:
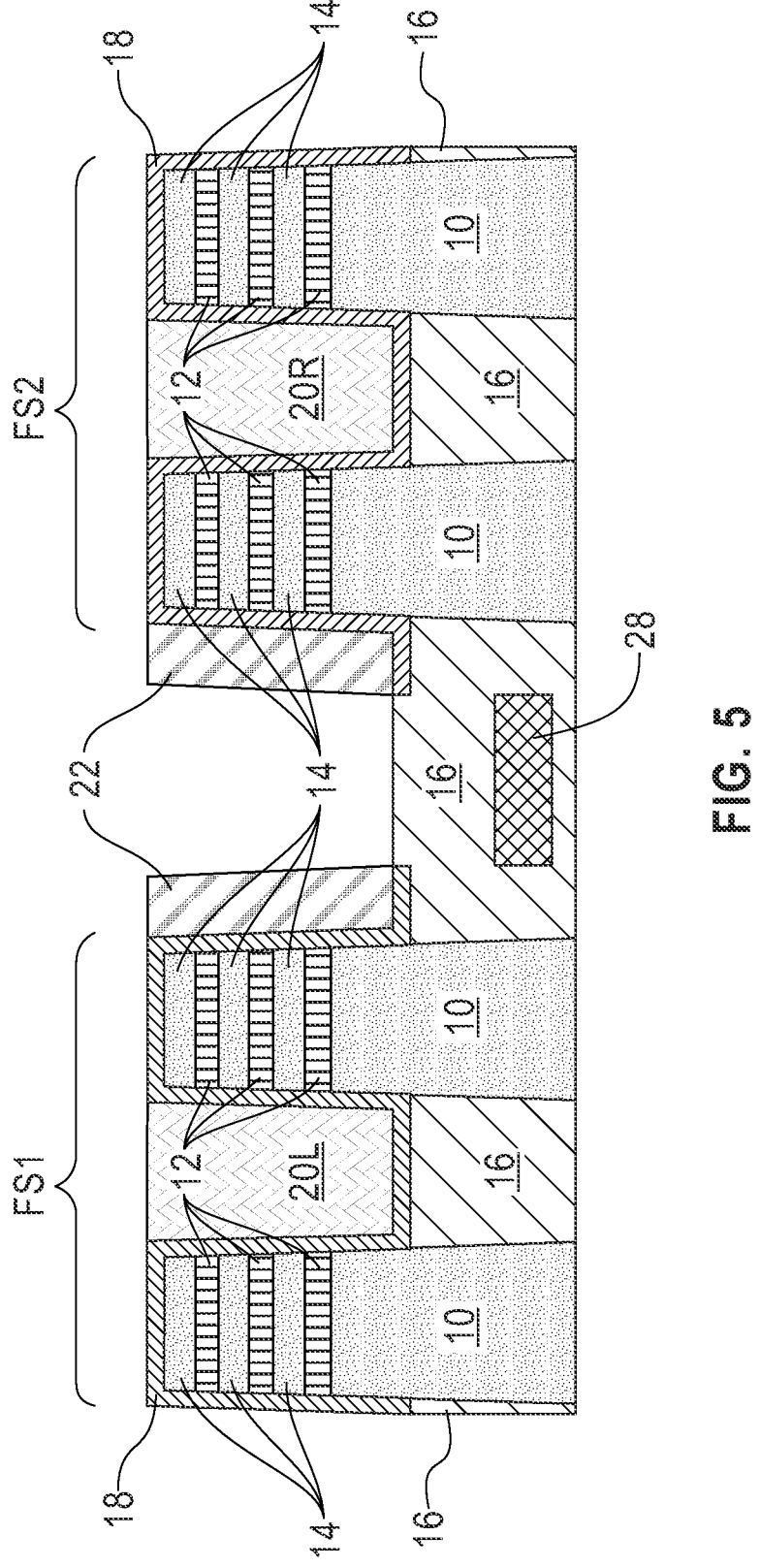
FIG. 5 is a cross sectional view of the exemplary structure shown in FIG. 4 after forming additional trench dielectric material above the placeholder material layer.

Referring now to FIG. 5, there is illustrated the exemplary structure shown in FIG. 4 after forming additional trench dielectric material above the placeholder material layer 28. The additional trench dielectric material is typically a compositional same trench dielectric material as the trench dielectric material used in providing the shallow trench isolation structure 16 shown in FIG. 2 above. The additional trench dielectric material forms above the placeholder material layer 28 and reestablishes the integrity of the shallow trench isolation structure 16.

Figure 6:
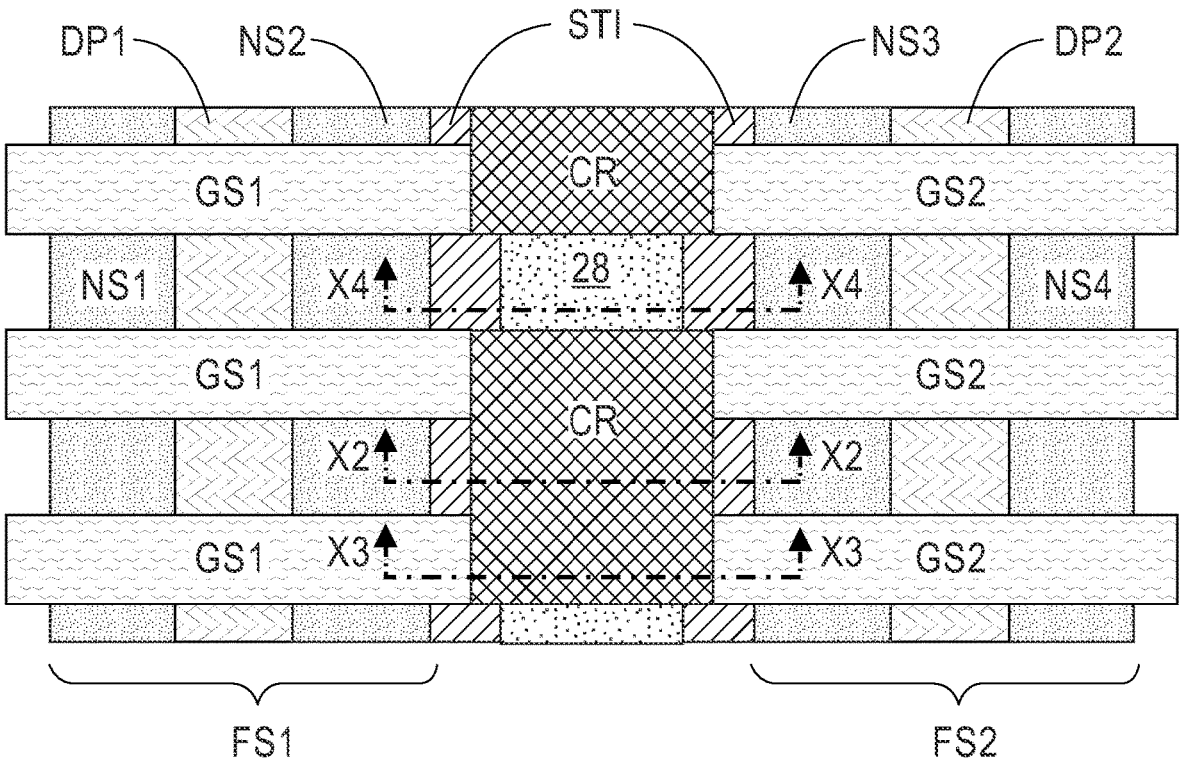
FIG. 6 is a cell layout similar to the one depicted in FIG. 1 and including cuts X2-X2, X3-X3 and X4-X4.

Referring now to FIG. 6, there is illustrated a cell layout similar to the one depicted in FIG. 1 and including cuts X2-X2, X3-X3 and X4-X4. The cell includes elements listed in FIG. 1 above and further shows the sacrificial placeholder material 28 and cut regions CR. The cut regions include gate cut regions and source/drain cut regions. In FIG. 6, cut X2-X2 is located in a source/drain region of a first gate structure GS1 that is present on the second nanosheet stack NS2, a cut region (i.e., source/drain cut region), and a source/drain region of a second gate structure GS2 that is present on the third nanosheet stack NS3. Cut X3-X3 is through a first gate structure GS1 that is present on the second nanosheet stack NS2, a cut region (i.e., a gate cut region), and a second gate structure GS2 that is present on the third nanosheet stack NS3. Cut X4-X4 is located in a source/drain region of a first gate structure GS1 that is present on the second nanosheet stack NS2 and a source/ drain region of a second gate structure GS2 that is present on the third nanosheet stack NS3; no cut region is present in cut X4-X4.

Figure 7A:
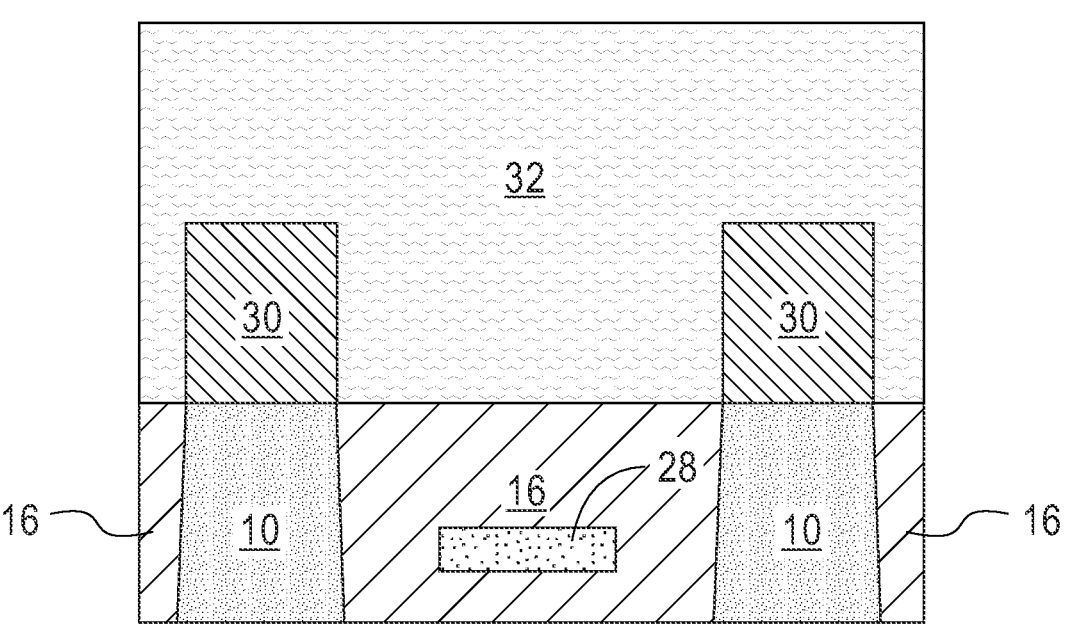
FIGS. 7A, 7B and 7C are cross sectional views of the exemplary structure shown in FIG. 5 and along cuts X2-X2, X3-X3 and X4-X4 shown in FIG. 6, respectively, after forming a layer of polysilicon, spacer removal, forming source/drain regions, and forming an interlayer dielectric material layer.
Figure 7B:
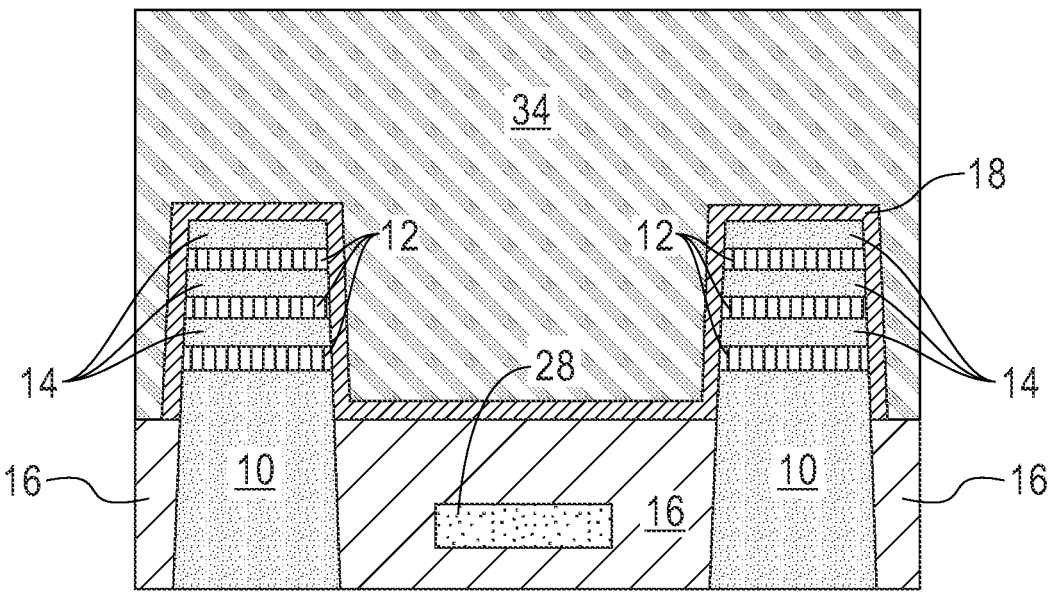
Figure 7C:
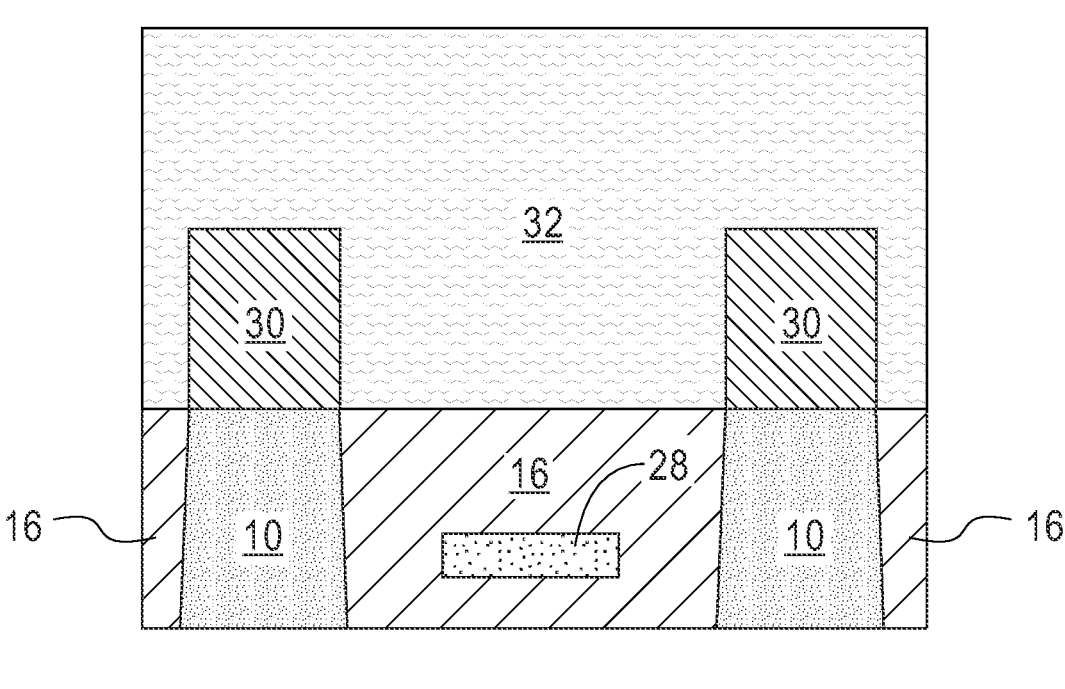

Referring now to FIGS. 7A, 7B and 7C, there are illustrated the exemplary structure shown in FIG. 5 and along cuts X2-X2, X3-X3 and X4-X4 shown in FIG. 6, respectively, after forming a layer of polysilicon 34, spacer 22 removal, forming source/drain regions 30, and forming an interlayer dielectric material (ILD) layer 32.

The layer of polysilicon 34 can be formed by a deposition process such as, for example, CVD, PECVD, or PVD. A patterning process including lithography and etching can follow the deposition of the layer of polysilicon 34. The layer of polysilicon 34 is formed only in the area including cut X3-X3. The spacer 22 removal can be performed during the etching process used to provide the layer of polysilicon 34. Alternatively, the spacer 22 can be removed prior to or after forming the layer of polysilicon 24 utilizing a separate etching process.

Source/drain regions 30, as shown in FIGS. 7A and 7C, are formed on pedestal portions 10 not including a nanosheet stack; the source/drain regions 30 are attached to at least the end portions of each suspended semiconductor channel material nanosheet 14. As used herein, a "source/drain" region can be a source region or a drain region depending on subsequent wiring and application of voltages during operation of the FET. The source/drain regions 30 include a semiconductor material and a dopant. The semiconductor material that provides each source/drain region 30 can include one of the semiconductor materials mentioned above for the pedestal portions 10 of the semiconductor substrate. The semiconductor material that provides the source/drain regions 30 can be compositionally the same, or compositionally different from each semiconductor channel material nanosheet 14. The semiconductor material that provides the source/drain regions 30 is however compositionally different from each sacrificial semiconductor material nanosheet 12.

The dopant that is present in each source/drain region 30 can be either a p-type dopant or an n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium, and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one example, each source/drain region 30 can have a dopant concentration of from $4\times10^{20}$ atoms/cm$^3$ to $3\times10^{21}$ atoms/cm$^3$. In one example, each bottom source/drain region 46 is composed of phosphorus doped silicon.

Each source/drain region 30 can be formed by an epitaxial growth in which the dopants are present during the epitaxial growth process. A recess etch can be optionally employed so as to reduce the height of each of the source/drain regions 30.

The ILD material layer 32 is then formed over, and laterally adjacent to, the source/drain regions 30 as is shown in FIGS. 7A and 7C. The ILD material layer 32 can be composed of a dielectric material including, for example, silicon oxide, silicon nitride, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. Although not shown, ILD material layer 32 can include a multilayered structure that includes at least two different dielectric materials stacked one atop the other such as, for example, silicon nitride and silicon dioxide. The ILD material layer 32 can be formed by a deposition process such as, for example, CVD, PECVD, or spin-on coating. In some embodiments, a planarization process can be performed after the deposition of the dielectric material that provides the ILD material layer 32. The ILD material layer 32 has a topmost surface that is typically coplanar with a topmost surface of the layer of polysilicon 34.

Figure 8A:
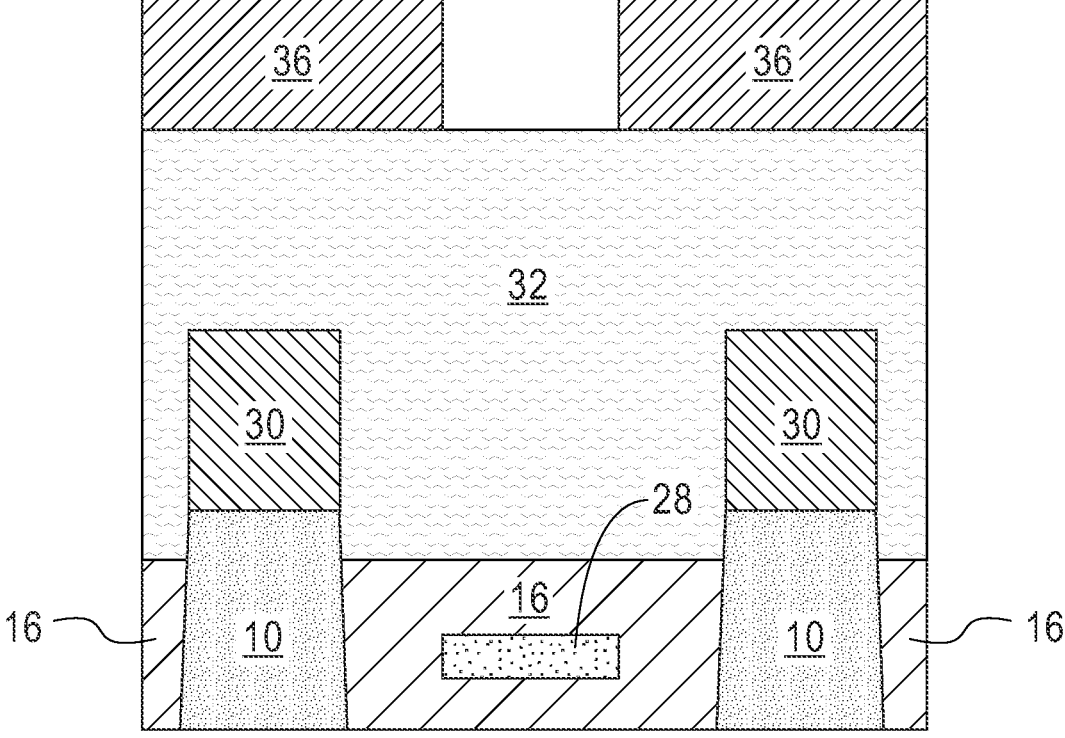
FIGS. 8A, 8B and 8C are cross sectional views of the exemplary structure shown in FIGS. 7A, 7B and 7C, respectively, after forming a gate cut trench mask.
Figure 8B:
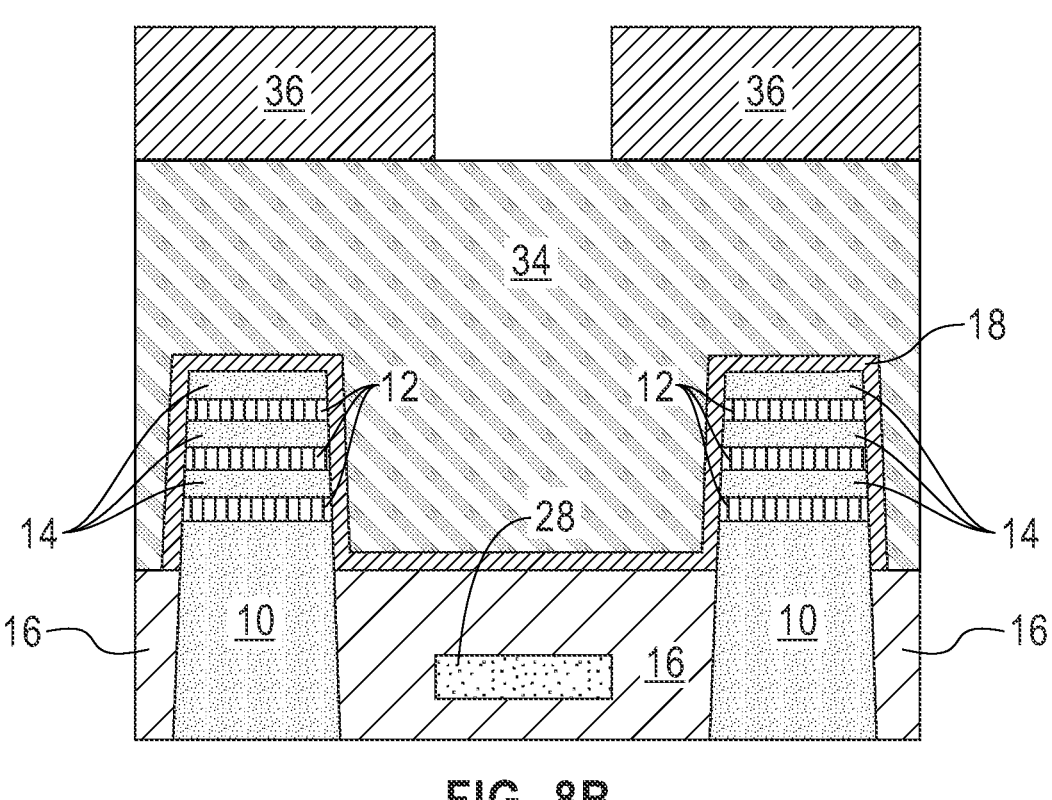
Figure 8C:
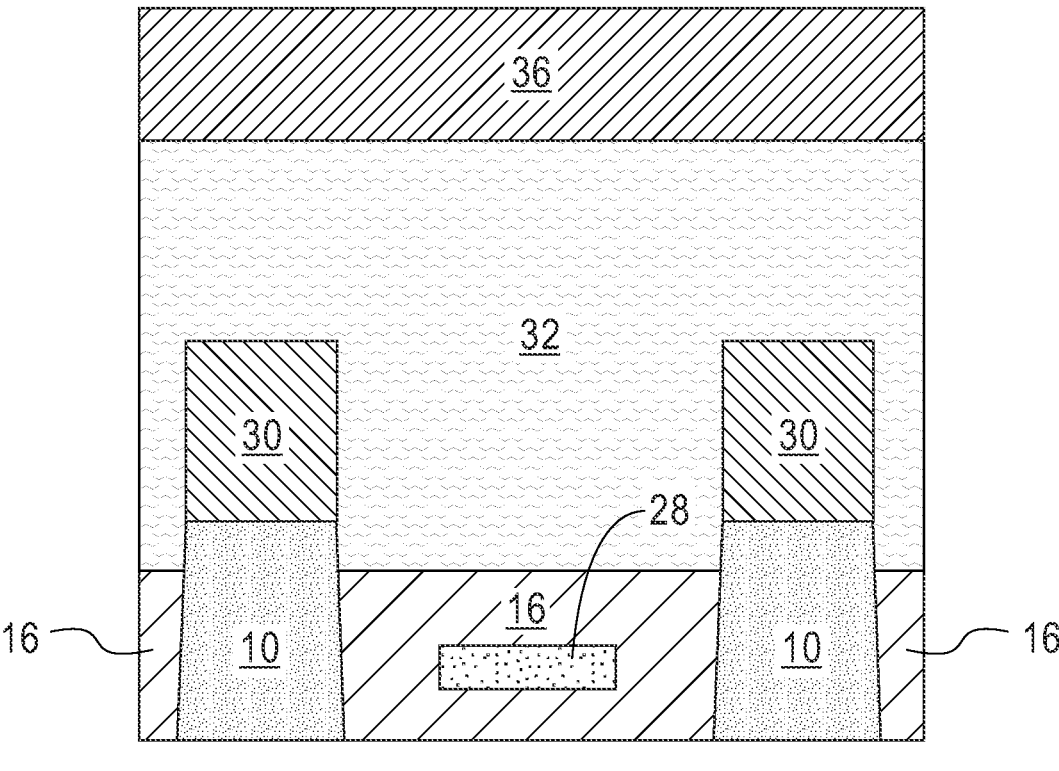

Referring now to FIGS. 8A, 8B and 8C, there are illustrated the exemplary structure shown in FIGS. 7A, 7B and 7C, respectively, after forming a gate cut trench mask 36. Gate cut trench mask 36 is composed of a dielectric hard mask material such as, for example, silicon oxynitride, silicon nitride, or silicon dioxide. The gate cut trench mask 36 can be formed by depositing a dielectric hard mask material onto the layer of polysilicon 34 and the ILD material layer 32 and then patterning the deposited hard mask material to include openings as shown in FIGS. 8A and 8B; no opening is formed in the hard mask layer that is formed in FIG. 8C. The openings are formed in areas in which a cut region, i.e., gate cut trench or source/drain cut trench, is to be subsequently formed.

Figure 9A:
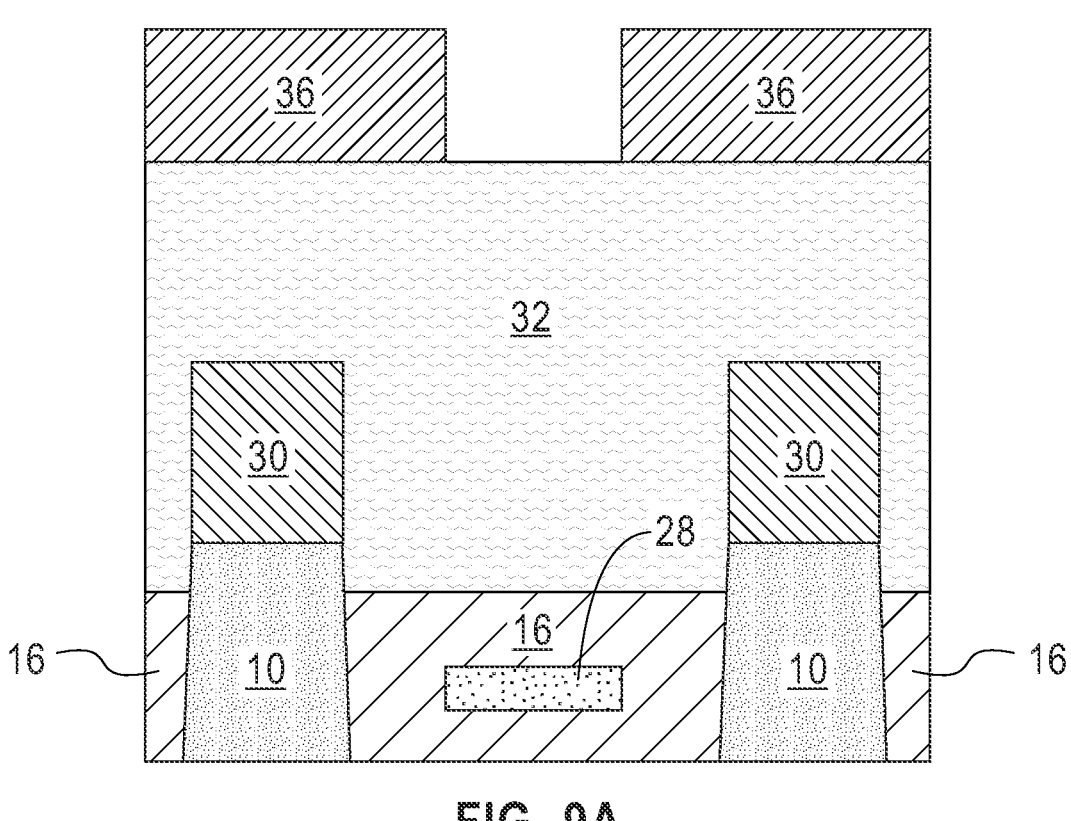
FIGS. 9A, 9B and 9C are cross sectional views of the exemplary structure shown in FIGS. 8A, 8B and 8C, respectively, after performing a gate cut process in which a gate cut trench is formed that physically exposes the placeholder material layer.
Figure 9B:
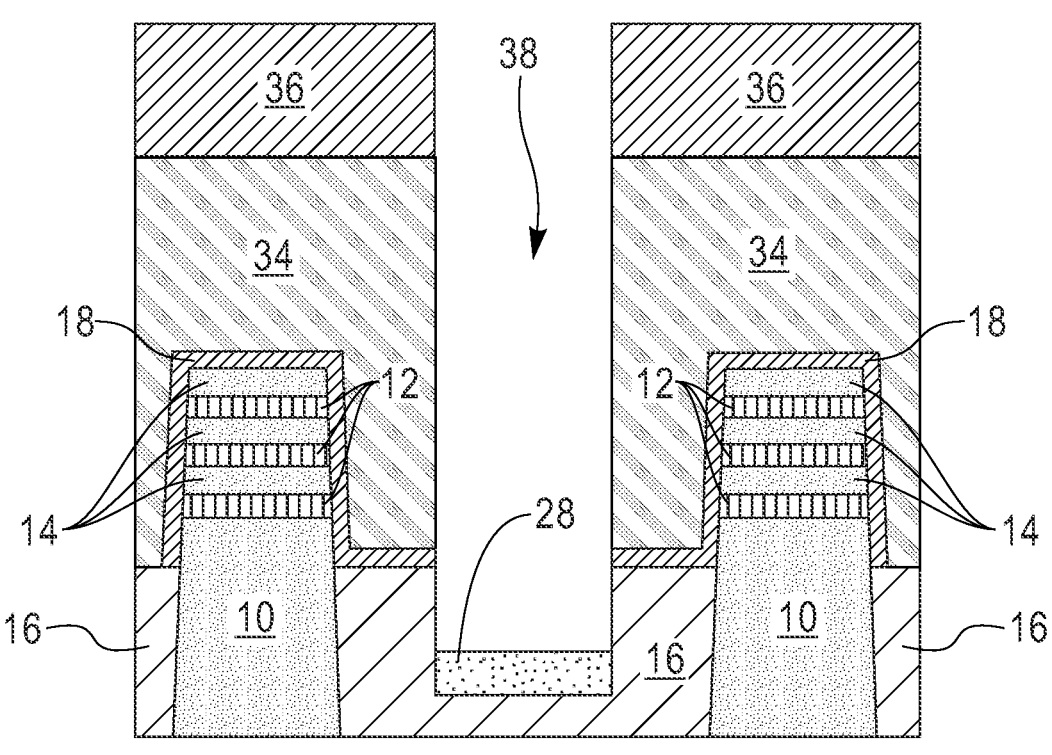
Figure 9C:
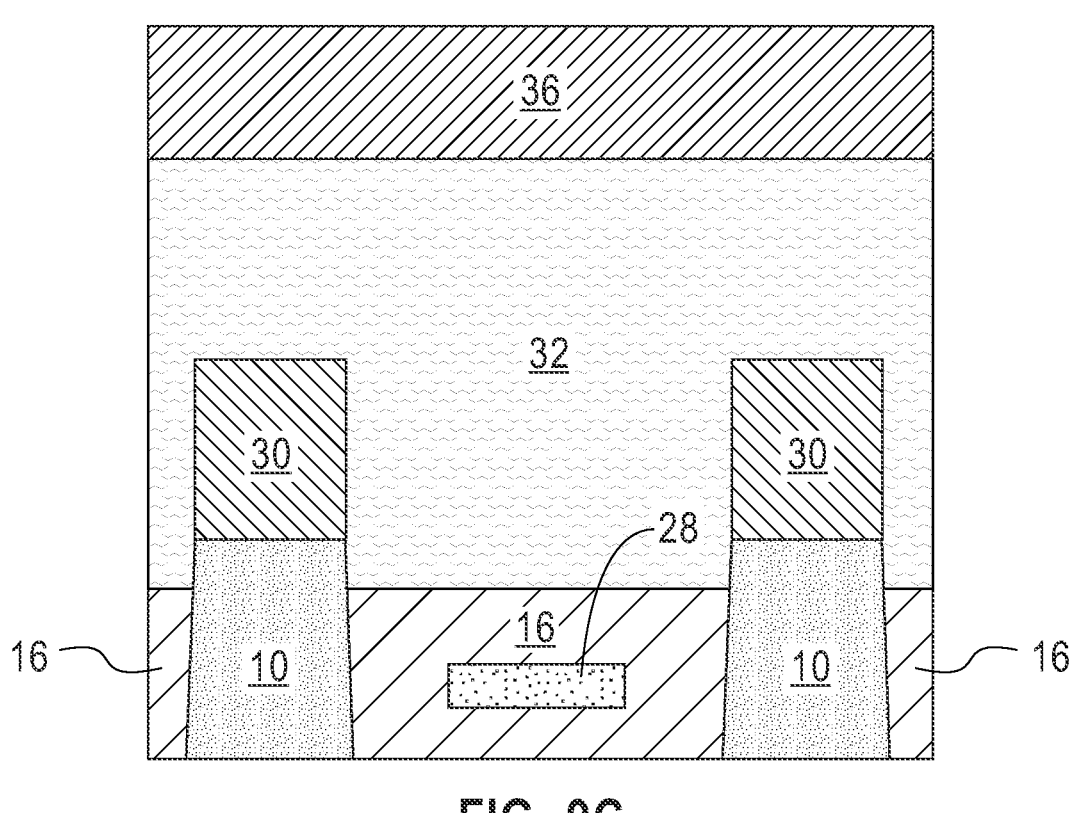

Referring now to FIGS. 9A, 9B and 9C, there are illustrated the exemplary structure shown in FIGS. 8A, 8B and 8C, respectively, after performing a gate cut process in which a gate cut trench 38 is formed that physically exposes the placeholder material layer 28. The gate cut trench 38 is formed between the second and third nanosheet stacks, i.e., in the region including cut X3-X3, as shown in FIG. 9B. No gate cut trench is formed in the regions of the structure shown in FIGS. 9A and FIG. 9C.

The gate cut trench 38 can be formed utilizing one or more etching processes that are initially at least selective in removing polysilicon. The one or more etching processes remove a portion of the layer of polysilicon 34, a portion of the first dielectric material layer 18 and a portion of the shallow trench isolation structure 16 not protected by the gate cut trench mask 36. Note that while a via opening is present in gate cut trench mask 36 shown in FIG. 9A, no gate cut trench is formed since the initial etch is selective in removing the layer of polysilicon 34 as compared to the ILD material layer 32.

Figure 10A:
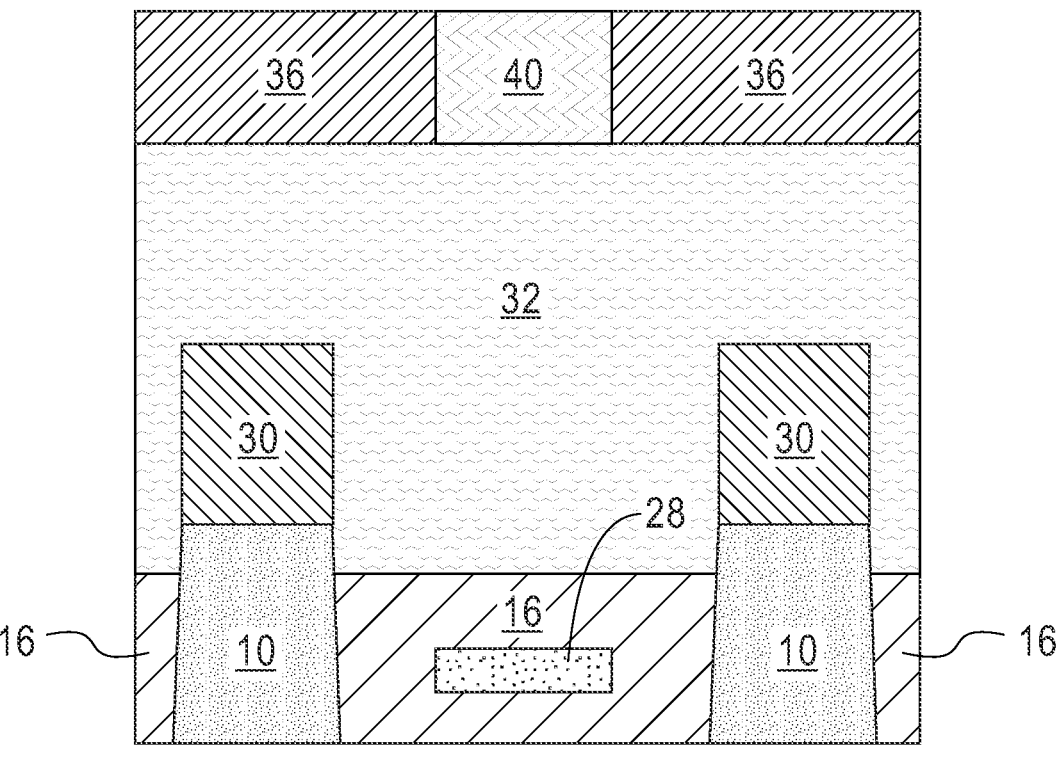
FIGS. 10A, 10B and 10C are cross sectional views of the exemplary structure shown in FIGS. 9A, 9B and 9C, respectively, after forming a dielectric material in the gate cut trench and on the placeholder material layer.
Figure 10B:
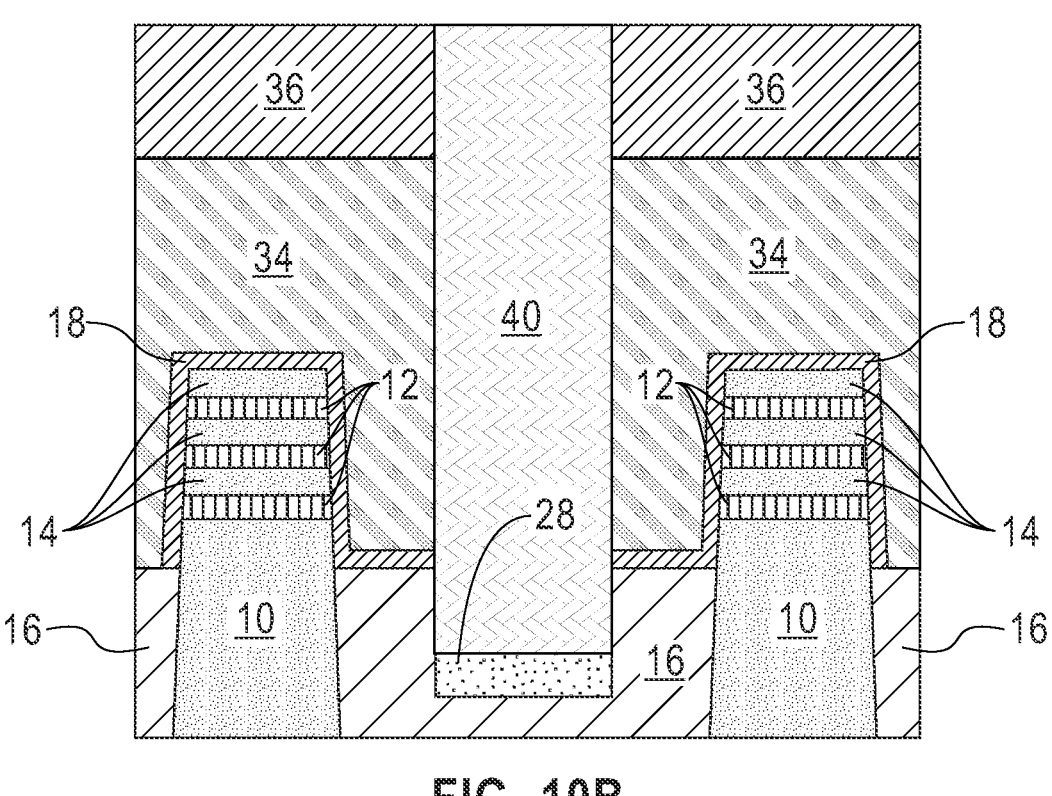
Figure 10C:
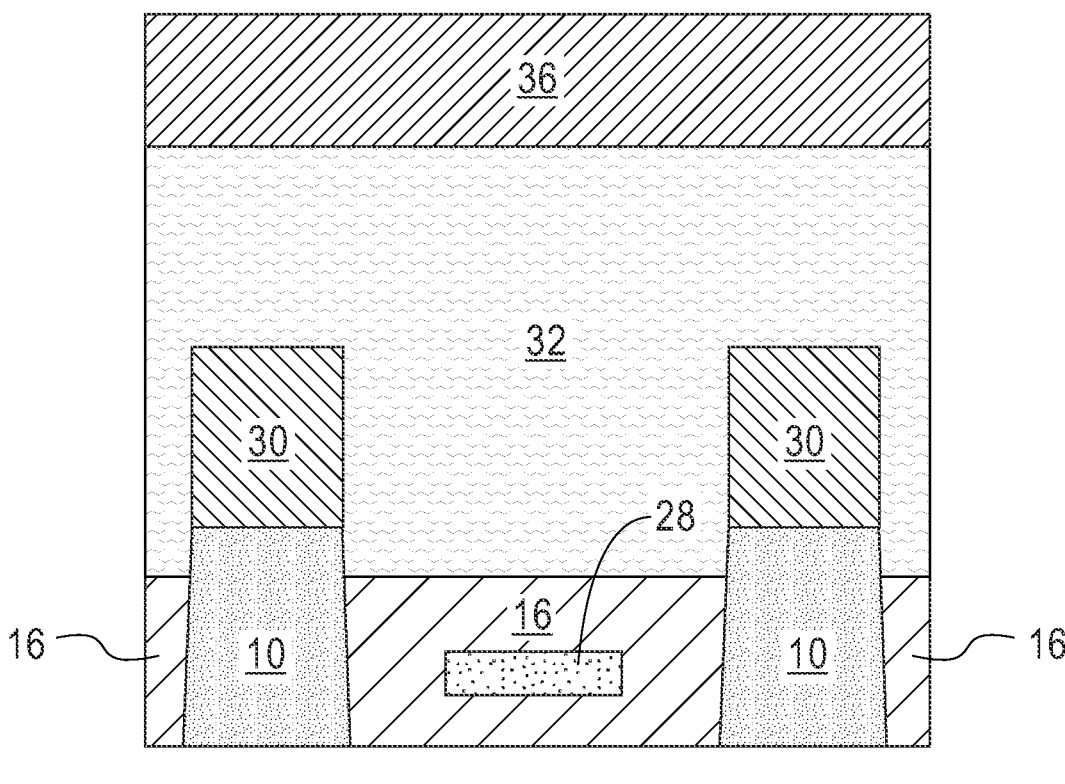

Referring now to FIGS. 10A, 10B and 10C, there are illustrated the exemplary structure shown in FIGS. 9A, 9B and 9C, respectively, after forming a dielectric material 40 in the gate cut trench 38 and on the placeholder material layer 28 (See FIG. 10B). Dielectric material 40 also forms in the via opening present in the gate cut trench mask 36 that is located atop the ILD material layer 32 (See FIG. 10A). The dielectric material 40 is compositionally different from the hard mask material that provides the gate cut trench mask 36. In one example, and when the gate cut trench mask 36 is composed of silicon oxynitride, the dielectric material 40 is composed of silicon nitride.

Dielectric material 40 can be formed utilizing a deposition process such as, for example, CVD, PECVD, PVD or ALD. A material removal process such as, for example, a planarization process, can follow the deposition of the dielectric material 40. The dielectric material 40 typically has a topmost surface that is coplanar with a topmost surface of the gate cut trench mask 36.

Figure 11A:
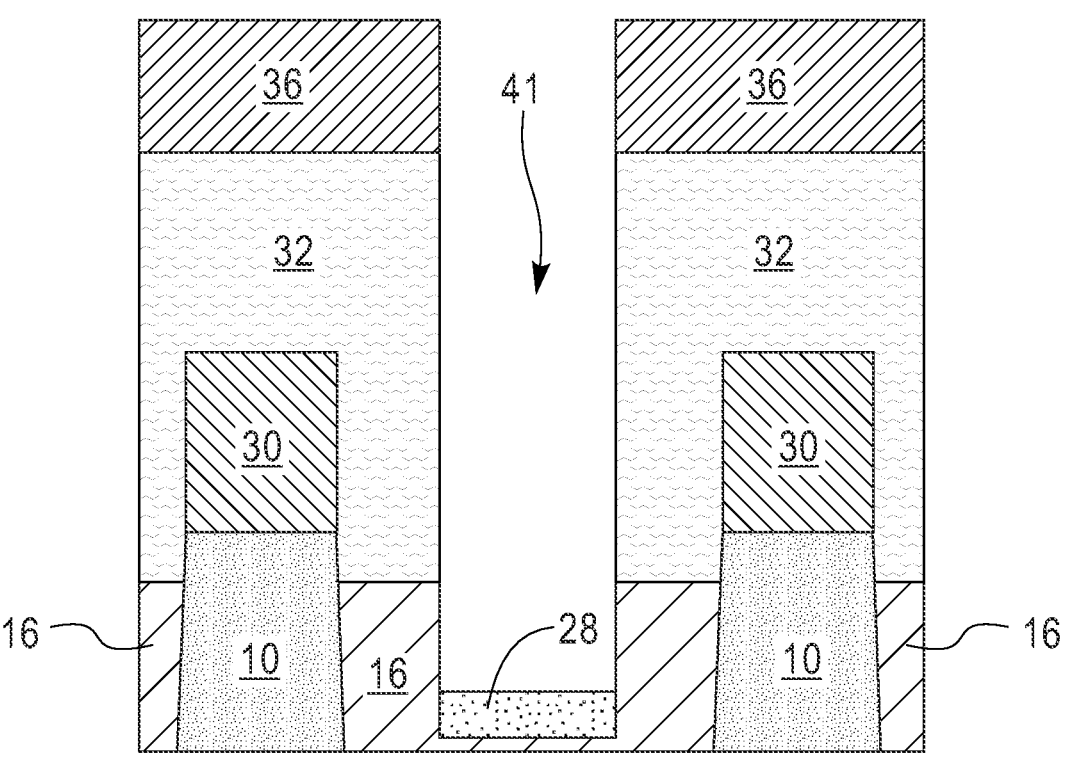
FIGS. 11A, 11B and 11C are cross sectional views of the exemplary structure shown in FIGS. 10A, 10B and 10C, respectively, after performing a source/drain cut in which a source/drain cut trench is formed that physically exposes the placeholder material layer.
Figure 11B:
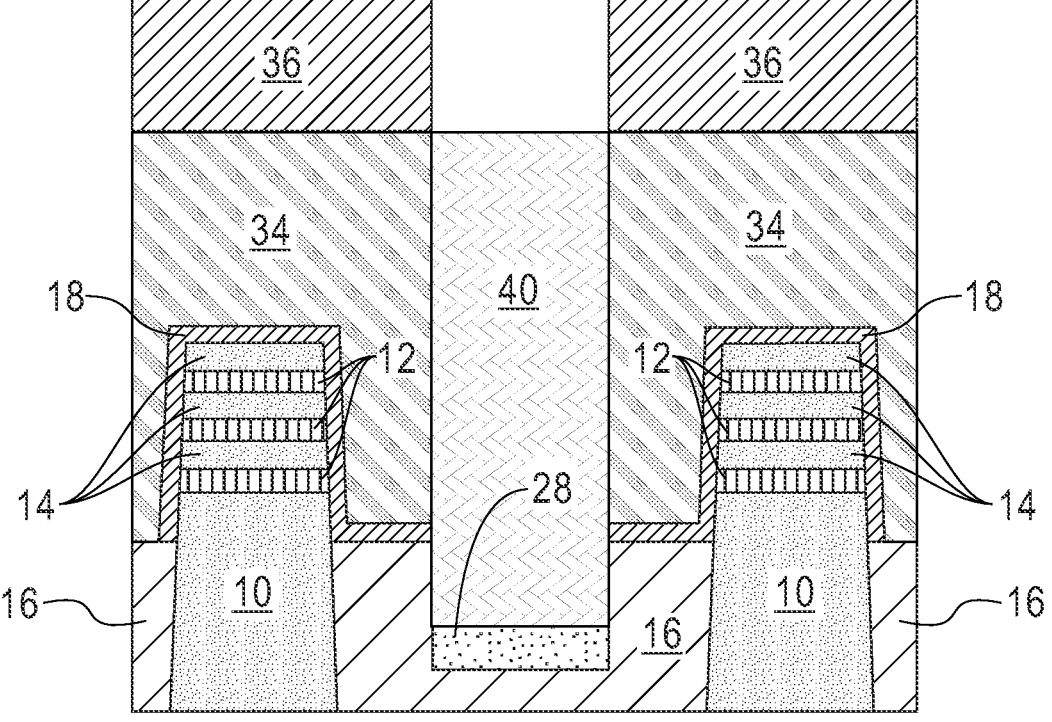
Figure 11C:
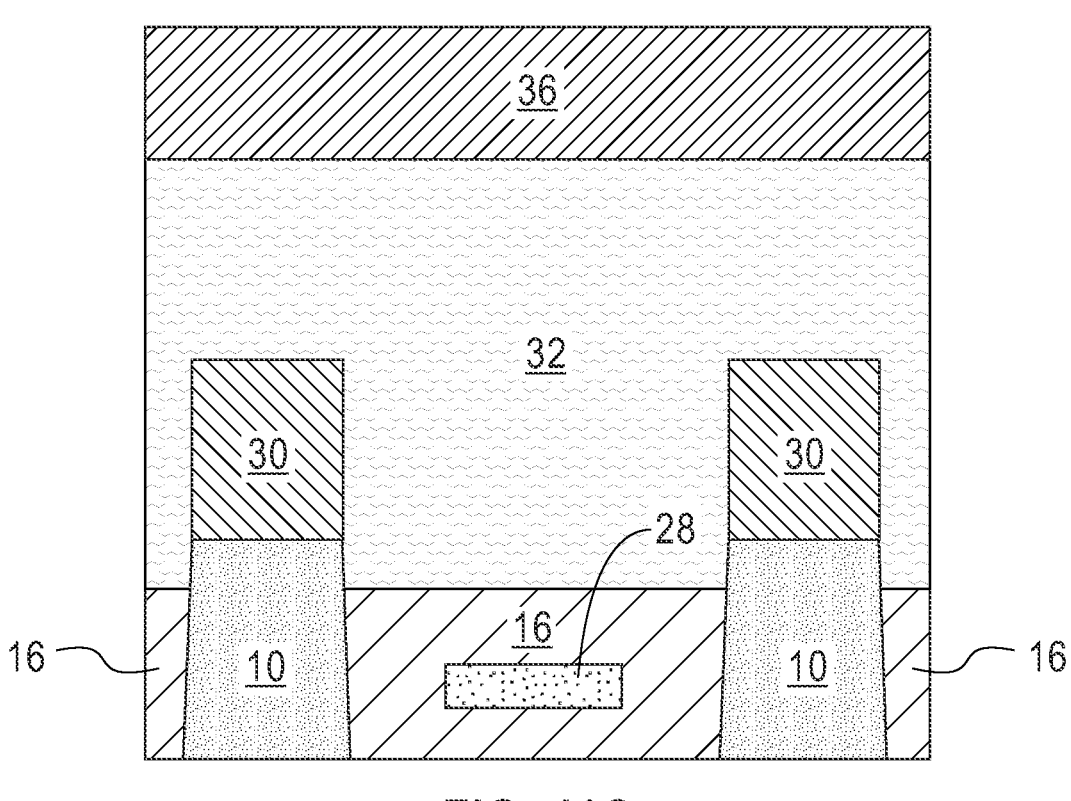

Referring now to FIGS. 11A, 11B and 11C, there are illustrated the exemplary structure shown in FIGS. 10A, 10B and 10C, respectively, after performing a source/drain cut in which a source/drain cut trench 41 is formed that physically exposes the placeholder material layer 28. The source/drain cut trench 41 is formed between the source/drain regions 20 including cut X2-X2, as shown in FIG. 11A. No source/drain cut trench is formed in the regions of the structure shown in FIGS. 11B and 11C.

The source/drain cut trench 41 can be formed utilizing one or more etching processes that are initially at least selective in removing dielectric material 40. The one or more etching processes remove the dielectric material 40, a portion of the ILD material layer 32 and a portion of the shallow trench isolation structure 16 not protected by the gate cut trench mask 36. Note that in the area of the structure shown in FIG. 11B, the dielectric material 40 in that area of the structure is recessed during this step of the present application.

Figure 12A:
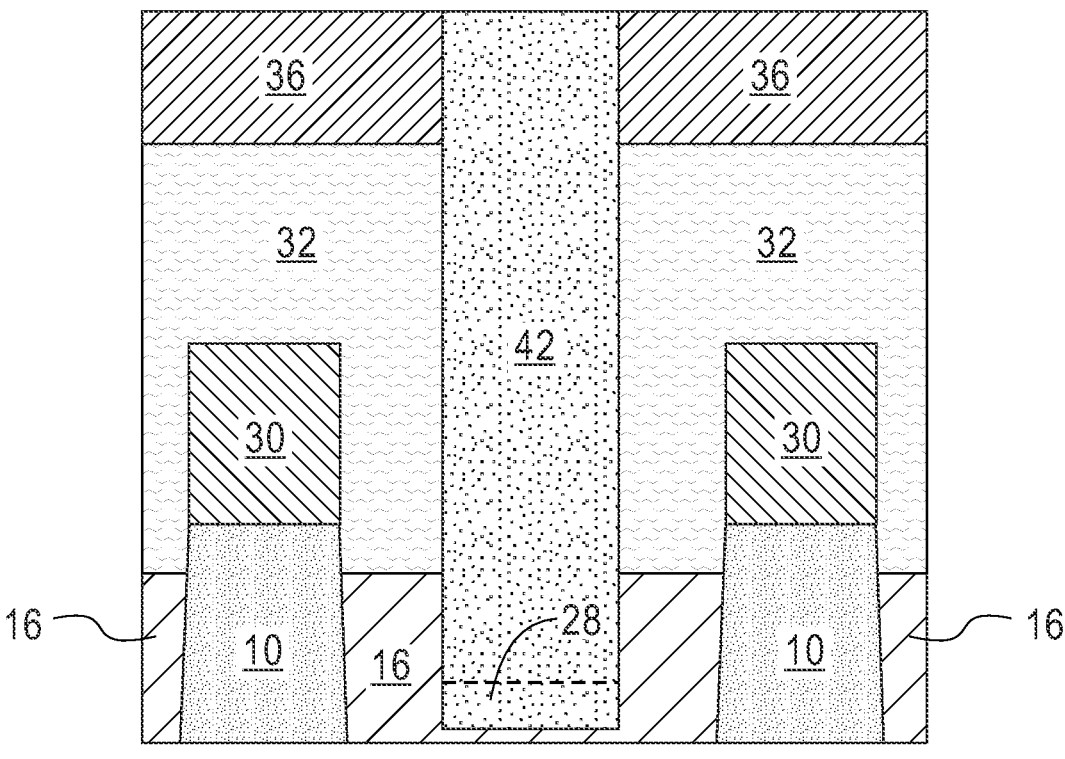
FIGS. 12A, 12B and 12C are cross sectional views of the exemplary structure shown in FIGS. 11A, 11B and 11C, respectively, after forming additional placeholder material in the source/drain cut trench and on the physically exposed placeholder material layer.
Figures 12B, 12C:
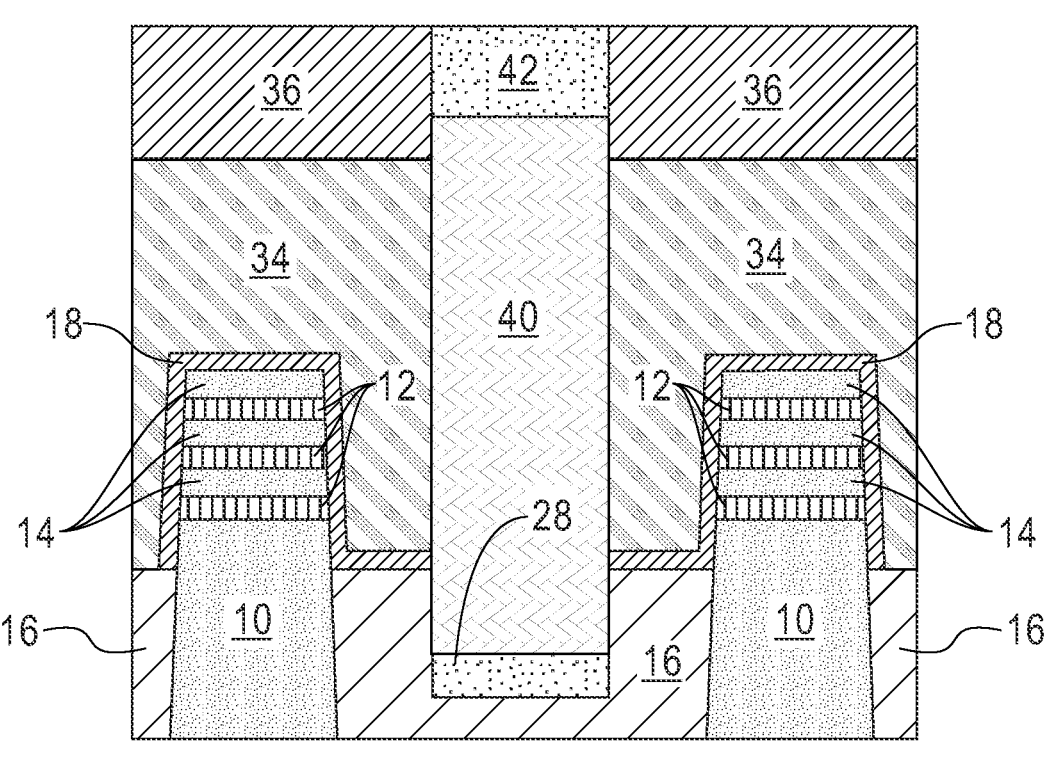

Referring now to FIGS. 12A, 12B and 12C, there are illustrated the exemplary structure shown in FIGS. 11A, 11B and 11C, respectively, after forming additional placeholder material 42 in the source/drain cut trench 41 and on the physically exposed placeholder material layer 28 (See FIG. 12A). Additional placeholder material 42 is also formed above the remaining dielectric material 40 in the area of the structure shown in FIG. 12B.

The additional placeholder material 42 can include one of the sacrificial materials mentioned above for placeholder material layer 28. The additional placeholder material 42 can be formed utilizing one of the deposition processes mentioned above in forming the placeholder material layer 28. Typically, the additional placeholder material 42 is composed of a compositionally same sacrificial material as the placeholder material layer 28. In such an embodiment, no material interface exists between the additional placeholder material 42 and the placeholder material layer 28. In other embodiments, the additional placeholder material 42 is composed of a compositionally different sacrificial material as the placeholder material layer 28. In such an embodiment, a material interface exists between the additional placeholder material 42 and the placeholder material layer 28. In FIG. 12A, a possible material interface between the additional placeholder material 42 and the placeholder material layer 28 is represented by the dotted line.

Figure 13A:
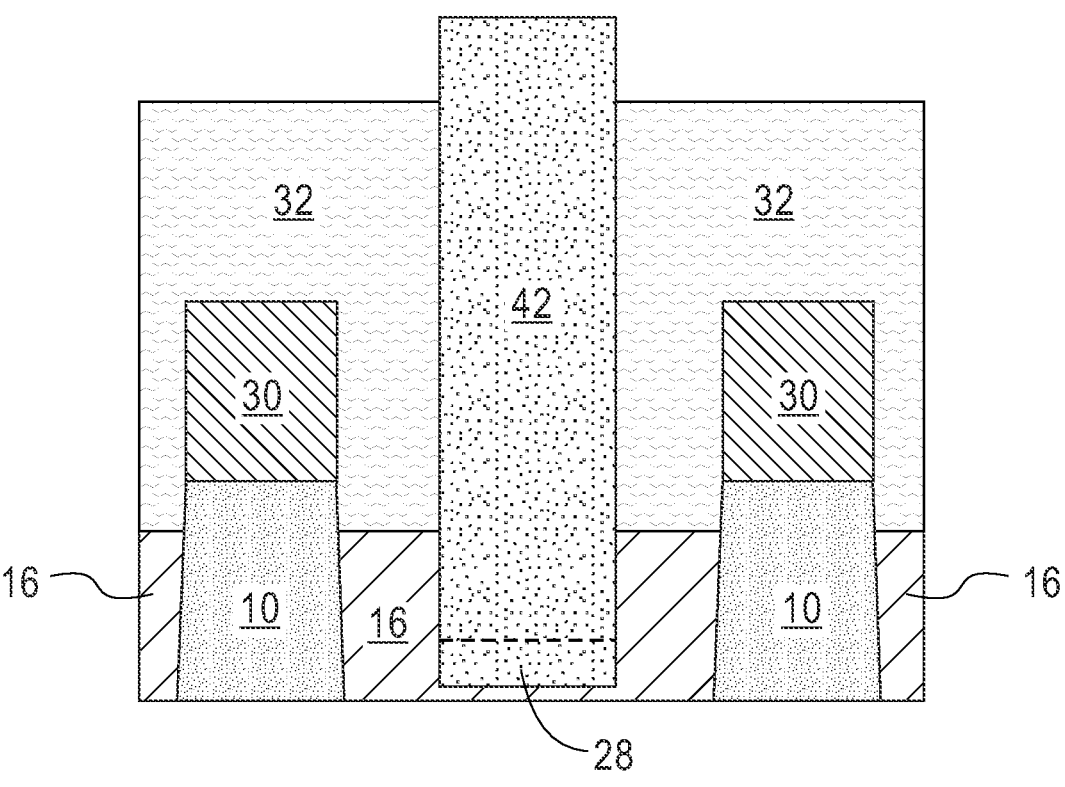
FIGS. 13A, 13B and 13C are cross sectional views of the exemplary structure shown in FIGS. 12A, 12B and 12C, respectively, after removing the gate cut trench mask.
Figure 13B:
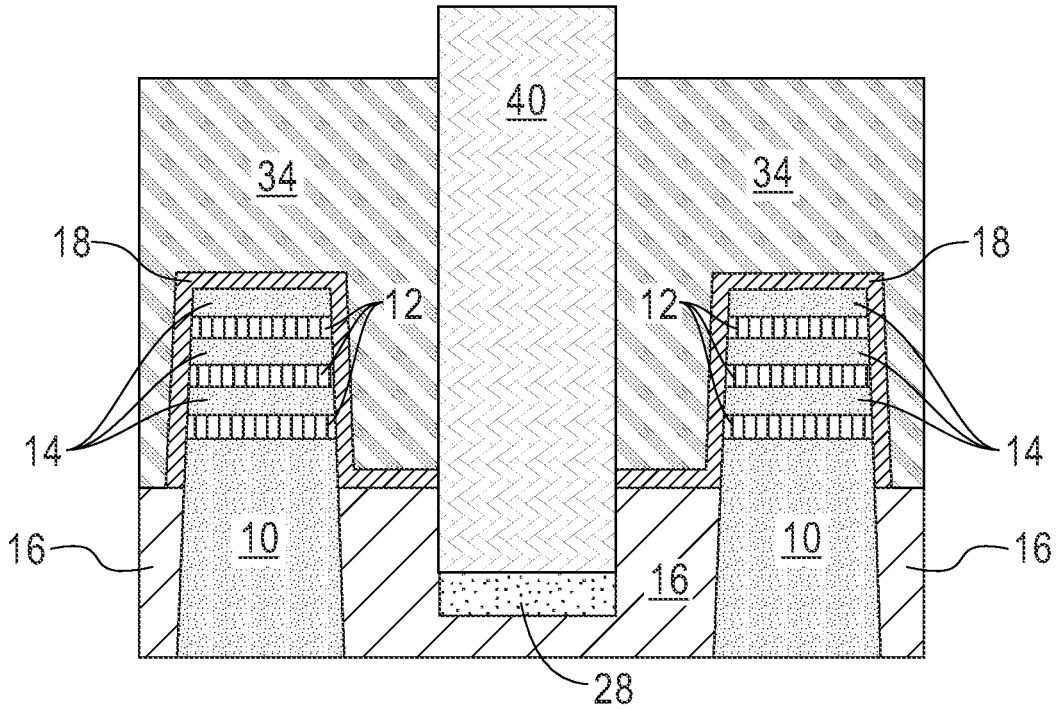
Figure 13C:
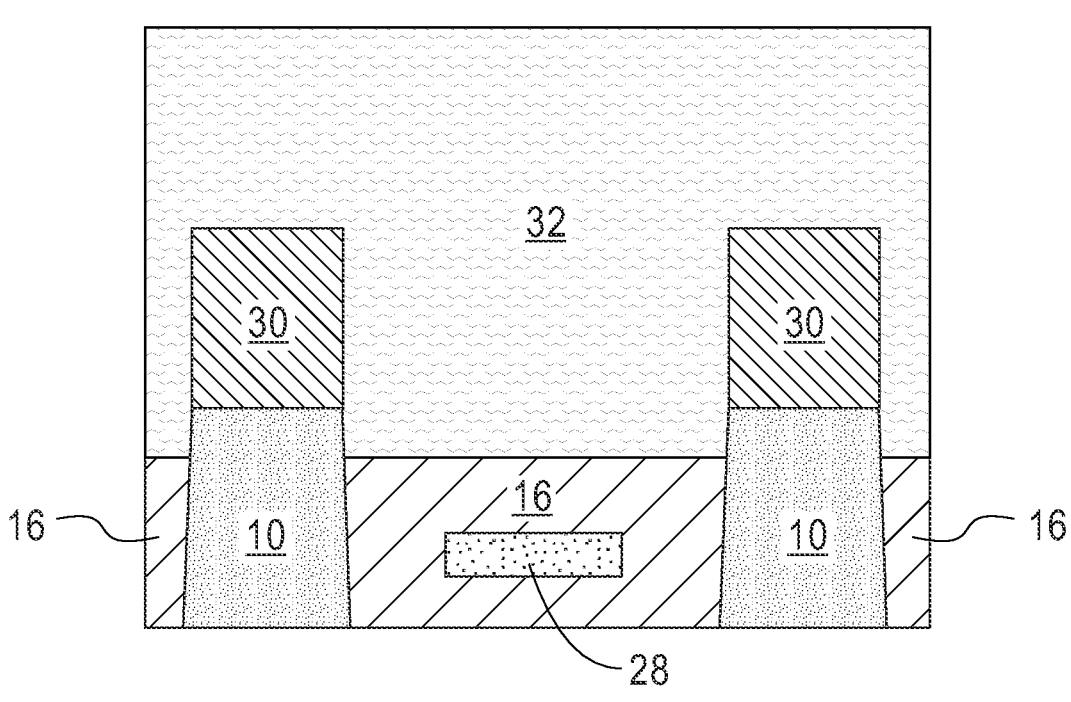

Referring now to FIGS. 13A, 13B and 13C, there are illustrated the exemplary structure shown in FIGS. 12A, 12B and 12C, respectively, after removing the gate cut trench mask 36. The gate cut trench mask 36 can be removed utilizing any material removal process such as, for example, a wet chemical etching process, The removal of the gate cut trench mask 36 physically exposes the ILD material layer 32 and an upper portion of the additional placeholder material 42 in the area of the structure shown in FIG. 13A, the polysilicon layer 34 and an upper portion of dielectric material in the area of the structure shown in FIG. 13B, and just the ILD material layer 32 in the area of the structure shown in FIG. 13C.

Figure 14A:
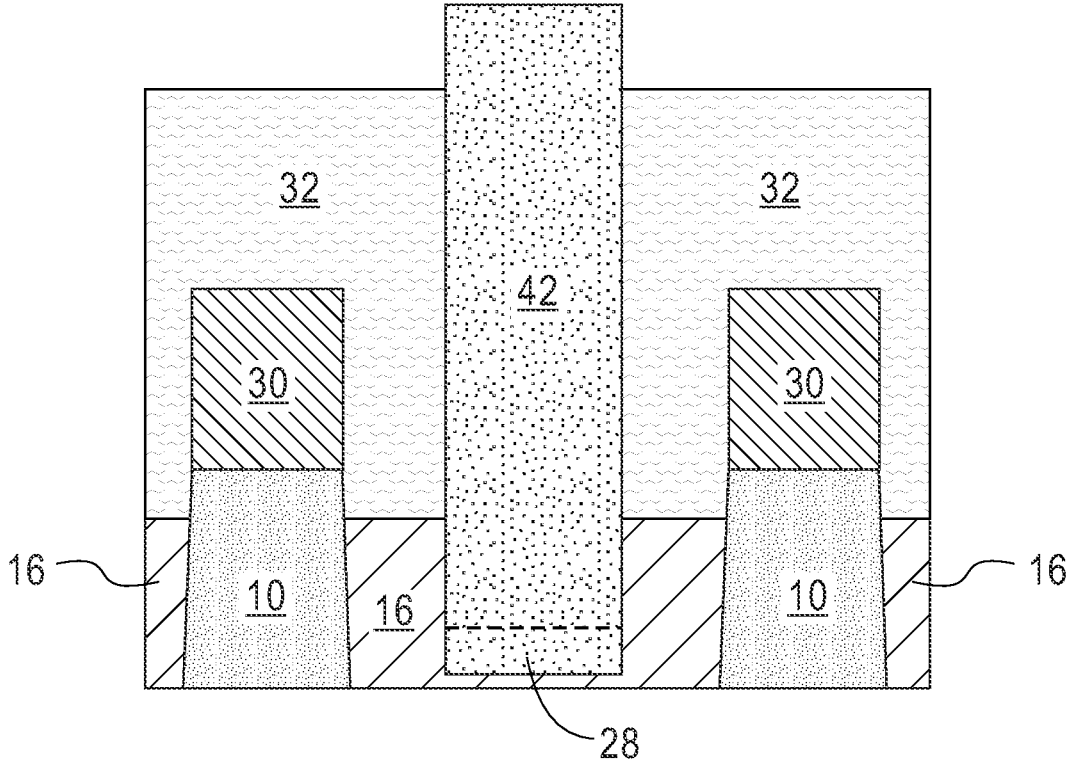
FIGS. 14A, 14B and 14C are cross sectional views of the exemplary structure shown in FIGS. 13A, 13B and 13C, respectively, after removing the layer of polysilicon and the first dielectric material layer to reveal the second and third nanosheet stacks, and replacing each sacrificial semiconductor material nanosheet of the second and third nanosheet stacks with a functional gate structure.
Figure 14B:
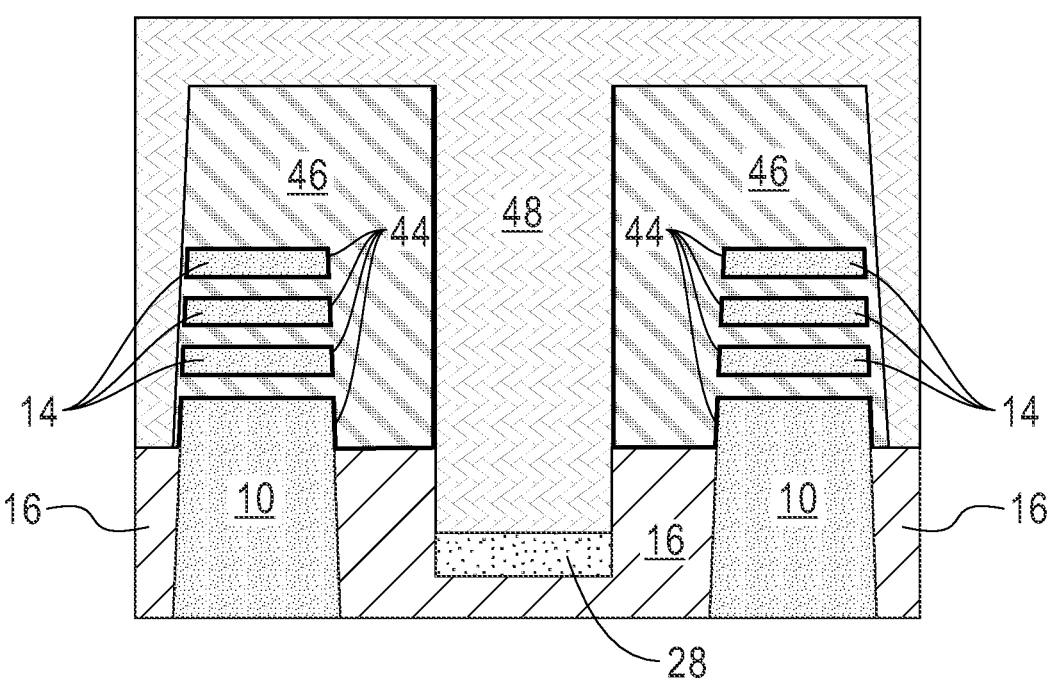
Figure 14C:
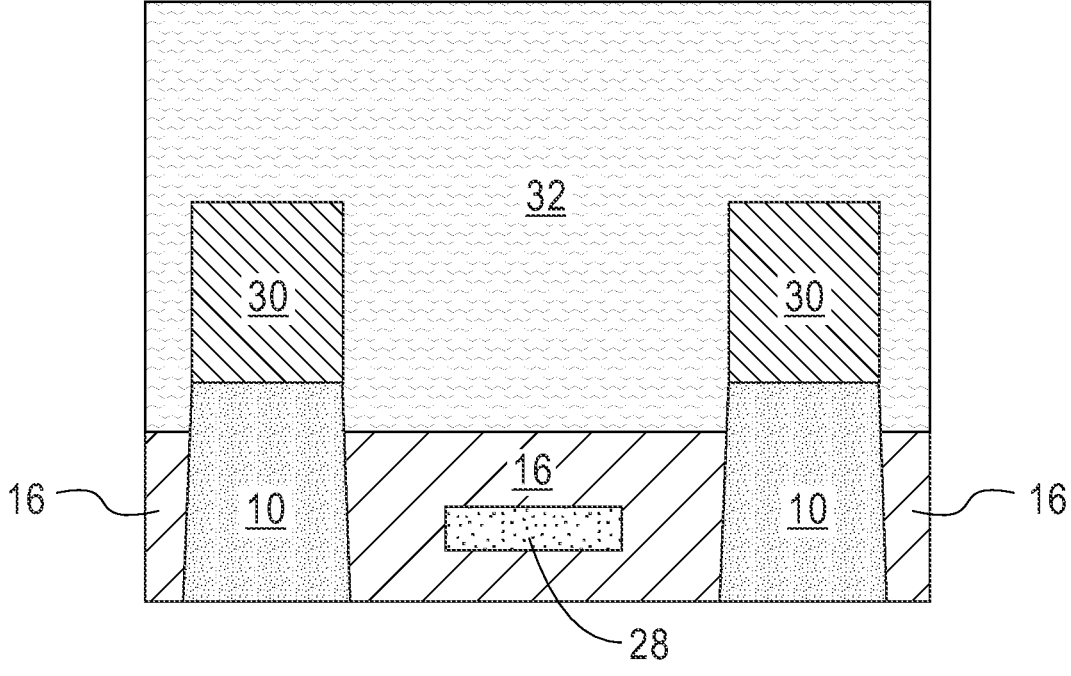

Referring now to FIGS. 14A, 14B and 14C, there are illustrated the exemplary structure shown in FIGS. 13A, 13B and 13C, respectively, after removing the layer of polysilicon 34 and the first dielectric material layer 18 to reveal the second and third nanosheet stacks NS2 and NS3, and replacing each sacrificial semiconductor material nanosheet 14 of the second and third nanosheet stacks with a functional gate structure 44, 46. Similar processing occurs with the first nanosheet stack S1 and the fourth nanosheet stack S4.

After forming the functional gate structure 44, 46, additional dielectric material is formed on top of the dielectric material 40. Collectively, the additional dielectric material and the dielectric material 40 provide a dielectric material structure 48. The dielectric material structure 48 is located above, and laterally adjacent to, each functional gate structure as is shown in FIG. 14B. The additional dielectric material that is used in providing the dielectric material structure 48 can be formed by a deposition process including, but not limited to, CVD, PECVD, PVD or ALD.

The layer of polysilicon 34 can be removed utilizing an etching process that is selective in removing polysilicon. This removal process stops on the first dielectric material layer 18. The first dielectric material layer 18 is then removed utilizing an etching process that is selective in removing the first dielectric material layer 18. The removal of the first dielectric material layer 18 reveals the second and third nanosheet stacks NS2 and NS3. The sacrificial semiconductor material nanosheets 12 are then removed from the second and third nanosheet stacks NS2 and NS3 utilizing an etching process that is selective in removing the sacrificial semiconductor material nanosheets 12 while maintaining a vertical stack of suspended semiconductor channel material nanosheets 14. The removal of each the sacrificial semiconductor material nanosheet 12 can include an etching process that is selective in removing the sacrificial semiconductor material relative to the semiconductor channel material. Gate cavities (not shown) are formed above and below each vertical stack of suspended semiconductor channel material nanosheets 14; the gate cavity is also present between each suspended semiconductor channel material nanosheet 14.

Each gate cavity is then filled with a functional gate structure 44, 46. Each functional gate structure 44, 46 includes at least a gate dielectric material layer 44 and a gate electrode 46. The functional gate structure 44, 46 wraps arounds each semiconductor channel material nanosheet 14 with the vertical stack of suspended semiconductor channel material nanosheets 14. As is known, the gate dielectric material layer 44 is in direct contact with physically exposed portions of each semiconductor channel material nanosheet 14 and the gate electrode 46 is located on the gate dielectric material layer 44. In some embodiments, the functional gate structure includes a work function metal (WFM) layer located between the gate dielectric material layer 44 and the gate electrode 46. The functional gate structure includes forming a continuous layer of gate dielectric material and a gate electrode material inside and outside the gate cavity. The continuous layer of gate dielectric material can include silicon dioxide, or a dielectric material having a dielectric constant greater than silicon dioxide (such dielectric materials can be referred to as a high-k gate dielectric material). Illustrative examples of high-k gate dielectric materials include metal oxides such as, for example, hafnium dioxide (HfO$_2$), hafnium silicon oxide (HfSiO), hafnium silicon oxynitride (HfSiO), lanthanum oxide (La$_2$O$_3$), lanthanum aluminum oxide (LaAlO$_3$), zirconium dioxide (ZrO$_2$), zirconium silicon oxide (ZrSiO$_4$), zirconium silicon oxynitride (ZrSiO$_x$N$_y$), tantalum oxide (TaO$_x$), titanium oxide (TiO), barium strontium titanium oxide (BaO$_6$SrTi$_2$), barium titanium oxide (BaTiO$_3$), strontium titanium oxide (SrTiO$_3$), yttrium oxide (Yb$_2$O$_3$), aluminum oxide (Al$_2$O$_3$), lead scandium tantalum oxide (Pb(Sc,Ta)O$_3$), and/or lead zinc niobite (Pb(Zn,Nb)O). The high-k gate dielectric material can further include dopants such as lanthanum (La), aluminum (Al) and/or magnesium (Mg).

The continuous layer of the gate dielectric material can be formed utilizing a deposition process such as, for example, ALD, CVD, PECVD, or PVD. The continuous layer of the gate dielectric material is a conformal layer having a thickness which can range from 1 nm to 10 nm. The continuous layer of gate dielectric material does not fill in the entirety of the gate cavity.

The gate electrode material can include an electrically conductive metal-containing material including, but not limited to tungsten (W), titanium (Ti), tantalum (Ta), ruthenium (Ru), zirconium (Zr), cobalt (Co), copper (Cu), aluminum (Al), lead (Pb), platinum (Pt), tin (Sn), silver (Ag), or gold (Au), tantalum nitride (TaN), titanium nitride (TiN), tantalum carbide (TaC$_x$), titanium carbide (TiC), titanium aluminum carbide, tungsten silicide (WSi$_2$), tungsten nitride (WN), ruthenium oxide (RuO$_2$), cobalt silicide, or nickel silicide. The gate electrode material can be formed utilizing a deposition process such as, for example, ALD, CVD, PECVD, PVD, plating or sputtering. A reflow anneal or a silicide anneal can be used in some embodiments of the present application after conductive metal-containing material deposition has been performed.

In some embodiments, a layer of WFM can be formed on the continuous layer of gate dielectric material prior to forming the gate electrode material. In other embodiments, the gate electrode is composed of only a WFM. The layer of WFM can be used to set a threshold voltage of the FET to a desired value. In some embodiments, the layer of WFM can be selected to effectuate an n-type threshold voltage shift. "N-type threshold voltage shift" as used herein means a shift in the effective work-function of the work-function metal-containing material towards a conduction band of silicon in a silicon-containing material. In one embodiment, the work function of the n-type work function metal ranges from 4.1 eV to 4.3 eV. Examples of such materials that can effectuate an n-type threshold voltage shift include, but are not limited to, titanium aluminum, titanium aluminum carbide, tantalum nitride, titanium nitride, hafnium nitride, hafnium silicon, or combinations and thereof. In other embodiments, the layer of WFM can be selected to effectuate a p-type threshold voltage shift. In one embodiment, the work function of the p-type work function metal ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the effective work-function of the work-function metal-containing material towards a valence band of silicon in the silicon containing material. Examples of such materials that can effectuate a p-type threshold voltage shift include, but are not limited to, titanium nitride, and tantalum carbide, hafnium carbide, and combinations thereof.

The layer of WFM is a conformal layer which can be formed by a conformal deposition process such as, for example, ALD, CVD or PECVD. The layer of WFM layer can have a thickness in the range of 1 nm to 20 nm, although other thickness above or below this range may be used as desired for a particular application.

After forming the continuous layer of the gate dielectric material, the optional layer of WFM and the gate electrode material, a planarization process such as, for example, CMP, is used to remove the continuous layer of the gate dielectric material, the optional layer of WFM and the gate electrode material from outside each gate cavity. The remaining continuous layer of the gate dielectric material that is present inside the gate cavity can be referred to as the gate dielectric material layer 44, the remaining optional layer of WFM that is present inside the gate cavity can be referred to a WFM layer, and remaining gate electrode material that is present inside the gate cavity provides the gate electrode 46. It is again noted that the WFM layer can be used solely as the gate electrode 46.

Figure 15A:
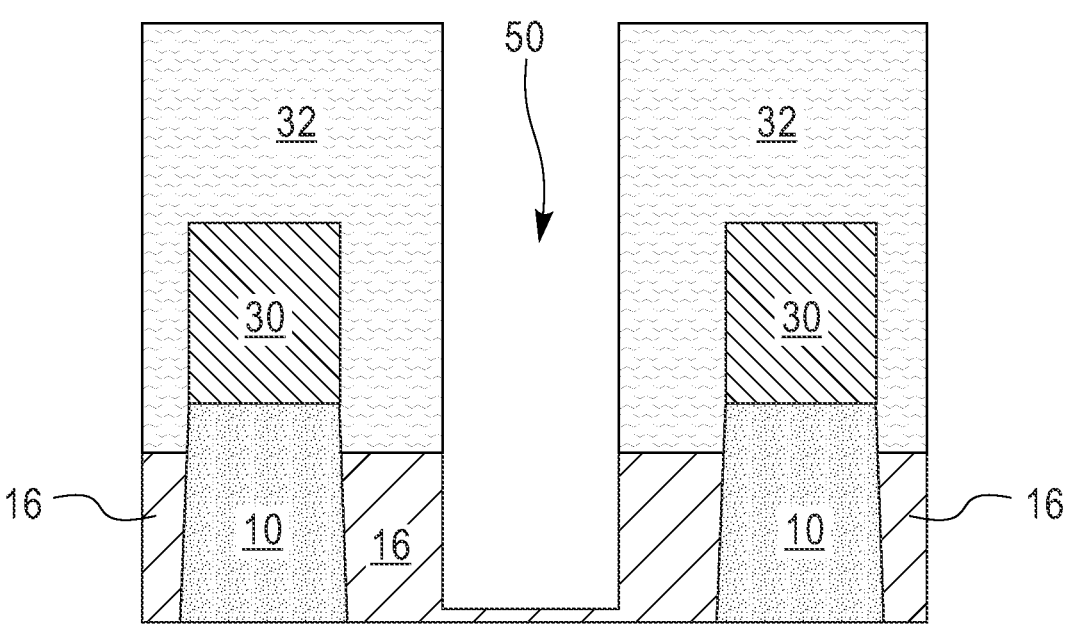
FIGS. 15A, 15B and 15C are cross sectional views of the exemplary structure shown in FIGS. 14A, 14B and 14C, respectively, after removing the additional placeholder material and the placeholder material layer.
Figure 15B:
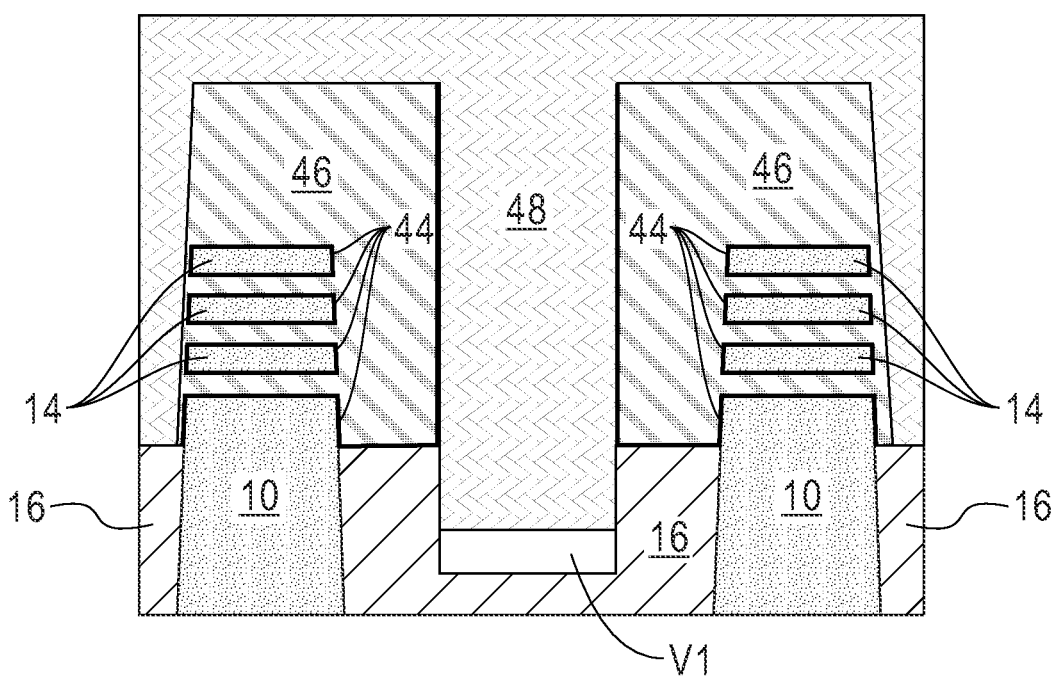
Figure 15C:
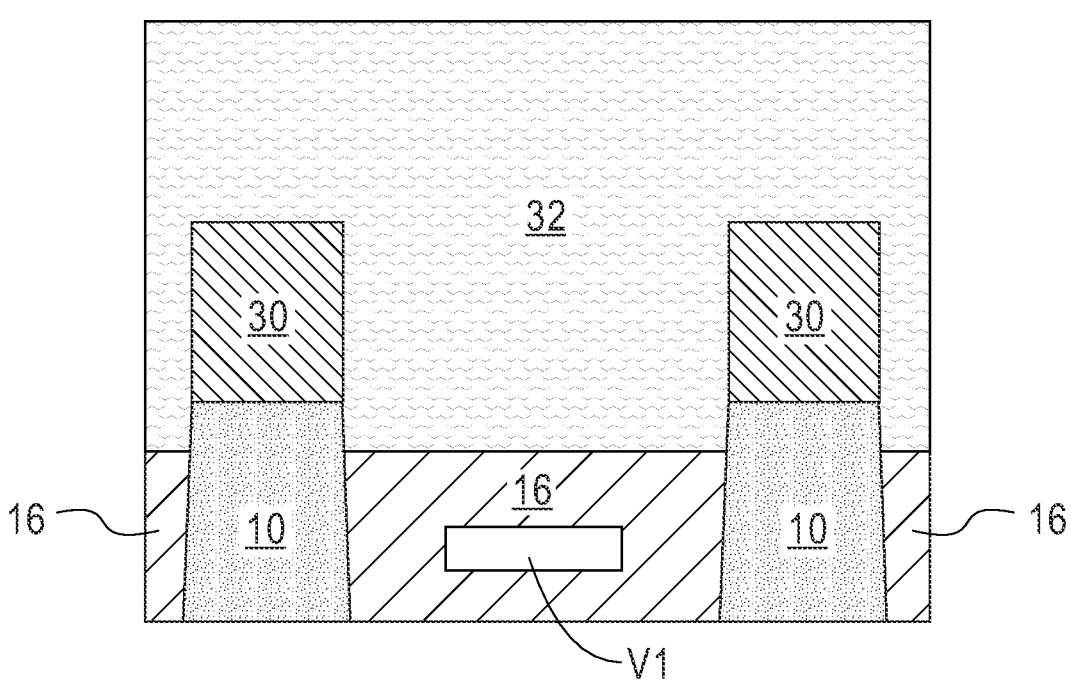

Referring now to FIGS. 15A, 15B and 15C, there are illustrated the exemplary structure shown in FIGS. 14A, 14B and 14C, respectively, and removing the additional placeholder material 42 and the placeholder material layer 28 The removal of placeholder material layer 28 in the areas of the structure shown in FIGS. 15B and 15C forms a void V1 in the shallow trench isolation structure 16. The removal of the additional placeholder material 42 and the placeholder material layer 28 in the area of the structure shown in FIG. 15A provides a buried power rail via opening 50. The removal of the additional placeholder material 42 and the placeholder material layer 28 includes an etching process or etching processes that is, or are, selective in removing sacrificial material. The buried power rail via opening 50 is formed in the previous source/drain cut trench 41.

Figure 16A:
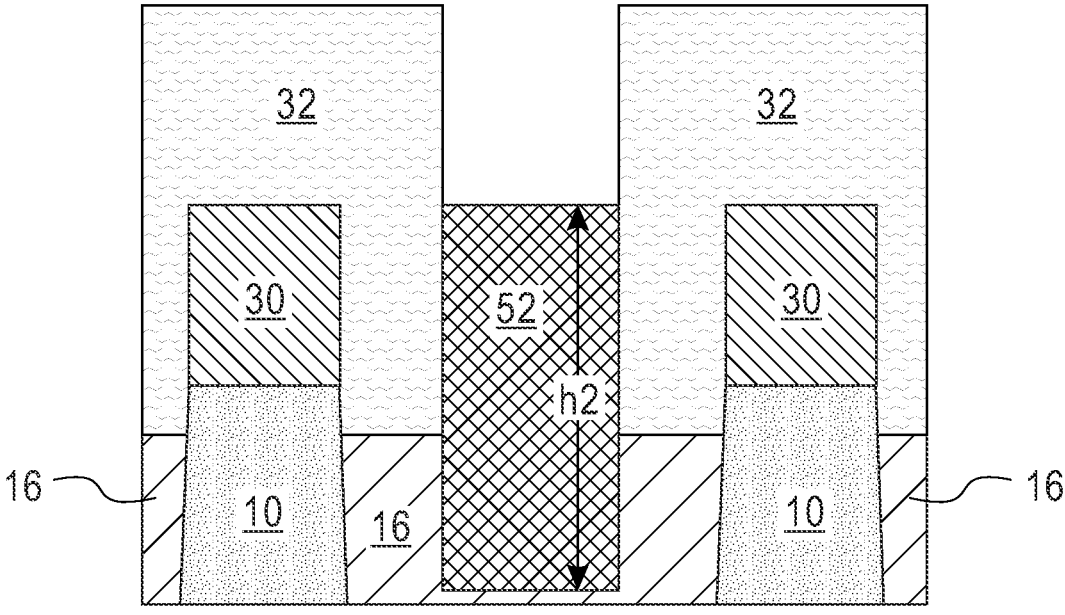
FIGS. 16A, 16B and 16C are cross sectional views of the exemplary structure shown in FIGS. 15A, 15B and 15C, respectively, after forming a buried power rail in the area previously including the additional placeholder material and the placeholder material layer.
Figures 16B, 16C:
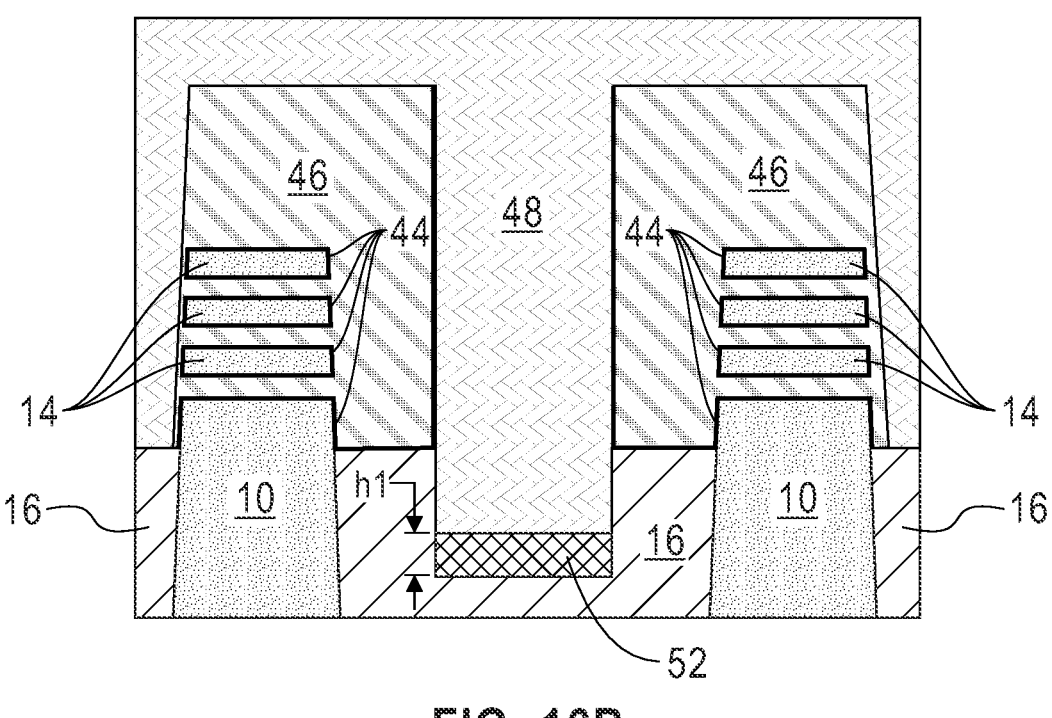

Referring now to FIGS. 16A, 16B and 16C, there are illustrated the exemplary structure shown in FIGS. 15A, 15B and 15C, respectively, after forming a buried power rail 52 in the area previously including the additional placeholder material 42 and the placeholder material layer 28. The buried power rail 52 is formed in the voids V1 as well as the buried power rail via opening 50.

The buried power rail 52 is composed of any electrically conductive power rail material including, but not limited to, tungsten (W), cobalt (Co), aluminum (Al), copper (Cu), platinum (Pt), rhodium (Rh), or palladium (Pd), with a thin metal adhesion layer (such as TiN, TaN) typically being formed prior to the conductive metal deposition; for clarity, the metal adhesion layer is not separated illustrated in the drawings of the present application. The buried power rail 52 can be formed by deposition of the electrically conductive power rail material, planarization and performing a recess etch. The recess etch can adjust the height of the buried power rial 52 that is present in the buried power rail trench opening 50.

Figure 17A:
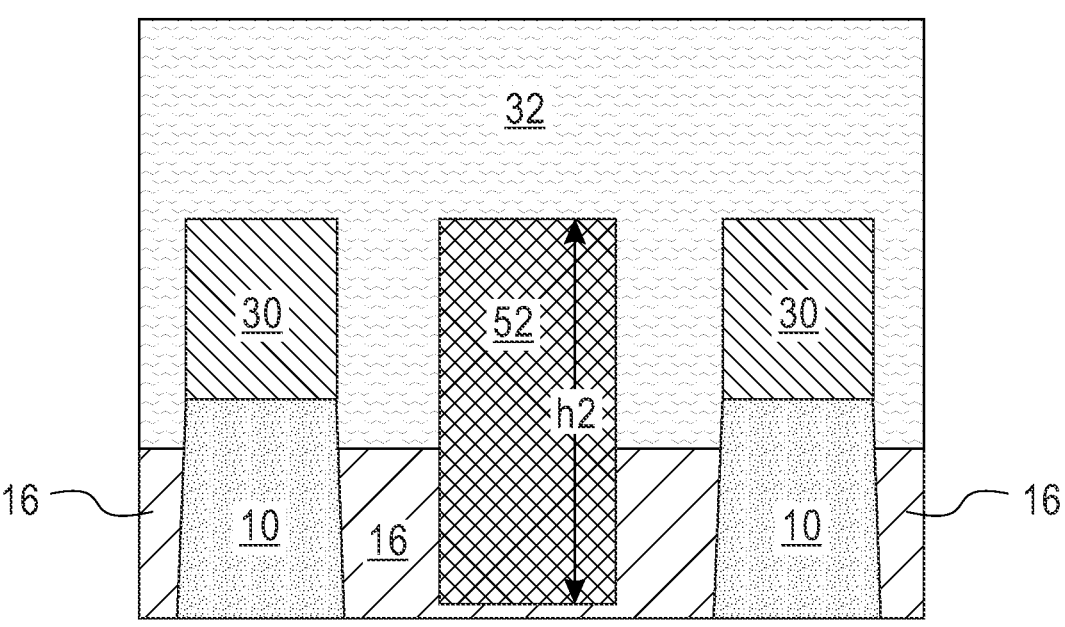
FIGS. 17A, 17B and 17C are cross sectional views of the exemplary structure shown in FIGS. 16A, 16B and 16C after forming additional interlayer dielectric material on the buried power rail.

The buried power rail 52 has a first portion (See, FIG. 16B) that is present in the gate cut trench 38 that has a first height h1, and a second portion (See, FIG. 16A) that is present in the source/drain cut trench 41 that has a second height h2 that is greater than the first height; the first and second portions of the buried power rail 52 provide a contiguous buried power rail structure. As is shown in FIG. 16B, the first portion of the buried power rail 62 is located entirely beneath a topmost surface of a shallow trench isolation structure 16, and, as shown in FIG. 17A, the second portion of the buried power rail 52 has an upper portion that extends above the topmost surface of the shallow trench isolation structure 16. FIG. 16C shows a third portion of the buried power rail 52 that is entirely surrounded by the shallow trench isolation structure 16.

Figure 17B:
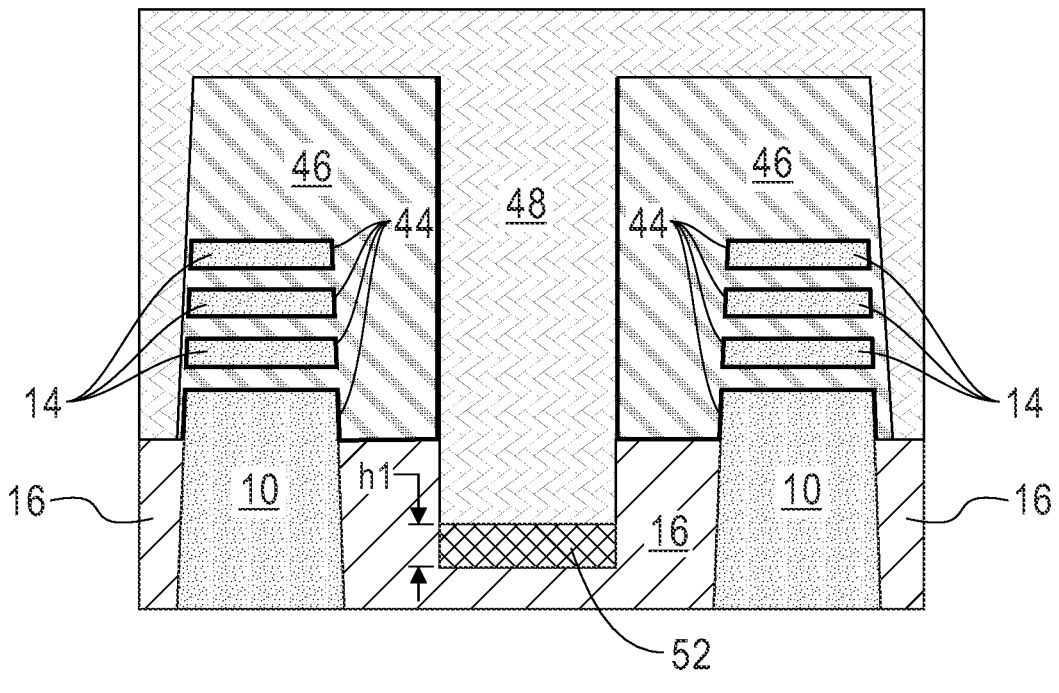
Figure 17C:
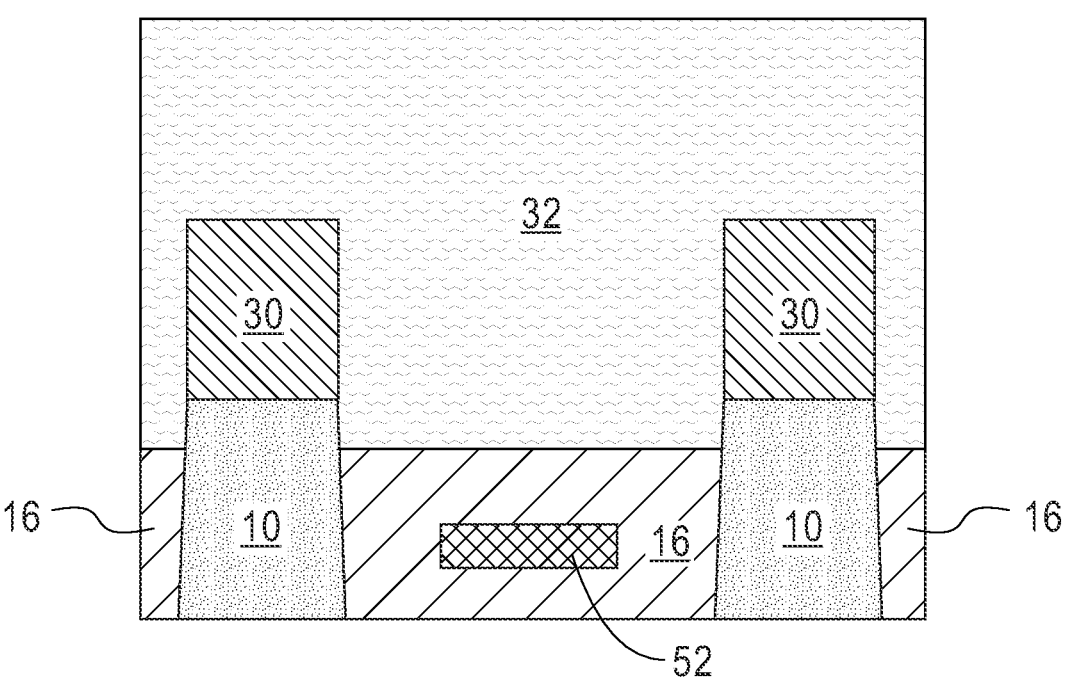

Referring now to FIGS. 17A, 17B and 17C, there are illustrated the exemplary structure shown in FIGS. 16A, 16B and 16C, respectively, after forming additional interlayer dielectric material on the buried power rail 52. The additional ILD material is typically a same ILD material as the ILD material layer 32 thus the additional ILD material layer 60 reestablishes the integrity of the ILD material layer 32.

Figure 18A:
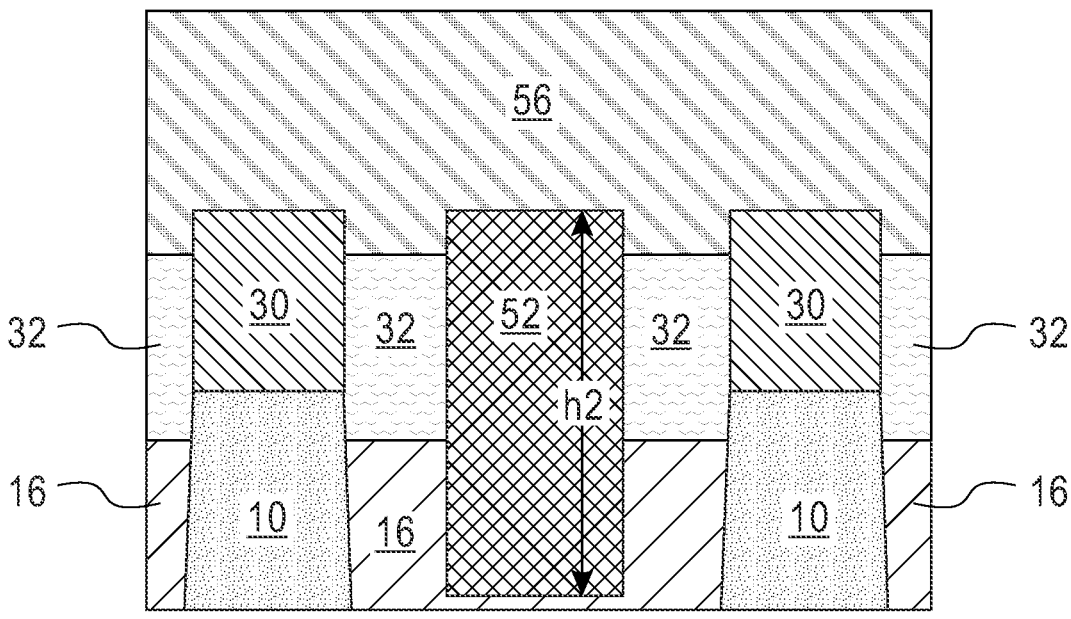
FIGS. 18A, 18B and 18C are cross sectional views of the exemplary structure shown in FIGS. 17A, 17B and 17C, respectively, after forming a conductive contact structure.
Figure 18B:
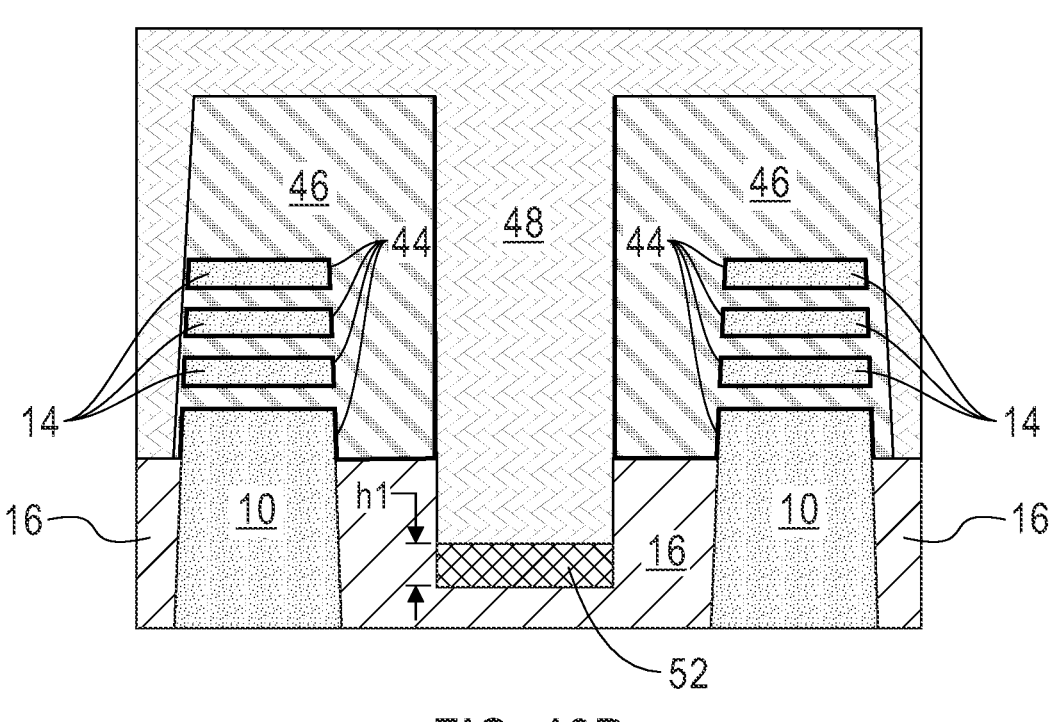
Figure 18C:
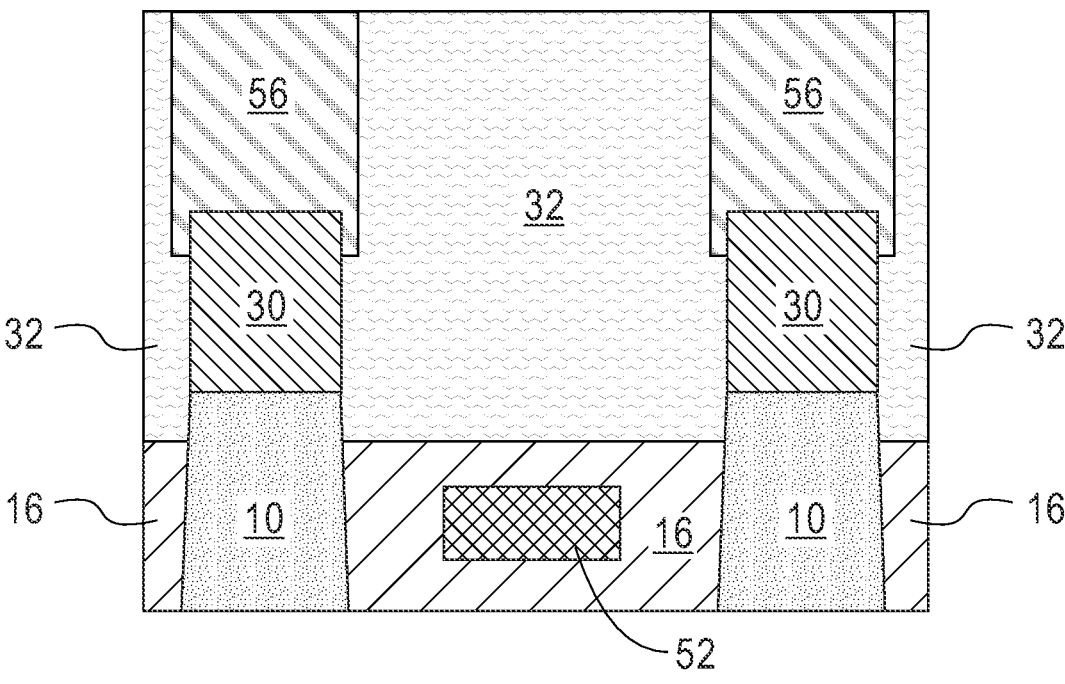

Referring now to FIGS. 18A, 18B and 18C, there are illustrated the exemplary structure shown in FIGS. 17A, 17B and 17C, respectively, after forming a conductive contact structure 56. In some embodiments, a contact liner present along the sidewalls and bottom wall of the conductive contact structure 56. The conductive contact structure 56 in the area of the structure shown in FIG. 18A can be formed by first recessing the ILD material layer 32 below the topmost surface of both the buried power rail 52 and the source/drain regions 30, and then forming the conductive contact structure 56. In the area of the structure in FIG. 18C, contact openings are formed into the ILD material layer 32, and then the conductive contact 56 is formed in the contact openings.

In one or more embodiments in which a contact liner is present, the contact liner (not shown) can include a silicide liner, such as Ti, Ni, NiPt, etc., and a diffusion barrier material. Exemplary diffusion barrier materials include, but are not limited to, Ru, TiN, TaN, WN, WC, an alloy thereof, or a stack thereof such as Ti/TiN and Ti/WC. The contact liner can be formed utilizing a conformal deposition process including PVD, RFPVD, CVD or ALD. The contact liner that is formed can have a thickness ranging from 1 nm to 8 nm, although lesser and greater thicknesses can also be employed.

The conductive contact structure 56 includes a contact conductor material such as, for example, W, Cu, Al, Co, Ru, Mo, Os, Jr, Rh or an alloy thereof. The contact conductor material can be formed by any suitable deposition method such as, for example, ALD, CVD, PVD or plating. A planarization process can be used to remove the contact conductor material and the contact liner (when provided) that are located outside contact openings. The remaining contact conductor material and if present, the contact liner provide the conductive contact structures shown in FIGS. 18A and 18C. In FIG. 18, conductive contact structure 56 is in direct physical contact with a surface of the buried power rail 52 as well physically exposed surfaces of the source/drain regions 30 of adjacent nanosheet devices. In FIG. 18C, the conductive contact structures 56 directly contact individual source/drain regions 30.

Figure 19:
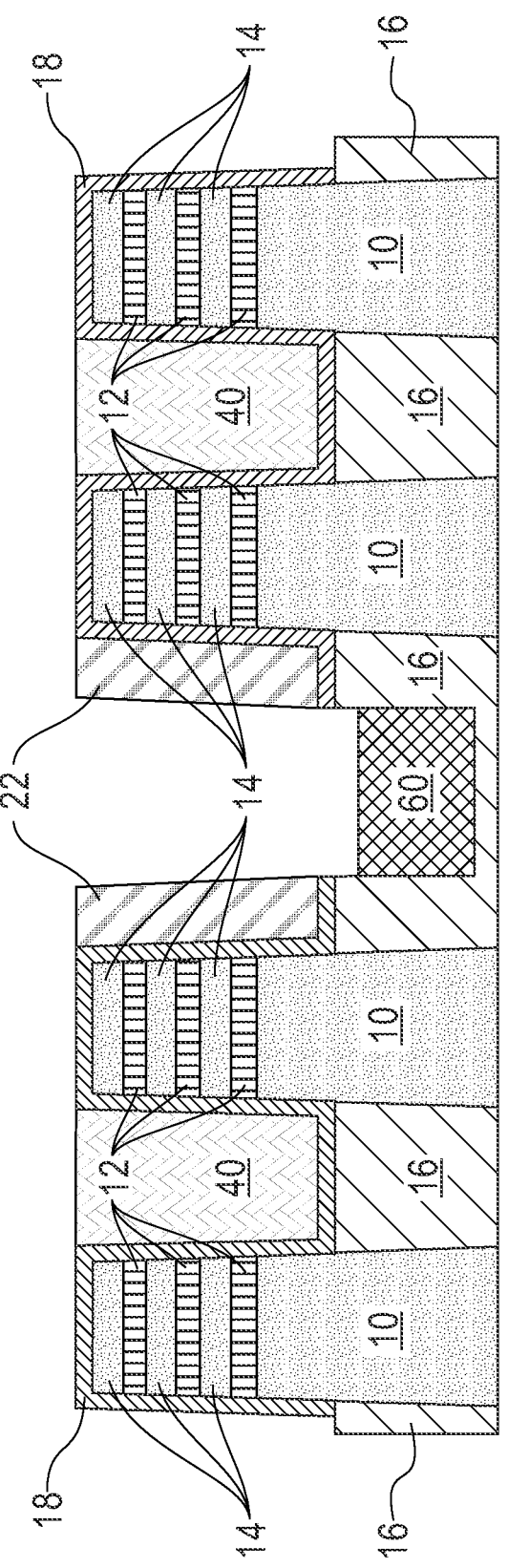
FIG. 19 is a cross sectional view of the exemplary structure shown in FIG. 3 after forming spacers from the spacer material layer, removing a physically exposed portion of the first dielectric material layer and a portion of the shallow trench isolation structure not protected by the spacers, and forming a buried power rail conductive material layer on a subsurface of the shallow trench isolation structure.

Referring now to FIG. 19, there is illustrated the exemplary structure shown in FIG. 3 after forming spacers 22 from the spacer material layer 22L, removing a physically exposed portion of the first dielectric material layer 18 and a portion of the shallow trench isolation structure 16 not protected by the spacers 22, and forming a buried power rail conductive material layer 60 on a subsurface of the shallow trench isolation structure 16. The formation of the spacers 22, removal of the physical exposed portion of the first dielectric material layer 18 and a portion of the shallow trench isolation structure 16 of this embodiment of the present application are the same as that described above in the embodiment of the present application that provides the structure shown in FIG. 4.

Instead of forming the placeholder material layer 28 as in the case in FIG. 4, this embodiment of the present application forms buried power rail conductive material layer 60 on the subsurface of the shallow trench isolation structure 16. The buried power rail conductive material layer 60 includes one of the electrically conductive power rail materials mentioned above for buried power rail 52. The buried power rail conductive material layer 60 can be formed by first depositing the electrically conductive power rail material, and then performing a recess etch. The deposition of the electrically conductive power rail material includes one of the deposition techniques mentioned above for forming the buried power rail 52. The buried power rail conductive material layer 60 has a topmost surface that can be coplanar with, or slightly below, a topmost surface of the shallow trench isolation structure 16.

Figure 20A:
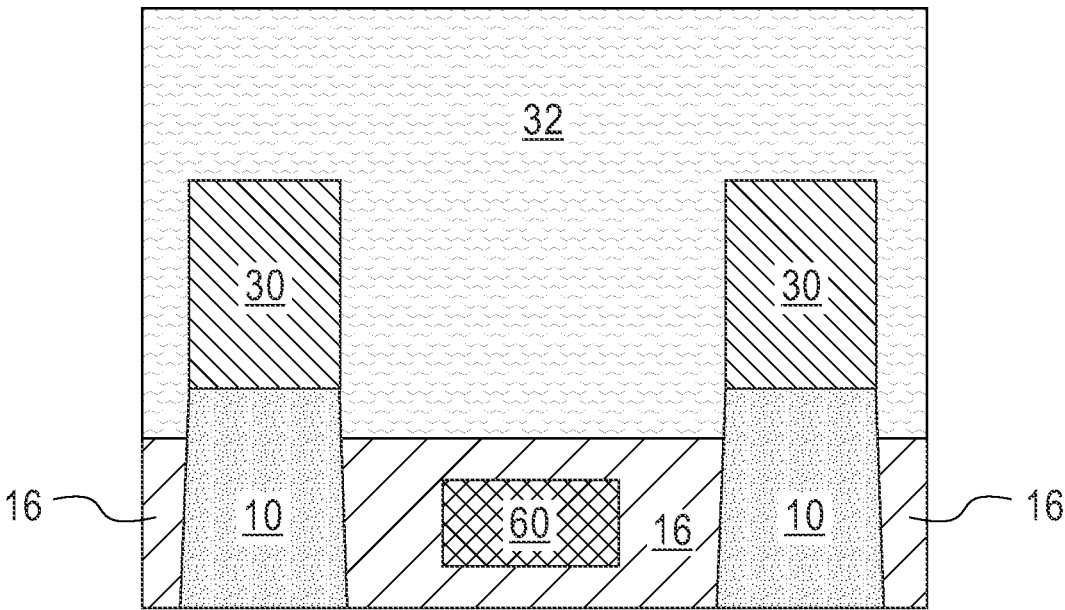
FIGS. 20A, 20B and 20C are cross sectional views of the exemplary structure shown in FIG. 19 and along cuts X2-X2, X3-X3 and X4-X4 shown in FIG. 6, respectively, after forming a layer of polysilicon, spacer removal, forming source/drain regions, and forming an interlayer dielectric material layer.
Figure 20B:
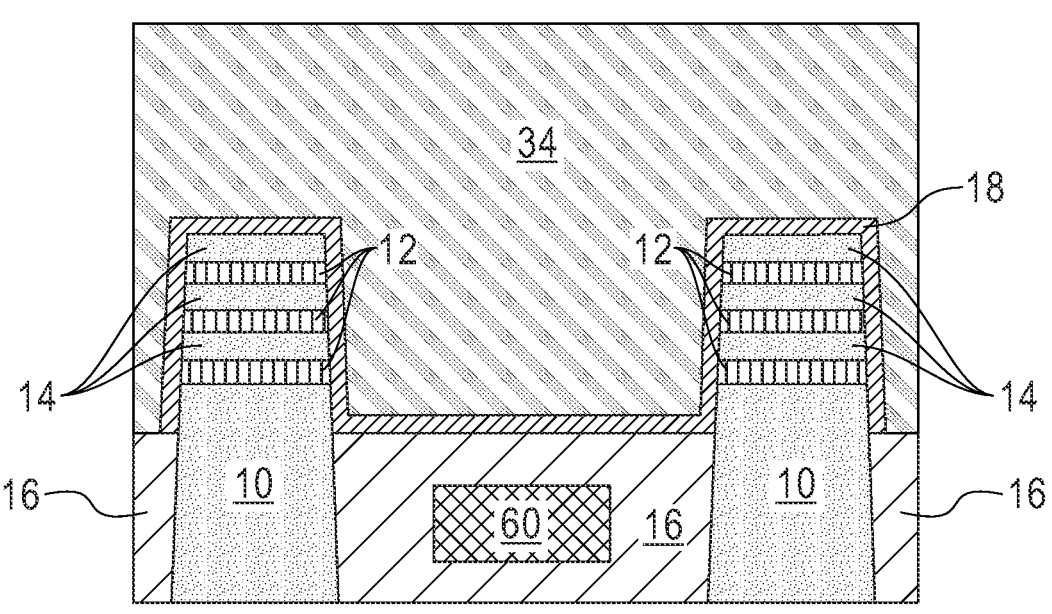
Figure 20C:
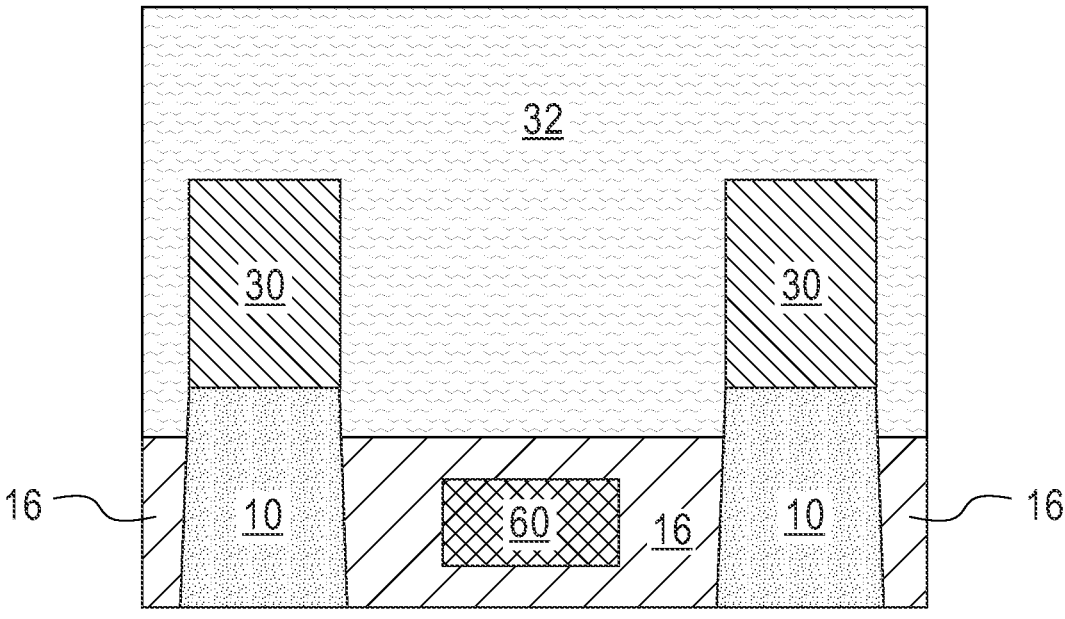

Referring now to FIGS. 20A, 20B and 20C, there are illustrated the exemplary structure shown in FIG. 19 and along cuts X2-X2, X3-X3 and X4-X4 shown in FIG. 6, respectively, after forming a layer of polysilicon 34, spacer removal 22, forming source/drain regions 30, and forming an interlayer dielectric material layer 32. The materials and processing steps used for providing the exemplary structure shown in FIGS. 20A, 20B and 20C are the same as the material and processing steps mentioned above in forming the structure shown in FIGS. 7A, 7B and 7C.

Figure 21A:
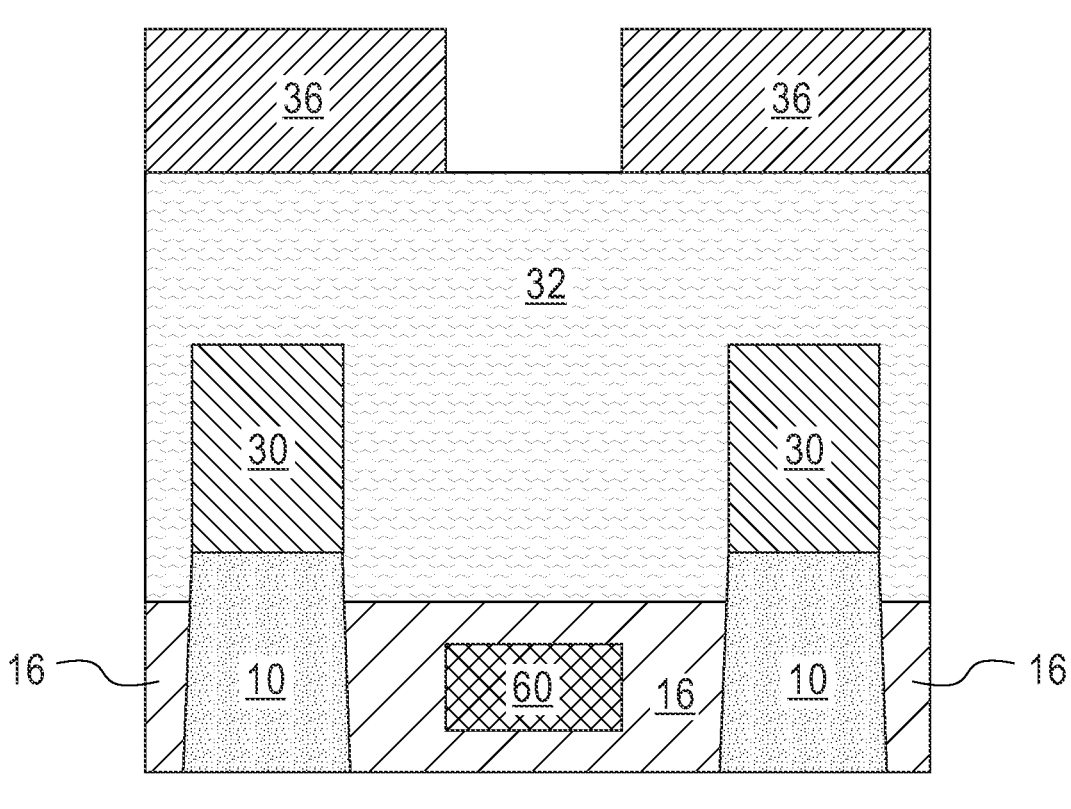
FIGS. 21A, 21B and 21C are cross sectional views of the exemplary structure shown in FIGS. 20A, 20B and 20C, respectively, after forming a gate cut trench mask.
Figure 21B:
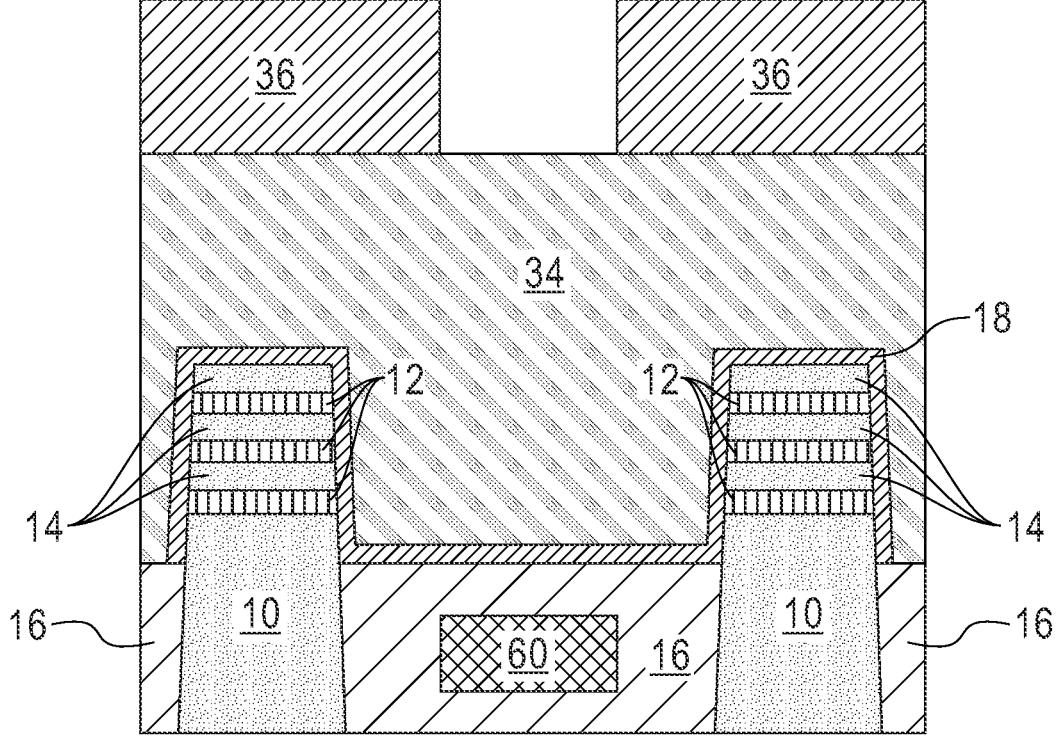
Figure 21C:
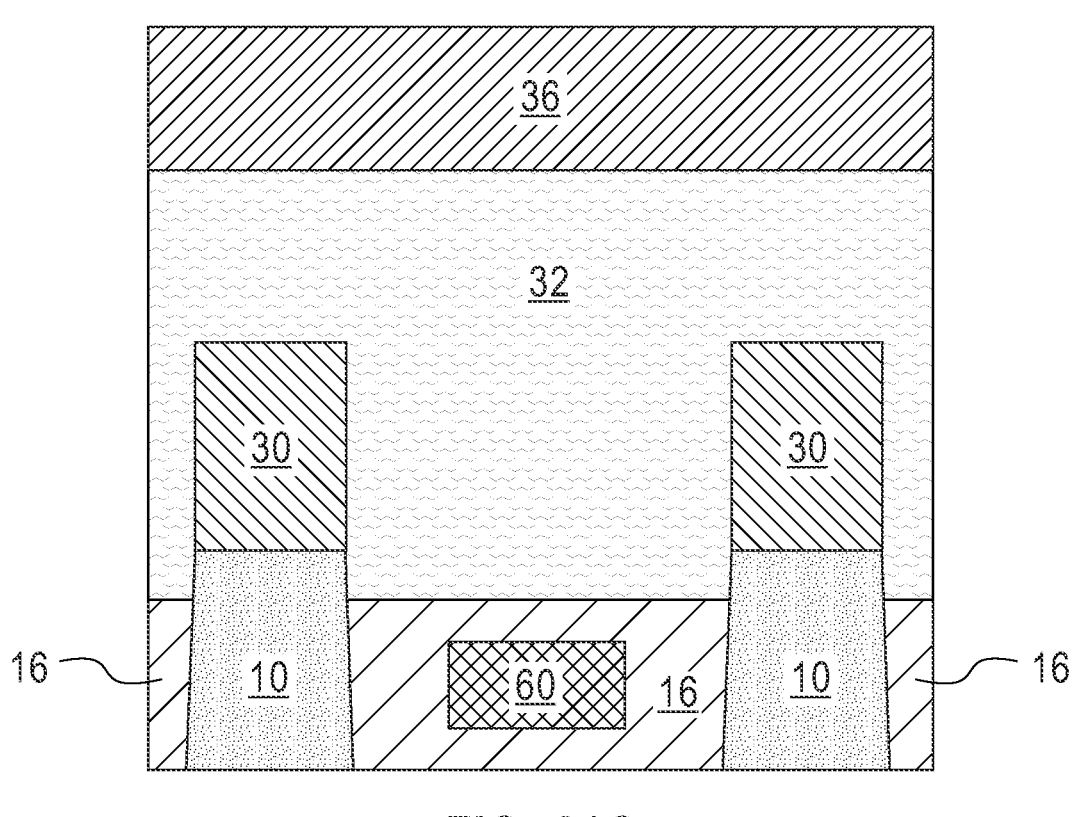

Referring now to FIGS. 21A, 21B and 21C, there are illustrated the exemplary structure shown in FIGS. 20A, 20B and 20C, respectively, after forming a gate cut trench mask 36. The description regarding the gate cut trench mask 36 mentioned above for providing the exemplary structure shown in FIGS. 8A, 8B and 8C applies equally well here for this embodiment of the present application. It is again noted that the gate cut trench mask 36 has openings in the areas of the structure shown in FIGS. 21A and 21B, but not FIG. 21C.

Figure 22A:
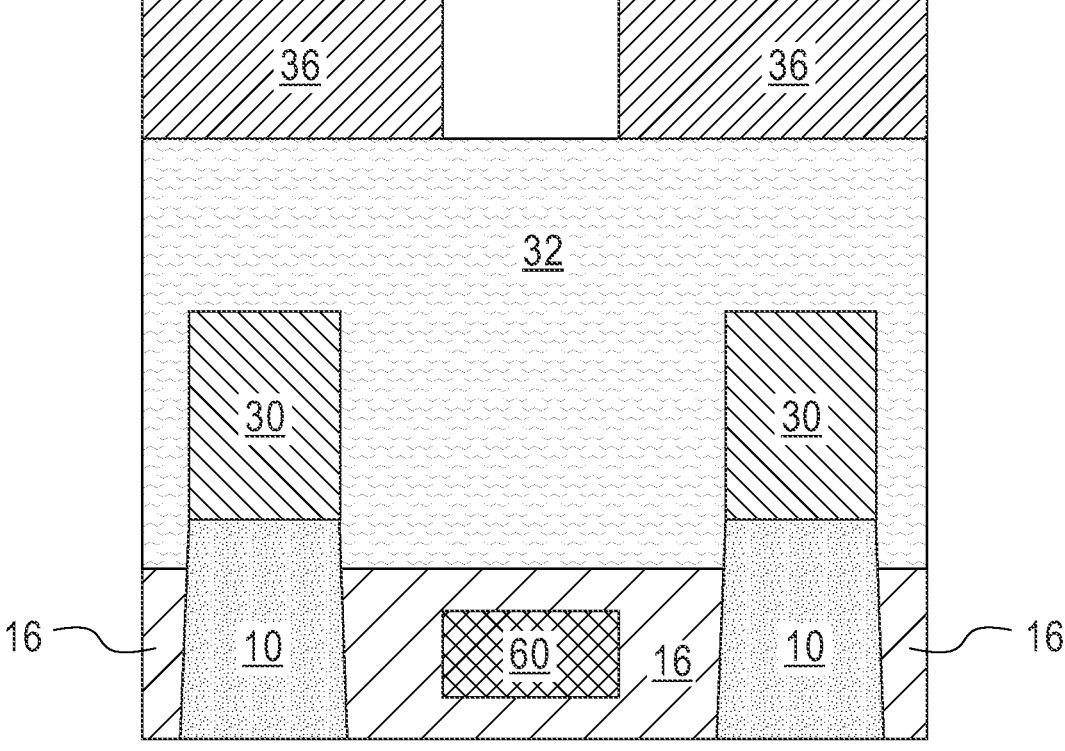
FIGS. 22A, 22B and 22C are cross sectional views of the exemplary structure shown in FIGS. 21A, 21B and 21C, respectively, after performing a gate cut process in which a gate cut trench is formed.
Figure 22B:
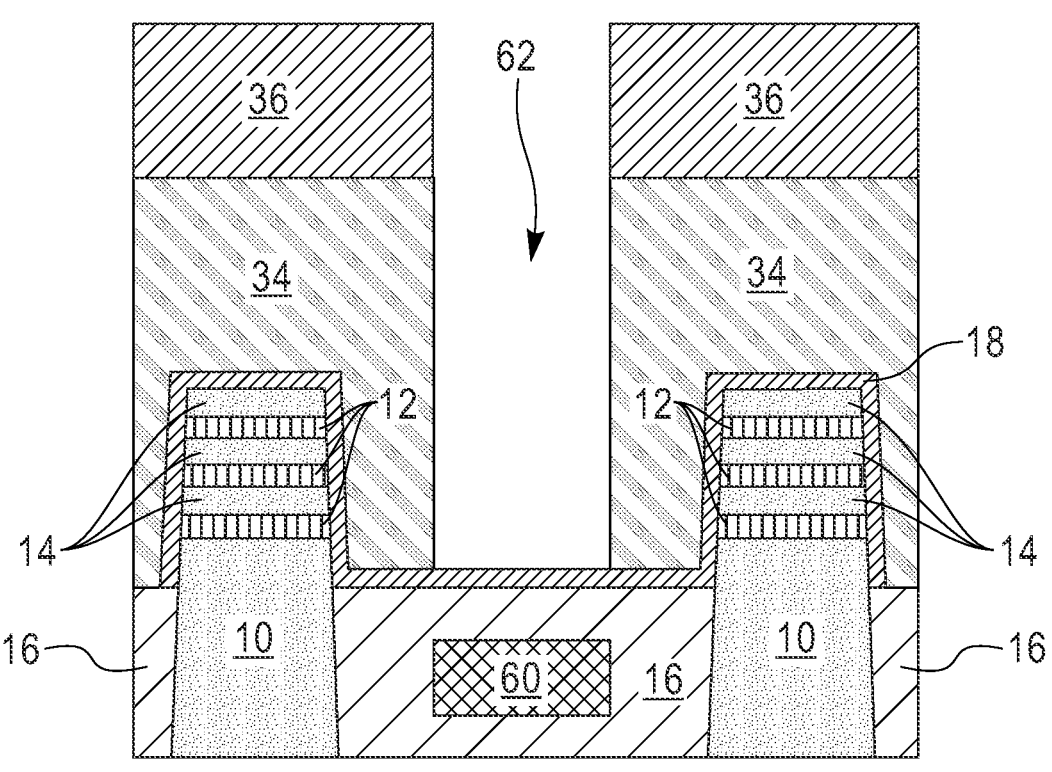
Figure 22C:
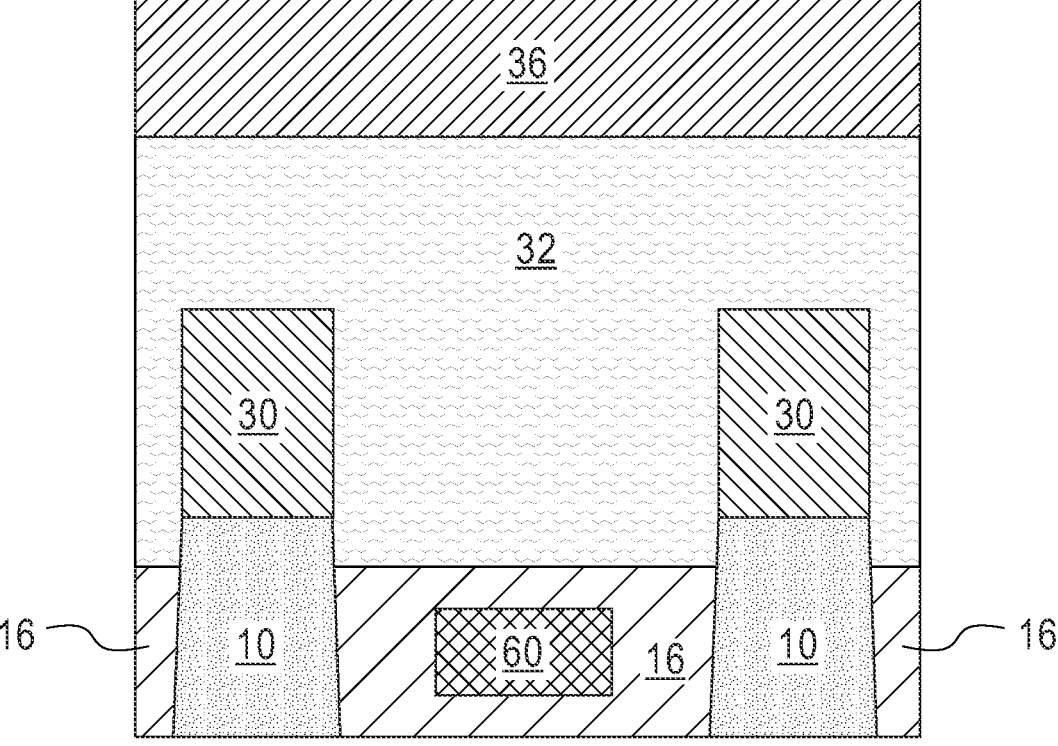

Referring now to FIGS. 22A, 22B and 22C, there are illustrated the exemplary structure shown in FIGS. 21A, 21B and 21C, respectively, after performing a gate cut process in which a gate cut trench 62 is formed. The gate cut process used in this embodiment is similar to the gate cut process mentioned above for providing the exemplary structure shown in FIG. 9B. In this embodiment, the one or more etching processes used in forming the gate cut trench 62 stops on a surface of the first dielectric material layer 18.

Figure 23A:
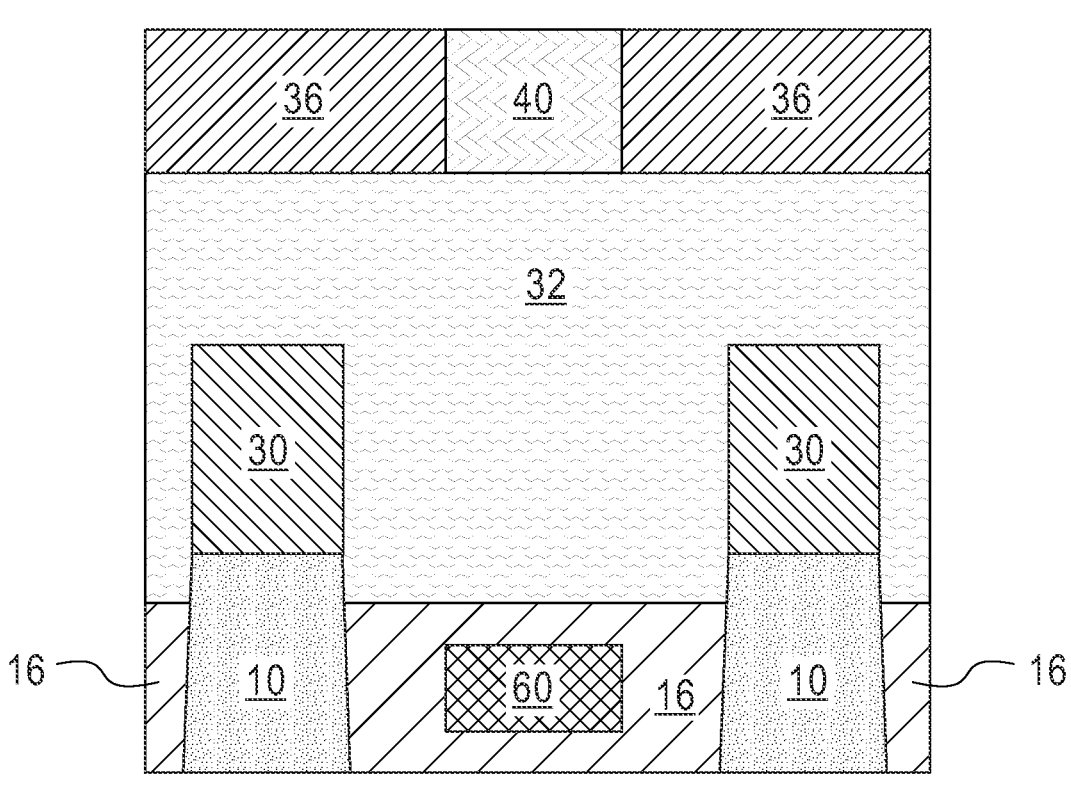
FIGS. 23A, 23B and 24C are cross sectional views of the exemplary structure shown in FIGS. 22A, 22B and 22C, respectively, after forming a dielectric material in the gate cut trench.
Figure 23B:
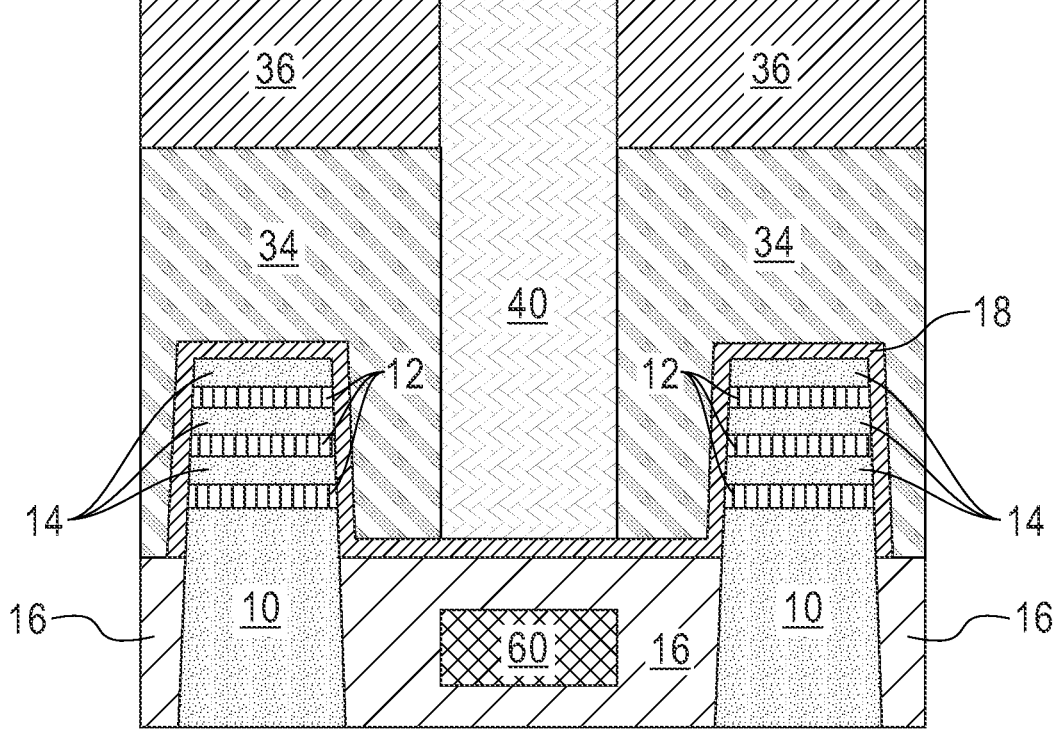
Figure 24A:
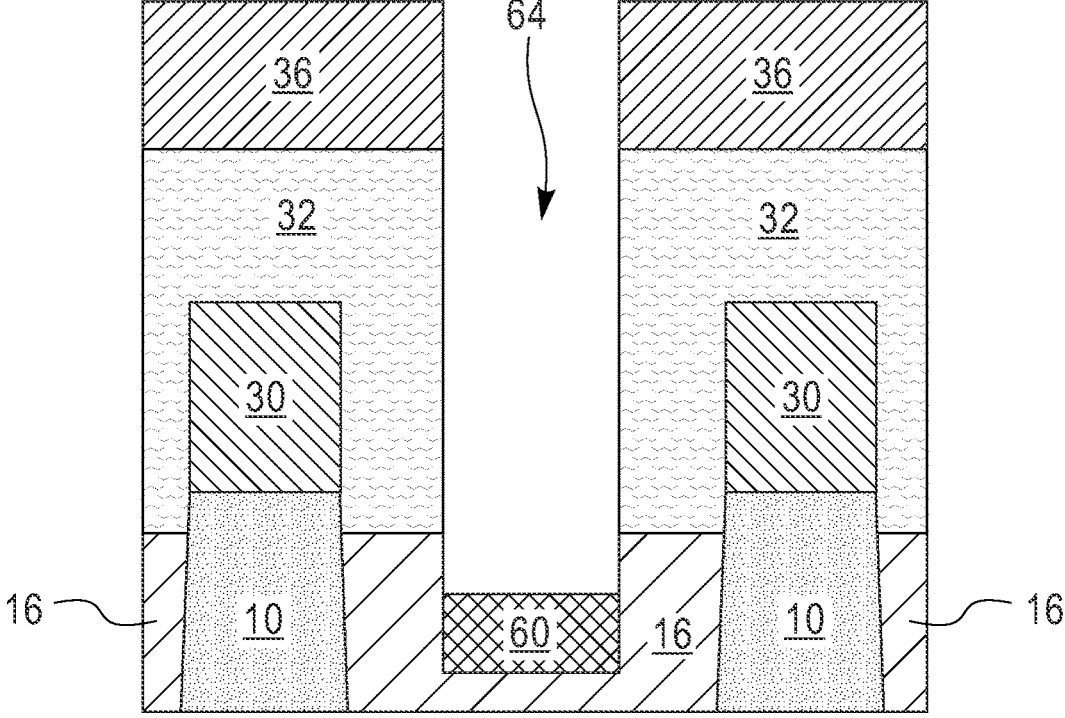
Figure 24B:
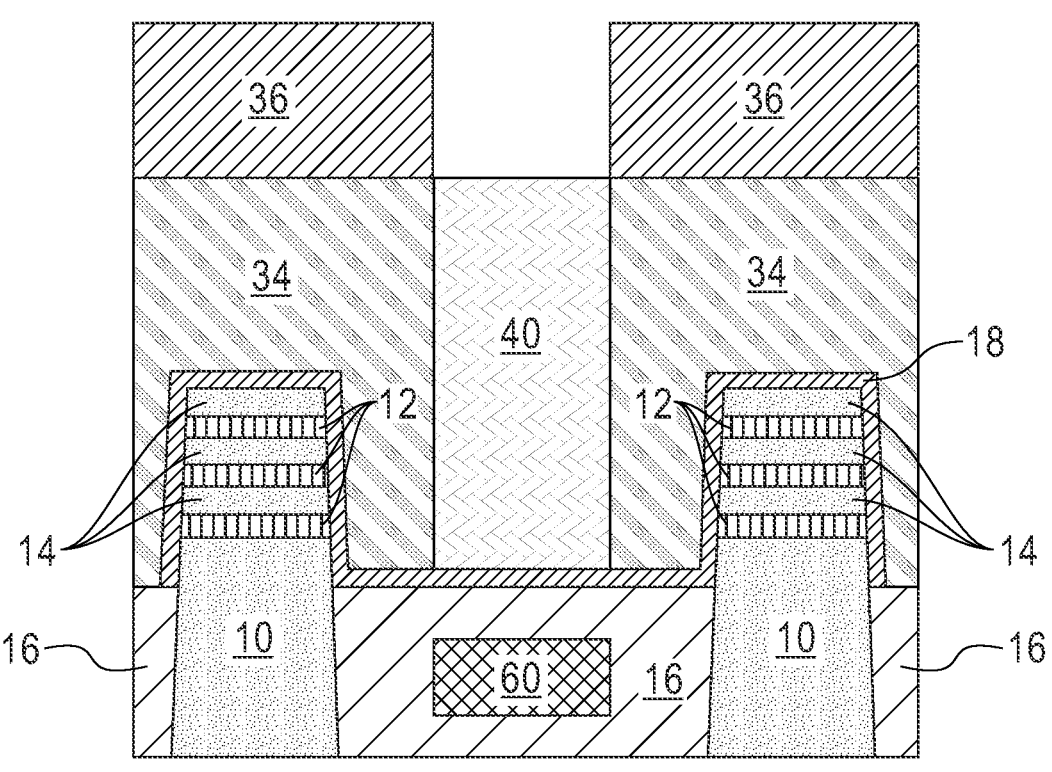
Figure 24C:
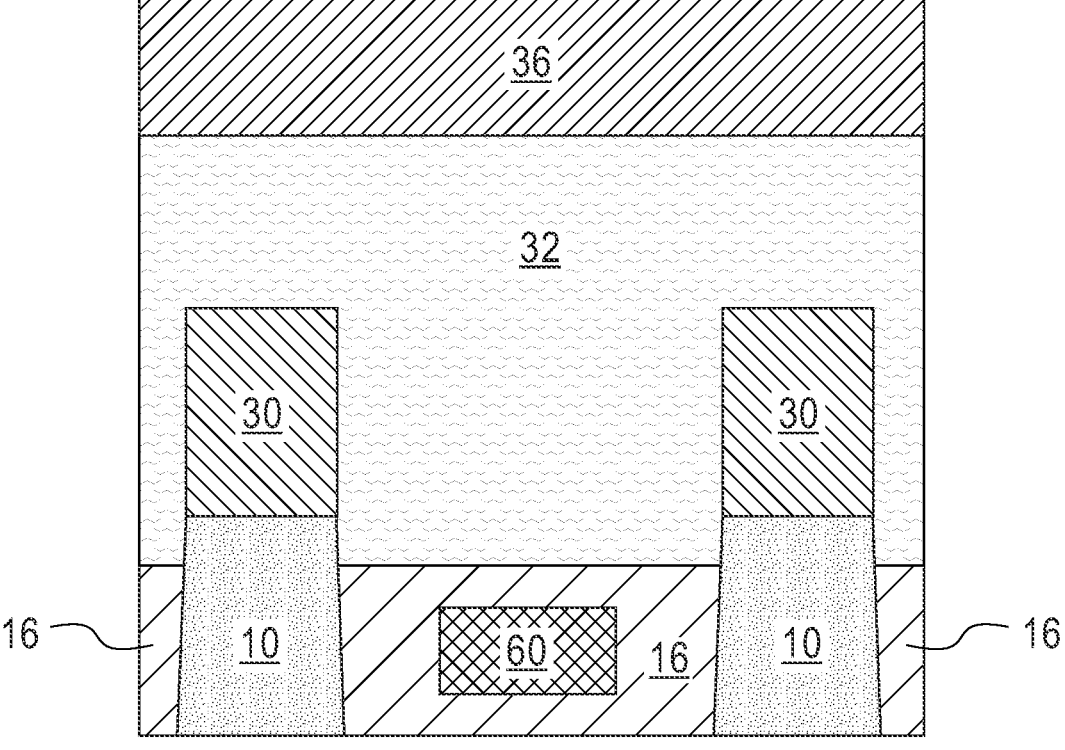

Referring now to FIGS. 23A, 23B and 24C, there are illustrated the exemplary structure shown in FIGS. 22A, 22B and 22C, respectively, after forming a dielectric material 40 in the gate cut trench 62. Dielectric material 40 includes one of the materials mentioned above for dielectric material 40 shown in FIGS. 10A and 10B of the present application. Dielectric material 40 can be formed utilizing one of the deposition techniques mentioned above for providing dielectric material 40 in the structure shown in FIGS. 10A and 10B of the present application.

Figure 23C:
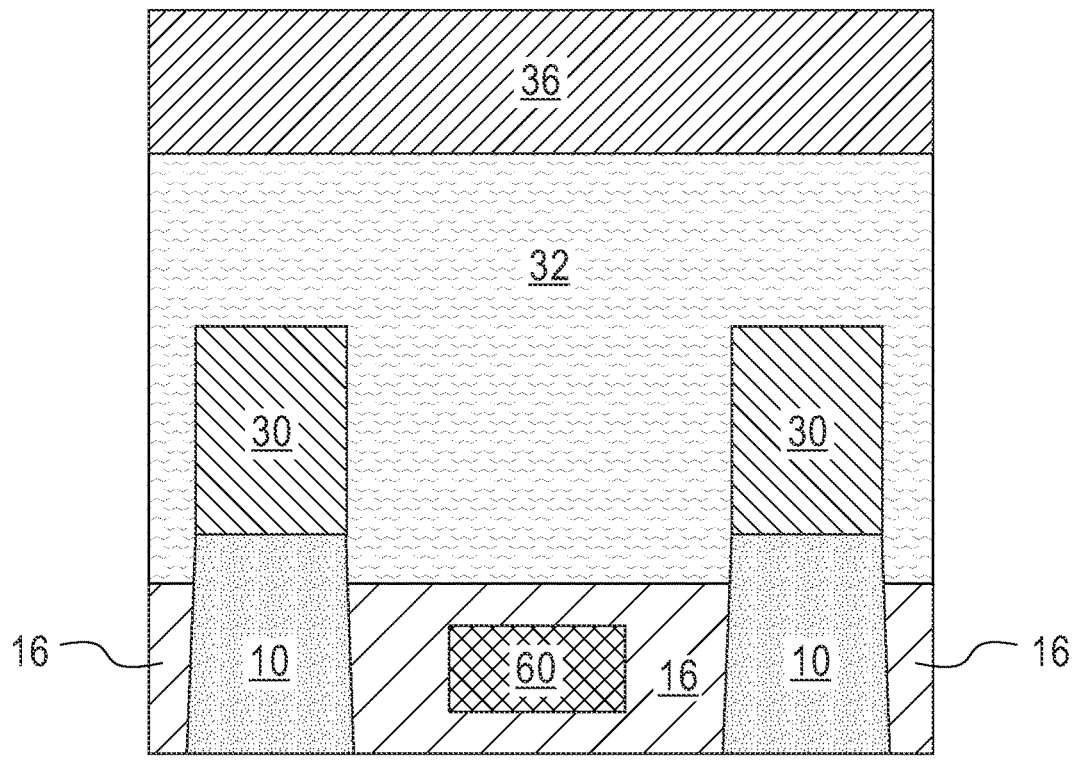

Referring now to FIGS. 24A, 24B and 24C, there are illustrated the exemplary structure shown in FIGS. 23A, 23B and 23C, respectively, after performing a source/drain cut in which a source/drain cut trench 64 is formed that physically exposes the buried power rail conductive material layer 60 (See, FIG. 24A). The source/drain cut that is used in forming the source/drain cut trench 64 is the same as the source/drain cut mentioned above for forming the source/drain cut trench 42 shown in FIG. 11A. Note that the etch used in forming the source/drain cut trench 64 stops on a surface of the buried power rail conductive material layer 60.

Figure 25A:
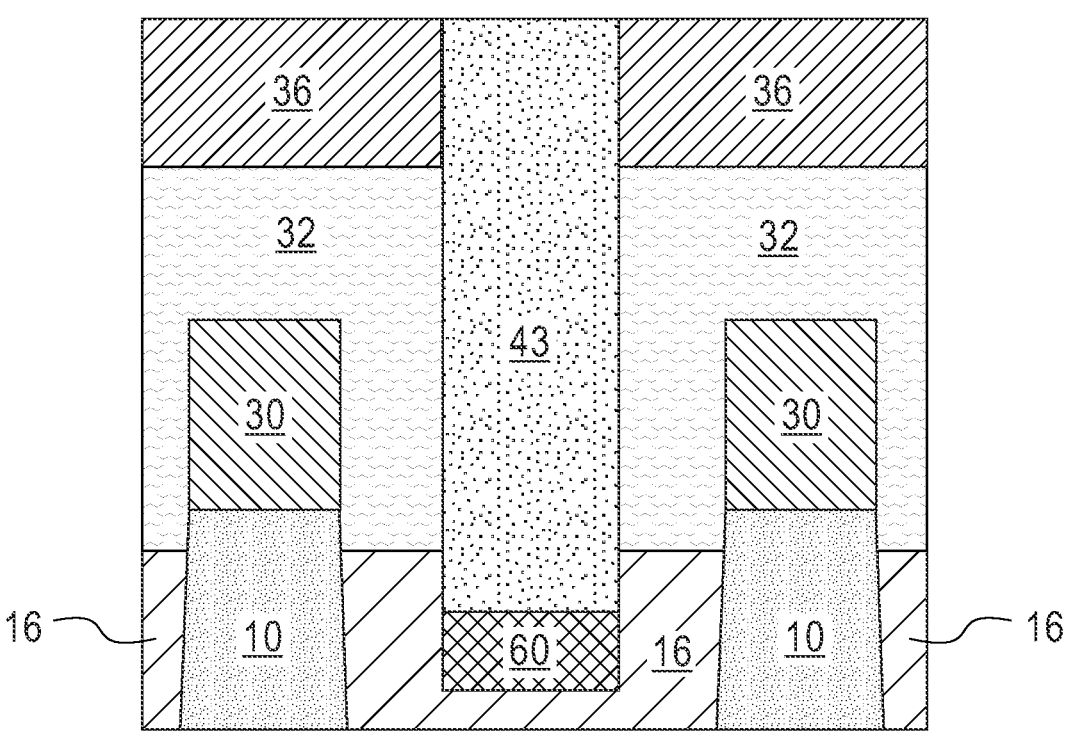
FIGS. 25A, 25B and 25C are cross sectional views of the exemplary structure shown in FIGS. 24A, 24B and 24C, respectively, after forming a placeholder material in the source/drain cut trench and on the physically exposed buried power rail conductive material layer.
Figure 25B:
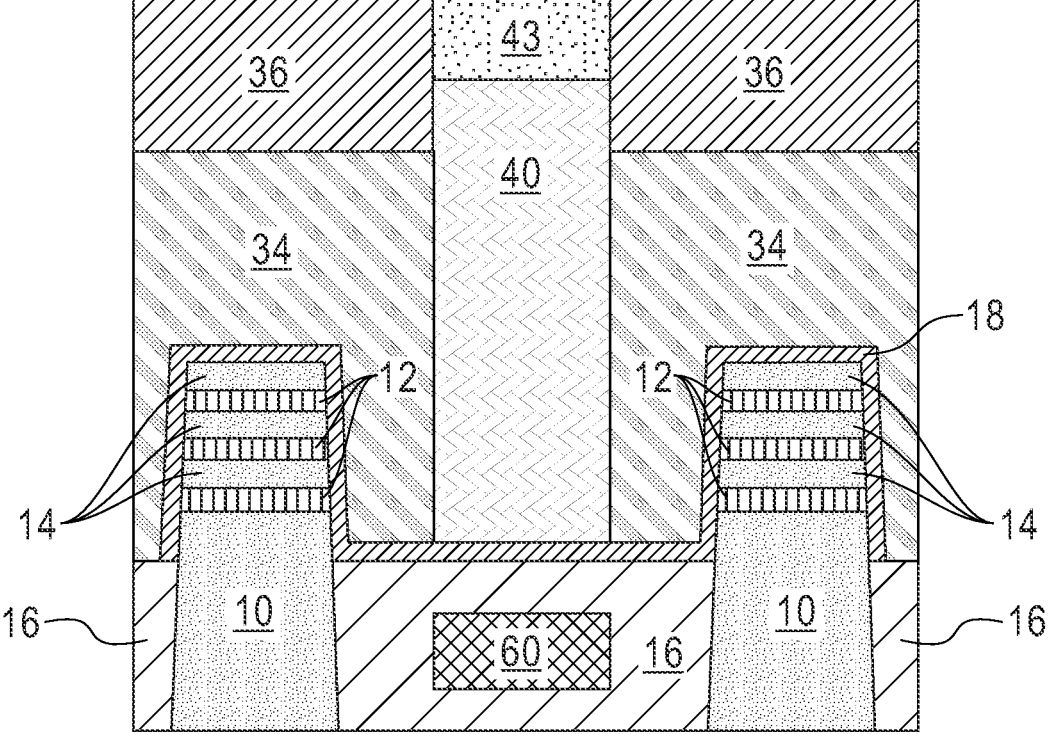
Figure 25C:
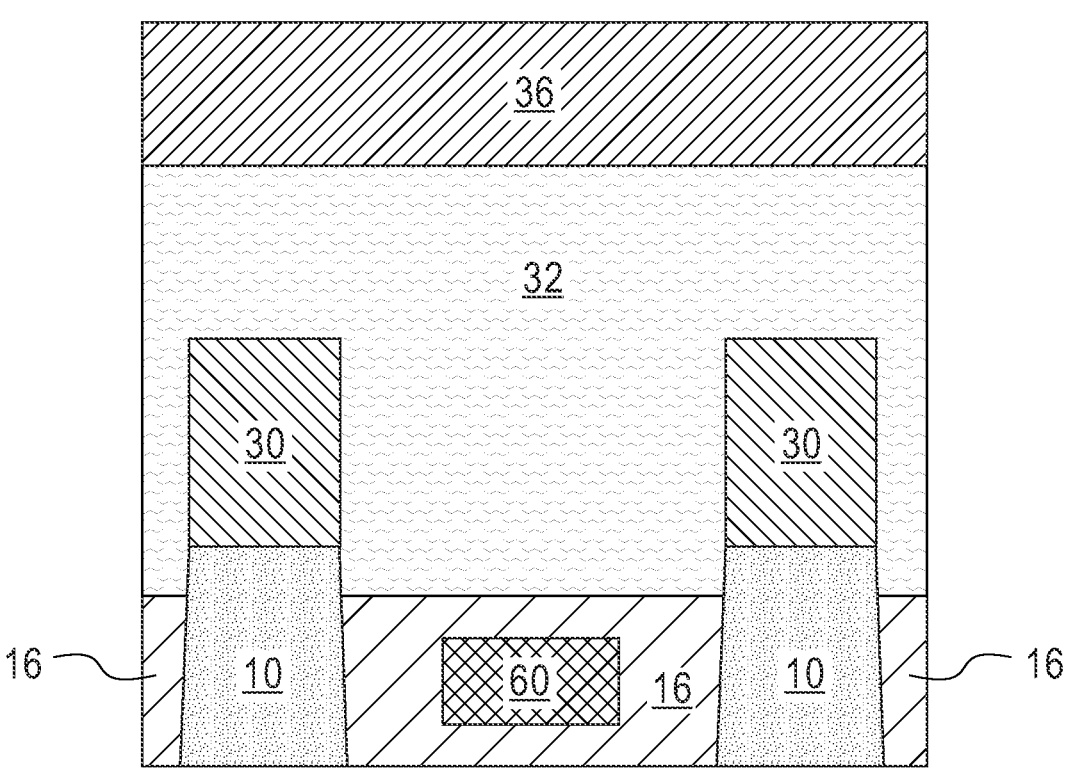

Referring now to FIGS. 25A, 25B and 25C, there are illustrated the exemplary structure shown in FIGS. 24A, 24B and 24C, respectively, after forming a placeholder material 43 in the source/drain cut trench 64 and on the physically exposed buried power rail conductive material layer 60. The placeholder material 43 used in this embodiment of the present application includes one of the sacrificial materials mentioned above for forming the sacrificial placeholder material layer 28. As is shown in FIG. 25B, the placeholder material 43 also forms atop the dielectric material 40 that is present in the gate cut trench 62.

Figure 26A:
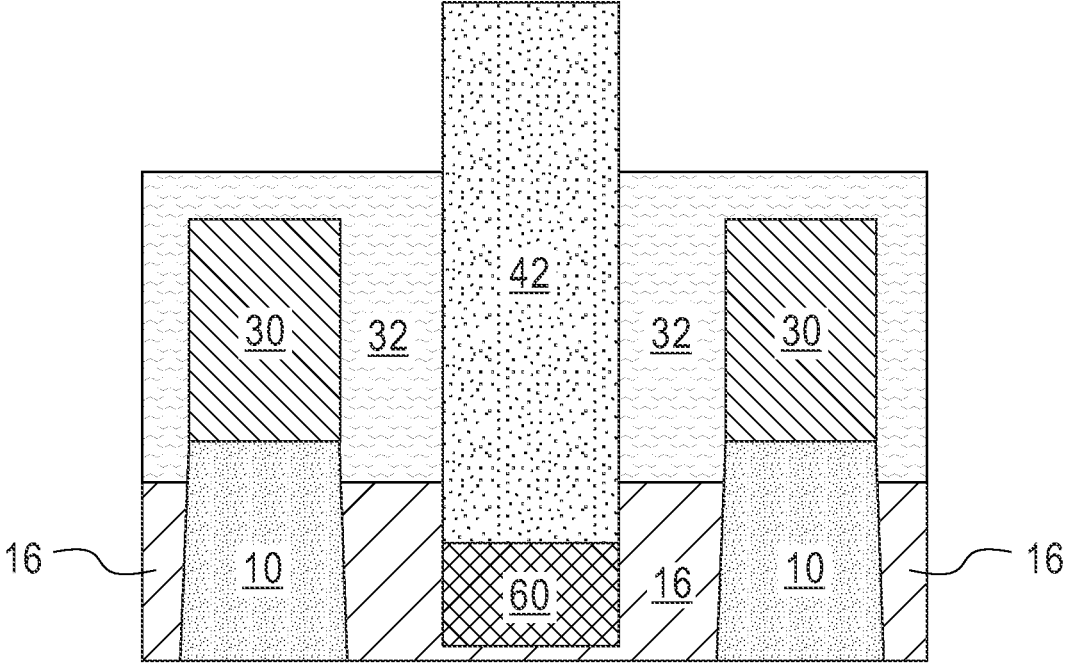
FIGS. 26A, 26B and 26C are cross sectional views of the exemplary structure shown in FIGS. 25A, 25B and 25C, respectively, after removing the gate cut trench mask.
Figure 26B:
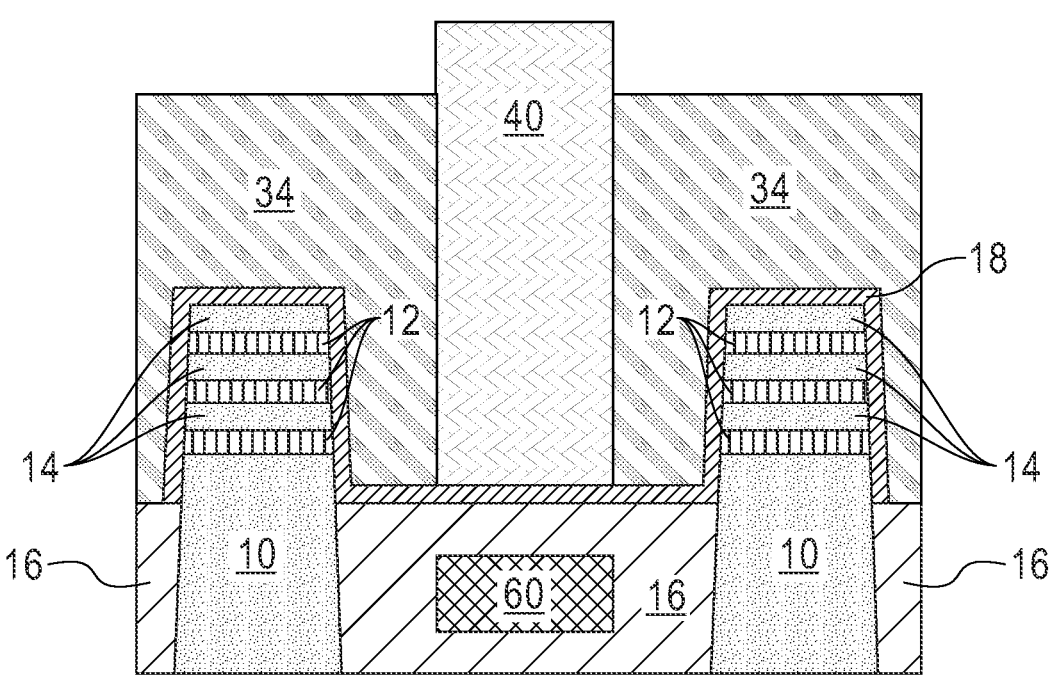
Figure 26C:
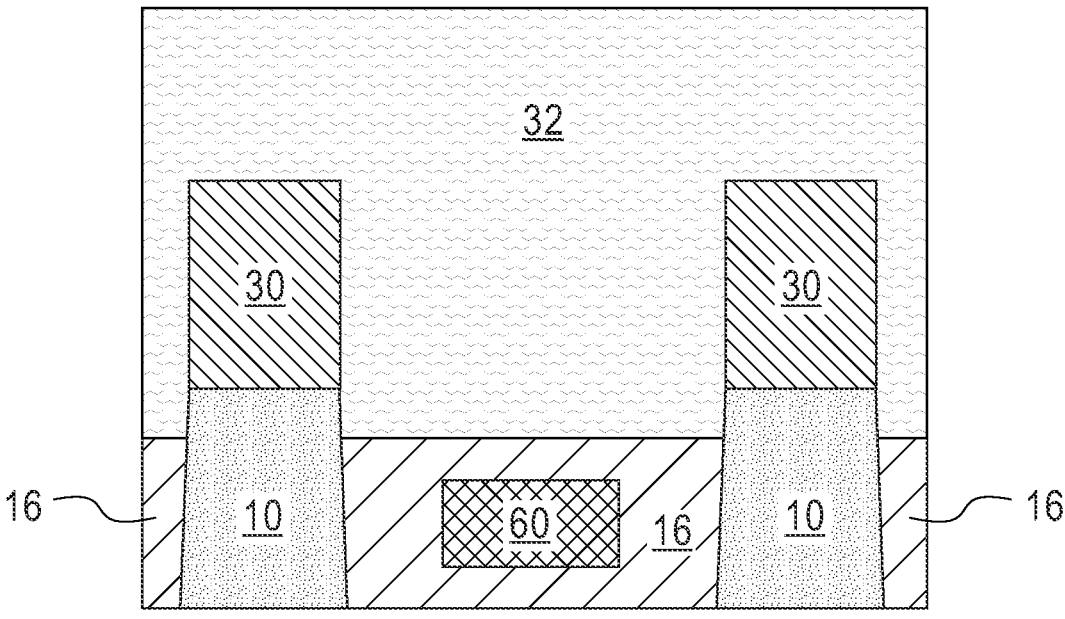

Referring now to FIGS. 26A, 26B and 26C, there are illustrated the exemplary structure shown in FIGS. 25A, 25B and 25C, respectively, after removing the gate cut trench mask 36. The removal of the gate cut trench mask 36 for this embodiment of the present application is the same as removing the gate cut trench mask 36 in the previous embodiment of the present application (See, for example, the description above with respect to FIGS. 13A, 13B and 13C).

Figure 27A:
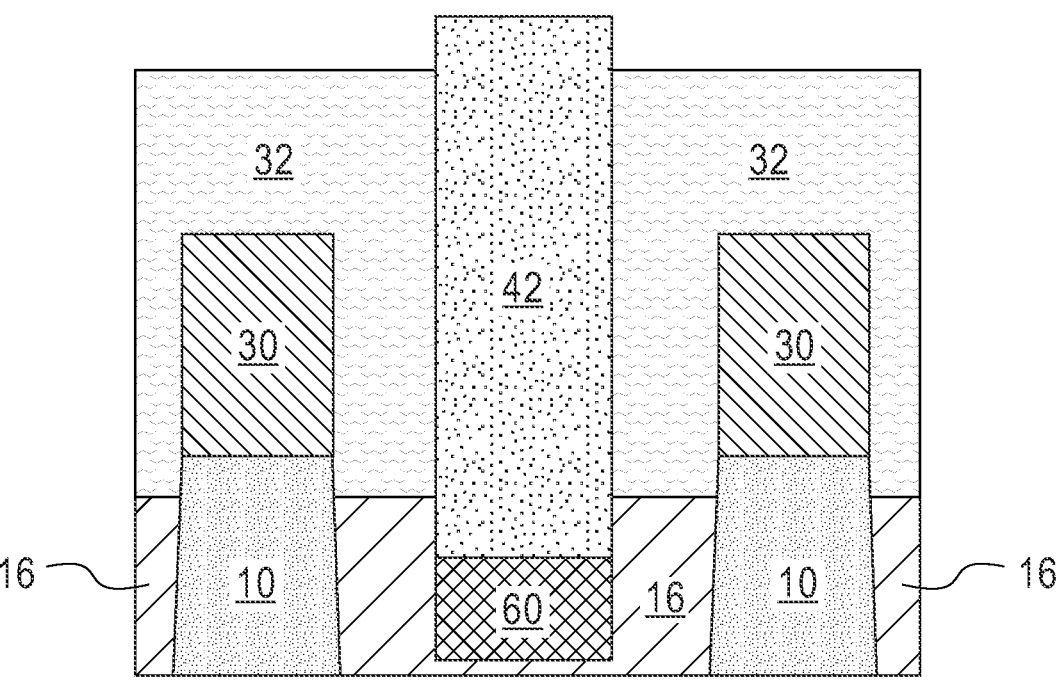
FIGS. 27A, 27B and 27C are cross sectional views of the exemplary structure shown in FIGS. 26A, 26B and 26C, respectively, after removing the layer of polysilicon and the first dielectric material layer to reveal the second and third nanosheet stacks, and replacing each sacrificial semiconductor material nanosheet of the second and third nanosheet stacks with a functional gate structure.
Figure 27B:
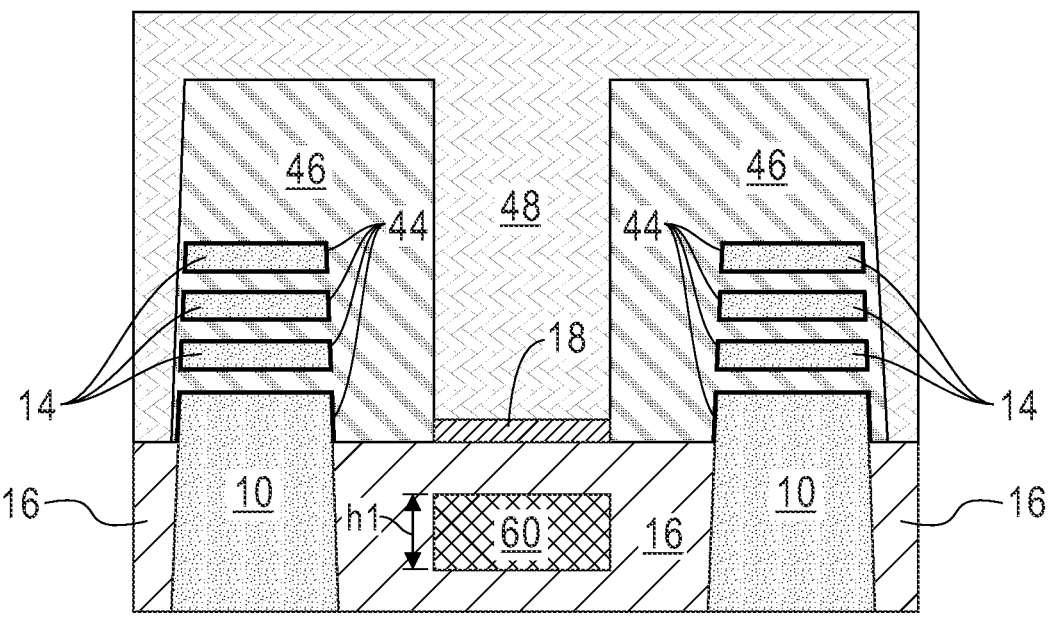
Figure 27C:
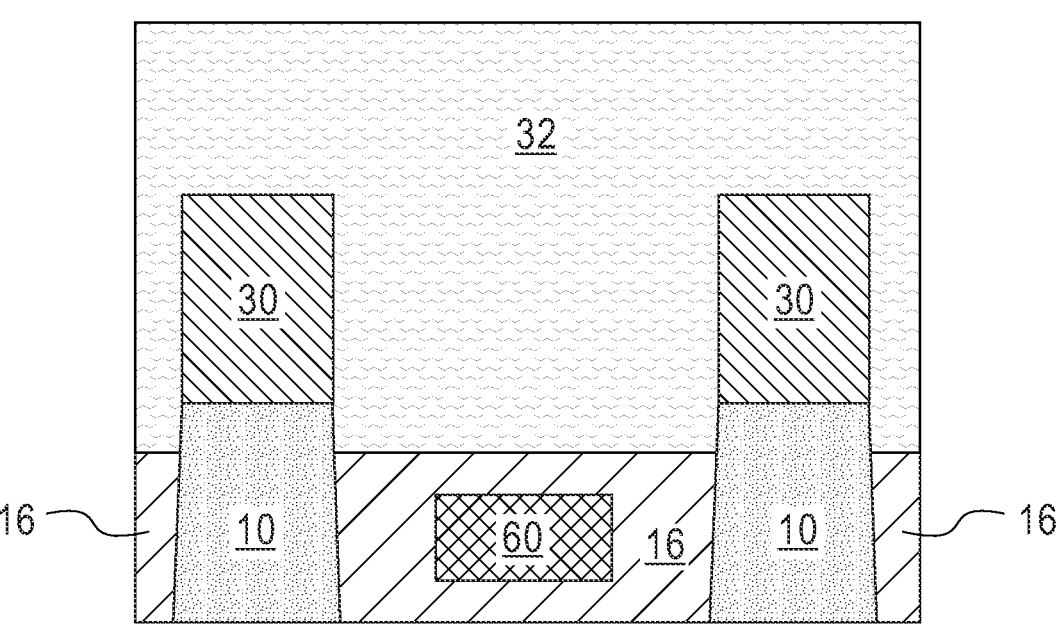

Referring now to FIGS. 27A, 27B and 27C, there are illustrated the exemplary structure shown in FIGS. 26A, 26B and 26C, respectively, after removing the layer of polysilicon 34 and the first dielectric material layer 18 to reveal the second and third nanosheet stacks, and replacing each sacrificial semiconductor material nanosheet 12 of the second and third nanosheet stacks with a functional gate structure 44, 46.

After forming the functional gate structure 44, 46, additional dielectric material is formed on top of the dielectric material 40. Collectively, the additional dielectric material and the dielectric material 40 provide a dielectric material structure 48. The dielectric structure 48 is above and laterally adjacent to each functional gate structure as is shown in FIG. 27B. The additional dielectric material that is used in providing the dielectric material structure 48 can be formed by a deposition process including, but not limited to, CVD, PECVD, PVD or ALD.

The layer of polysilicon 34 can be removed utilizing an etching process as described above in removing the same layer from the structure shown in FIG. 14B above. This removal process stops on the first dielectric material layer 18. The first dielectric material layer 18 is then removed utilizing an etching process that is selective in removing the first dielectric material layer 18. The removal of the first dielectric material layer 18 reveals the second and third nanosheet stacks NS2 and NS3. The sacrificial semiconductor material nanosheets 12 are then removed from the second and third nanosheet stacks NS2 and NS3 utilizing an etching process that is selective in removing the sacrificial semiconductor material nanosheets 12 while maintaining a vertical stack of suspended semiconductor channel material nanosheets 14. The removal of each the sacrificial semiconductor material nanosheet 12 can include an etching process that is selective in removing the sacrificial semiconductor material relative to the semiconductor channel material. Gate cavities (not shown) are formed above and below the vertical stack of suspended semiconductor channel material nanosheets; the gate cavity is also present between each suspended semiconductor channel material nanosheet 14. Each gate cavity is then filled with a functional gate structure 44, 46 as described above in forming the functional gate structure shown in FIG. 14B. Each functional gate structure 44, 46 includes at least a gate dielectric material layer 44 and a gate electrode 46, as described above. The functional gate structure 44, 46 wraps arounds each semiconductor channel material nanosheet 14 with the vertical stack of suspended semiconductor channel material nanosheets 14.

Figure 28A:
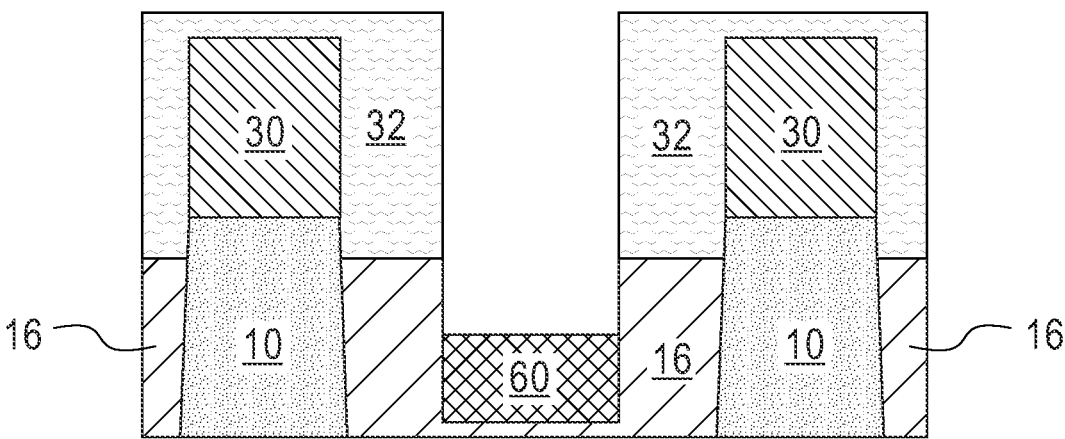
FIGS. 28A, 28B and 28C are cross sectional views of the exemplary structure shown in FIGS. 27A, 27B and 27C, respectively, after removing the placeholder material.
Figure 28B:
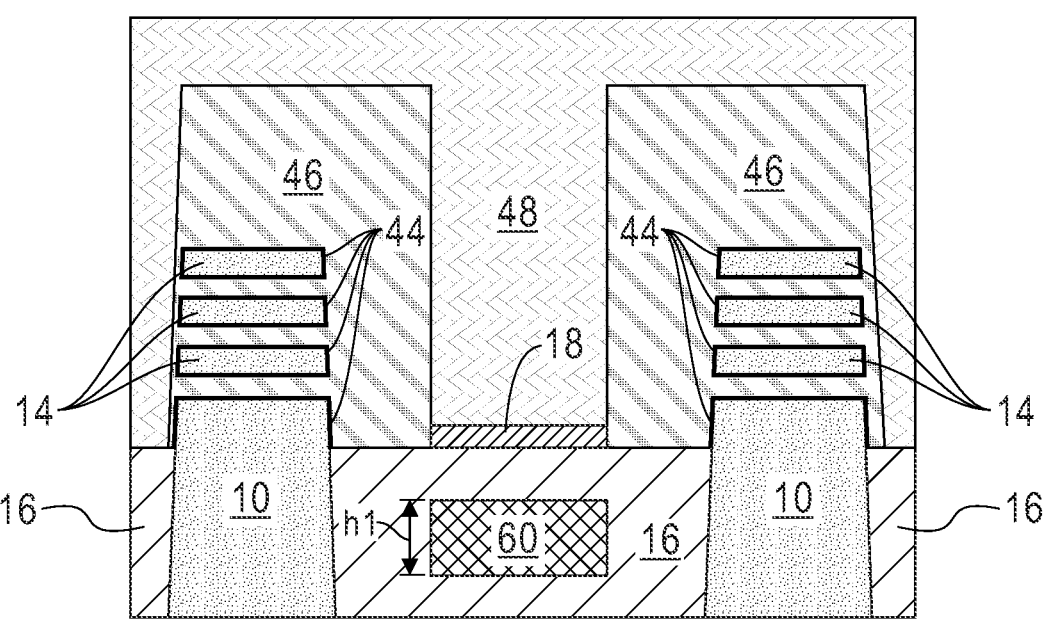
Figure 28C:
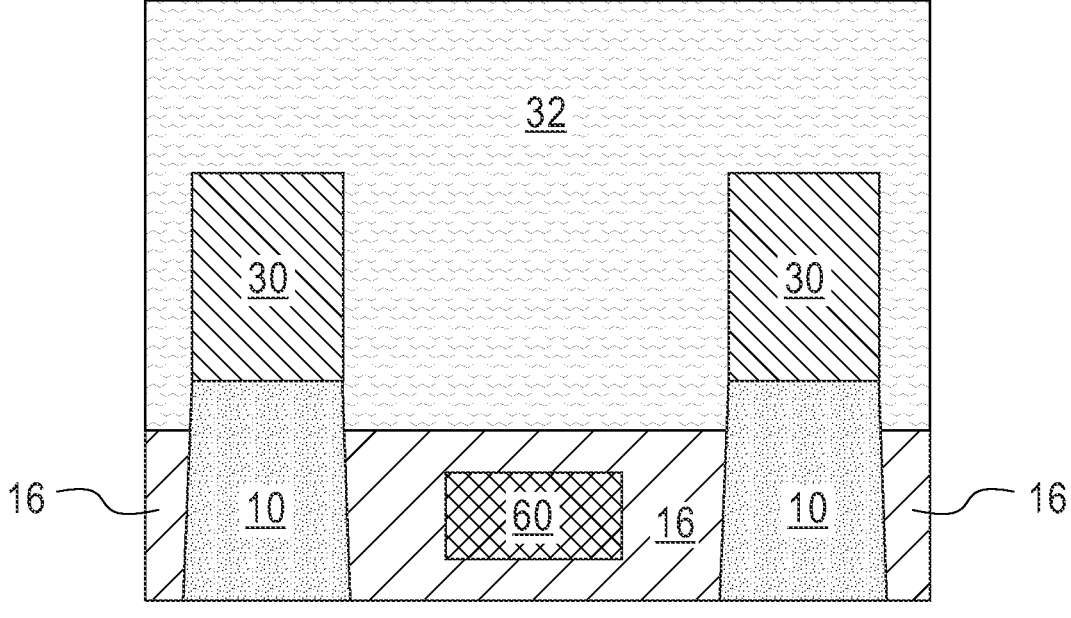

Referring now to FIGS. 28A, 28B and 28C, there are illustrated the exemplary structure shown in FIGS. 27A, 27B and 27C, respectively, and removing the placeholder material 43. The removal of the placeholder material 43 includes an etching process that is selective in removing sacrificial material. The buried power rail conductive material layer 60 within the source/drain gut trench 64 is now physically exposed.

Figure 29A:
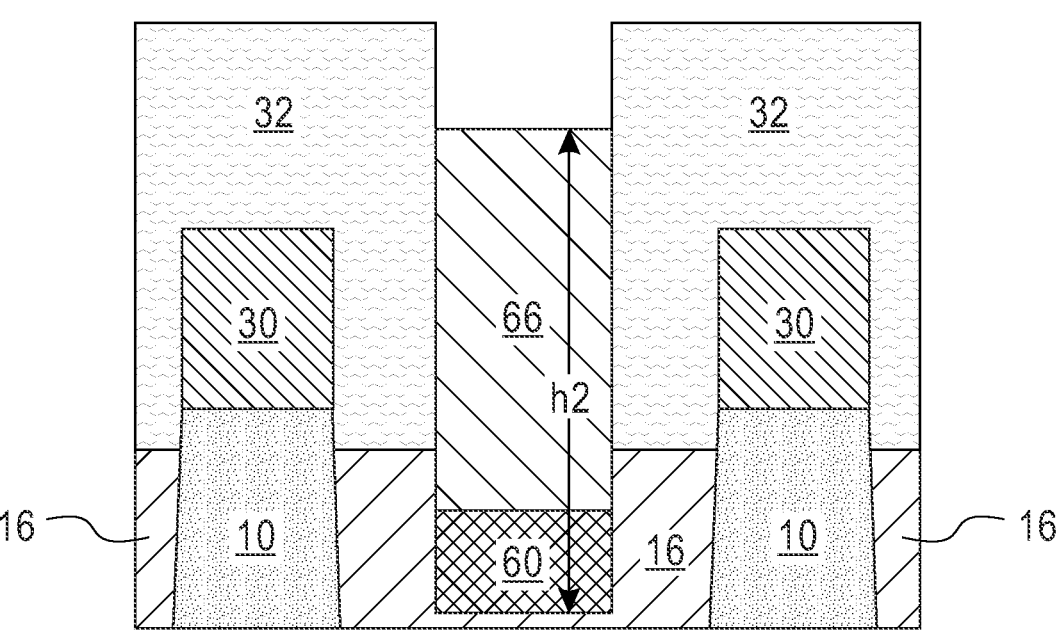
FIGS. 29A, 29B and 29C are cross sectional views of the exemplary structure shown in FIGS. 28A, 28B and 28C, respectively, after forming additional buried power rail conductive material on a physically exposed surface of the buried power rail conductive material layer.
Figure 29B:
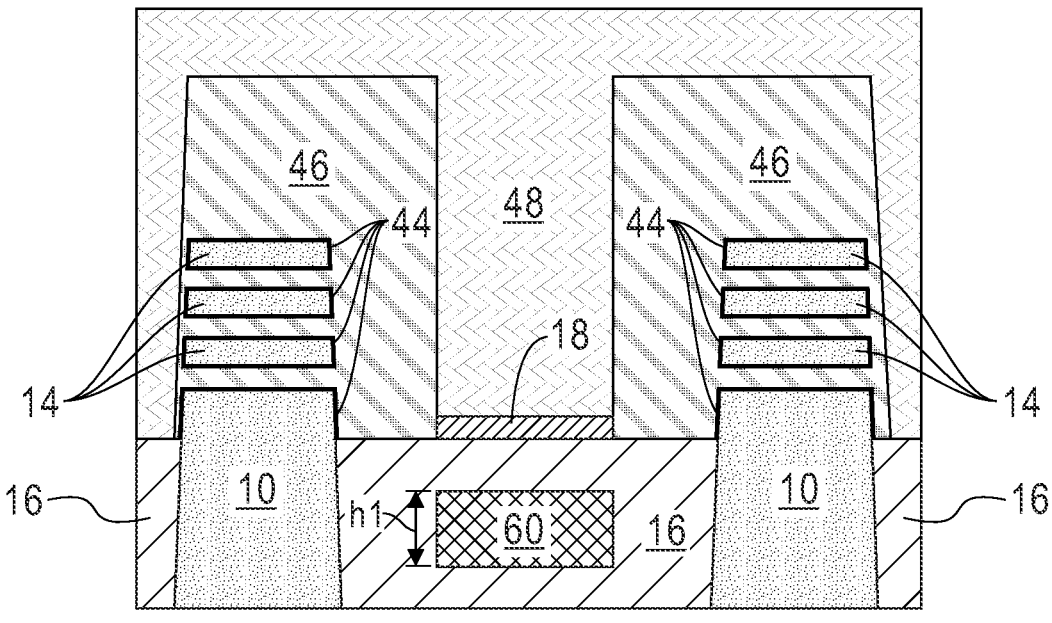
Figure 29C:
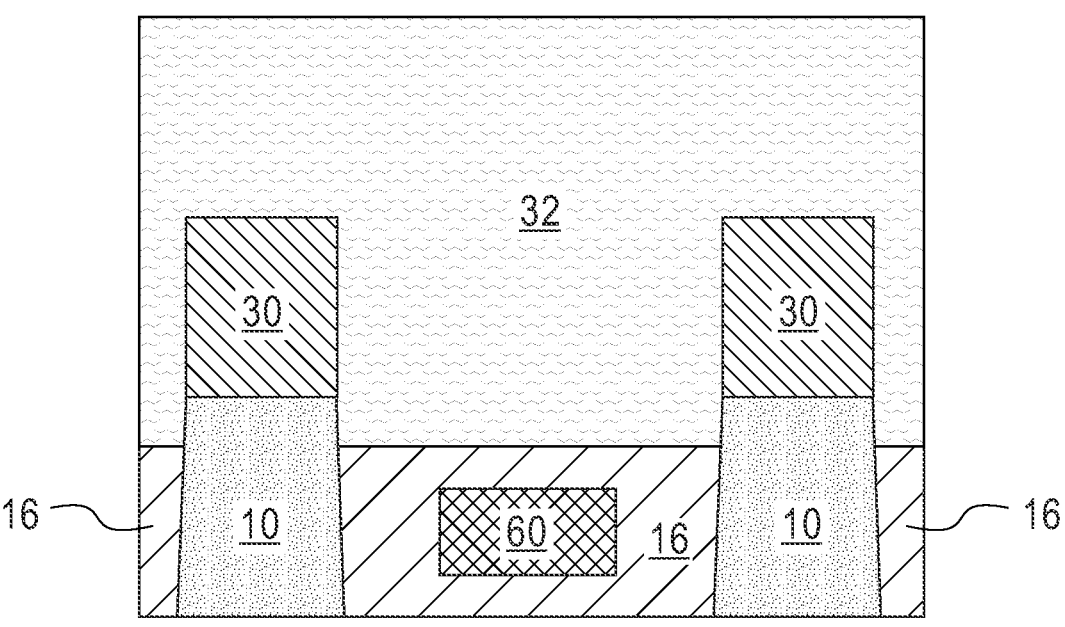

Referring now to FIGS. 29A, 29B and 29C, there are illustrated the exemplary structure shown in FIGS. 28A, 28B and 28C, respectively, after forming additional buried power rail conductive material 66 on a physically exposed surface of the buried power rail conductive material layer 60 (See, FIG. 29A). In this embodiment, the buried power rail conductive material layer 60 and the additional buried power rail conductive material 66 collectively provide a buried power rail that can have an adjustable height. The additional buried power rail conductive material 66 can include one of the electrically conductive power rail materials mentioned above for buried power rail 52. In some embodiments, the additional buried power rail conductive material 66 is compositionally the same as the buried power rail conductive material layer 60. In such an embodiment, no material interface exists between the buried power rail conductive material layer 60 and the additional buried power rail conductive material 66. In other embodiments, the additional buried power rail conductive material 66 is compositionally different from the buried power rail conductive material layer 60. In such an embodiment, a material interface exists between the buried power rail conductive material layer 60 and the additional buried power rail conductive material 66. The additional buried power rail conductive material 66 can be formed by deposition of an electrically conductive power rail material, followed by a recess etch.

In this embodiment the buried power rail (i.e., buried power rail conductive material layer 60) has a first portion (See, FIG. 29B) that is present in the gate cut trench 62 that has a first height h1, and a second portion (i.e., buried power rail conductive material layer 60 and the additional power rail conductive material 66; See, FIG. 29A) in the source/drain cut trench 64 that has a second height h2 that is greater than the first height. As is shown in FIG. 29B, the first portion of the buried power rail is located entirely beneath a topmost surface of a shallow trench isolation structure 16, and, as shown in FIG. 29A, the second portion of the buried power rail (notably the additional buried power rail conductive material 66) has an upper portion that extends above the topmost surface of the shallow trench isolation structure 16. FIG. 29C shows a third portion of the buried power rail (i.e., buried power rail conductive material layer 60) that is entirely surrounded by the shallow trench isolation structure 16.

Figure 30A:
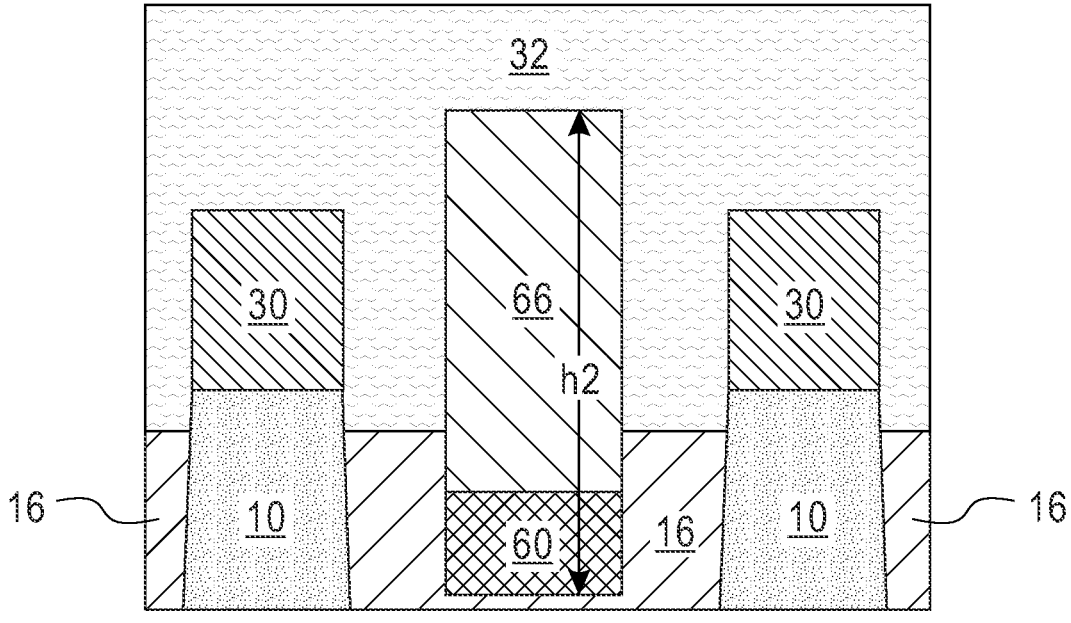
FIGS. 30A, 30B and 30C are cross sectional views of the exemplary structure shown in FIGS. 29A, 29B and 29C after forming additional interlayer dielectric material on the additional buried power rail conductive material.
Figure 30B:
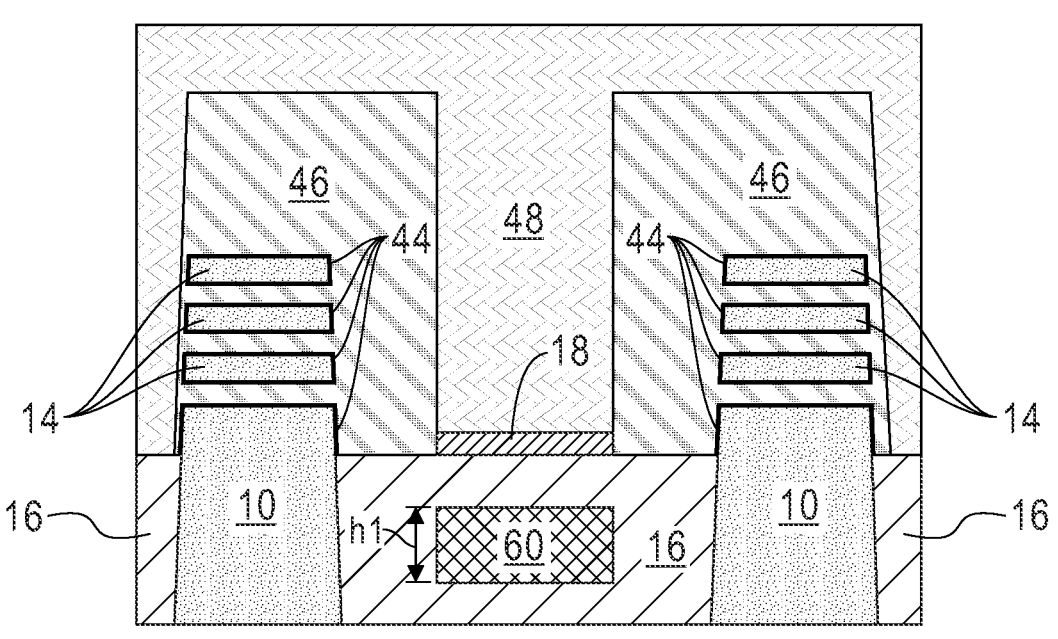
Figure 30C:
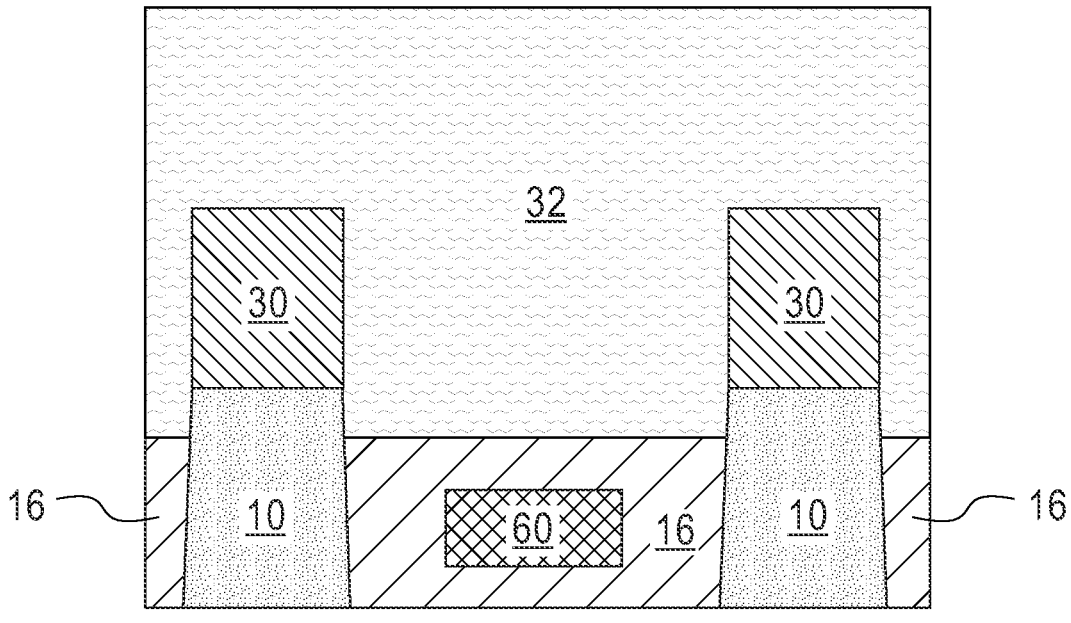

Referring now to FIGS. 30A, 30B and 30C, there are illustrated the exemplary structure shown in FIGS. 29A, 29B and 29C after forming additional interlayer dielectric material on the additional buried power rail conductive material 66. The additional interlayer dielectric material is typically the same as the dielectric material that provides the ILD material layer 32.

Figure 31A:
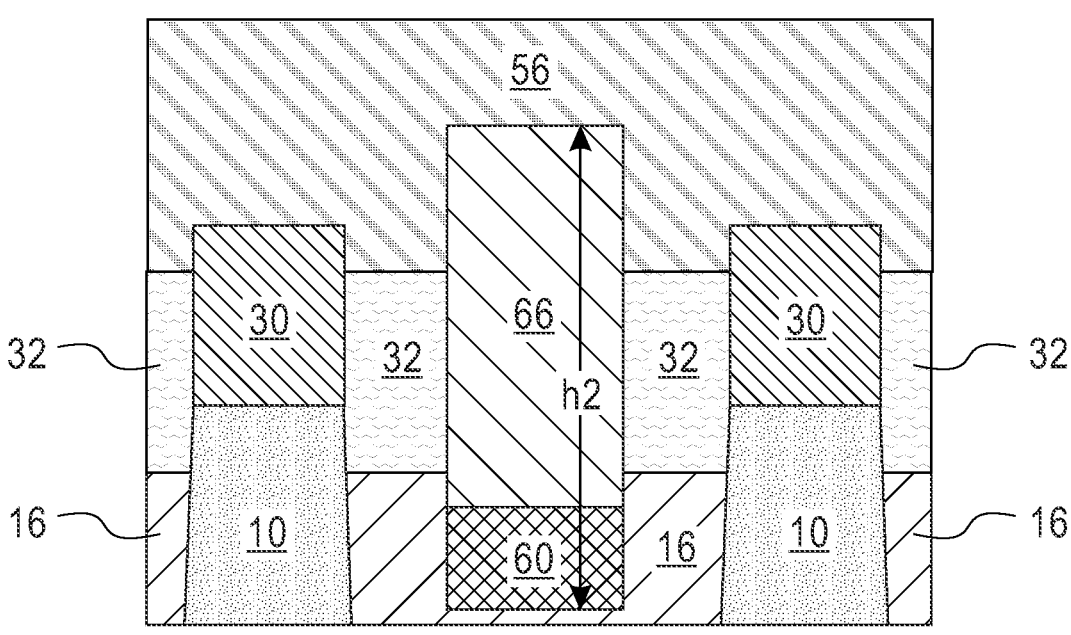
FIGS. 31A, 31B and 31C are cross sectional views of the exemplary structure shown in FIGS. 30A, 30B and 30C, respectively, after forming a conductive contact structure.
Figure 31B:
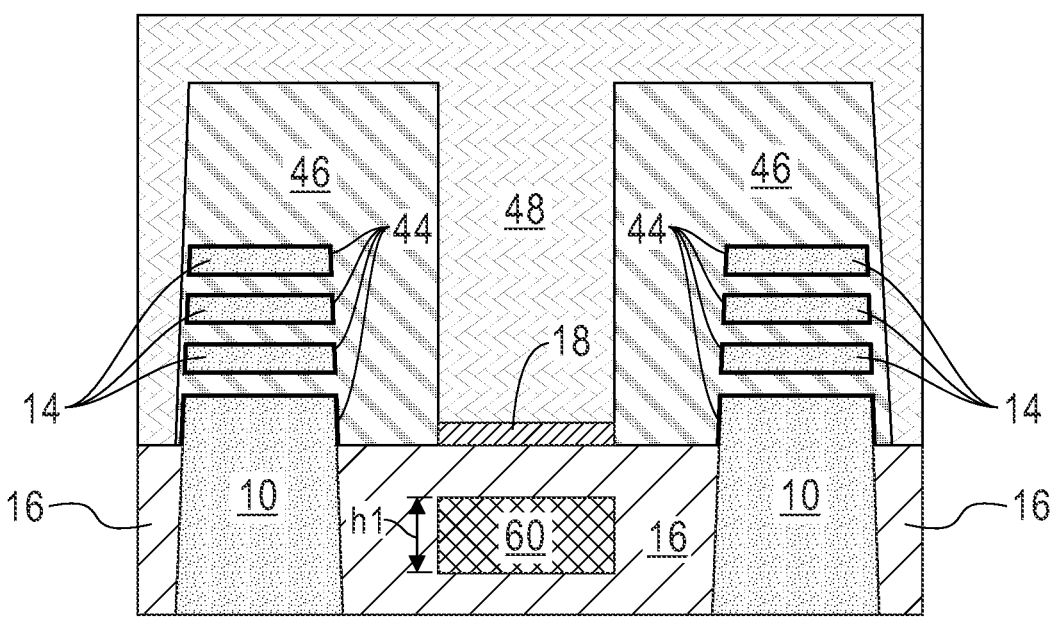
Figure 31C:
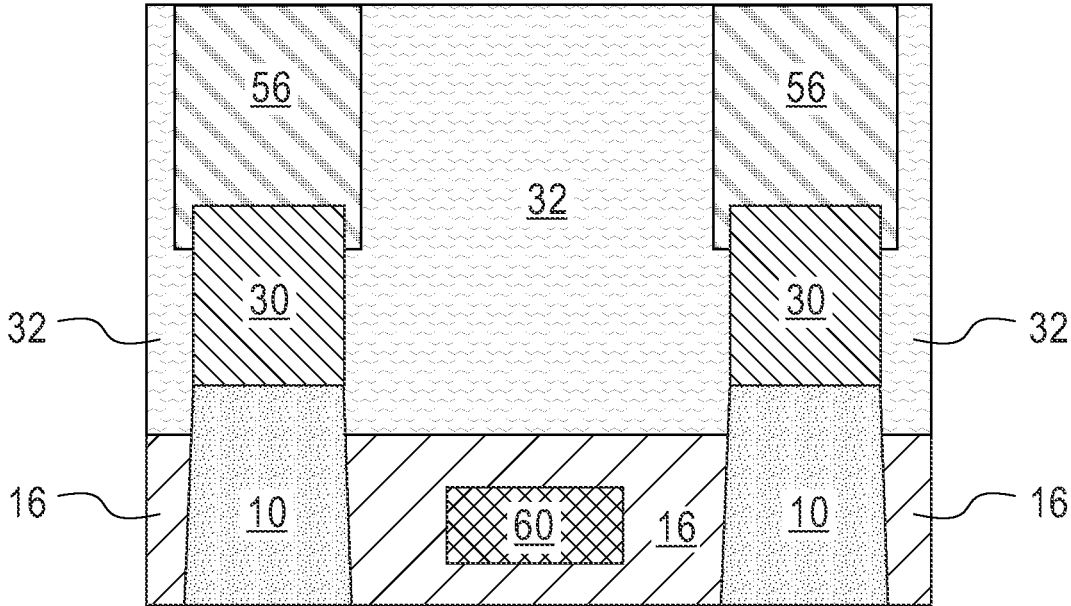

Referring now to FIGS. 31A, 31B and 31C, there are illustrated the exemplary structure shown in FIGS. 30A, 30B and 30C, respectively, after forming a conductive contact structure 56. Conductive contact structure 56 of this embodiment includes materials and can be formed utilizing the same techniques as mentioned above for forming the conductive contact structure 56 shown in FIGS. 18A and 18C.

Figure 32A:
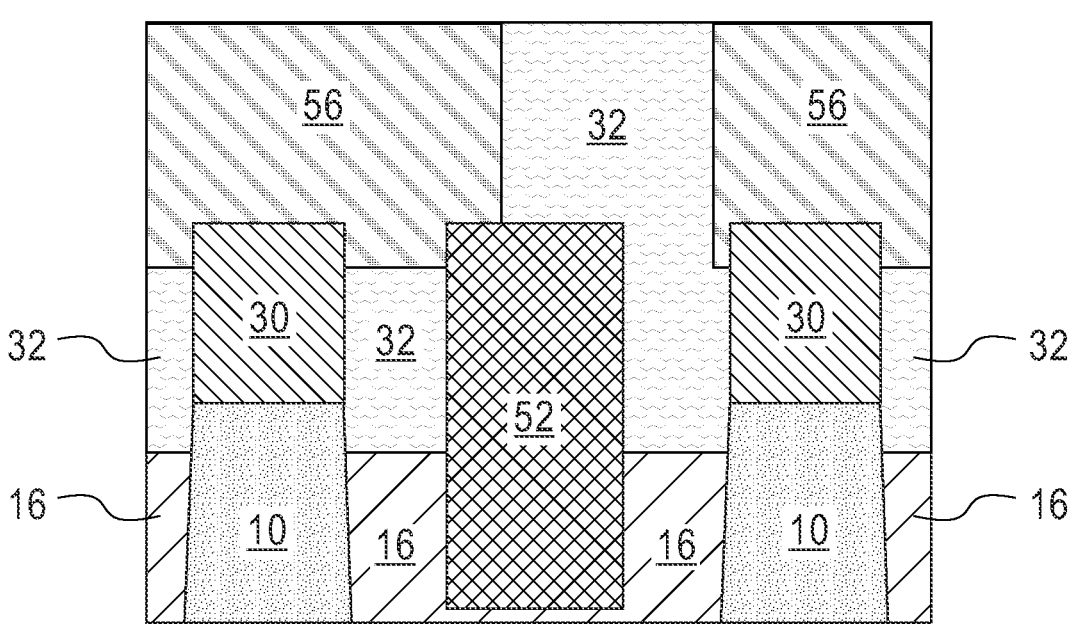
FIGS. 32A and 32B are cross sectional views of exemplary structures of the present application and in the source/drain regions showing different buried power rail and conductive contact structure design combinations.
Figure 32B:
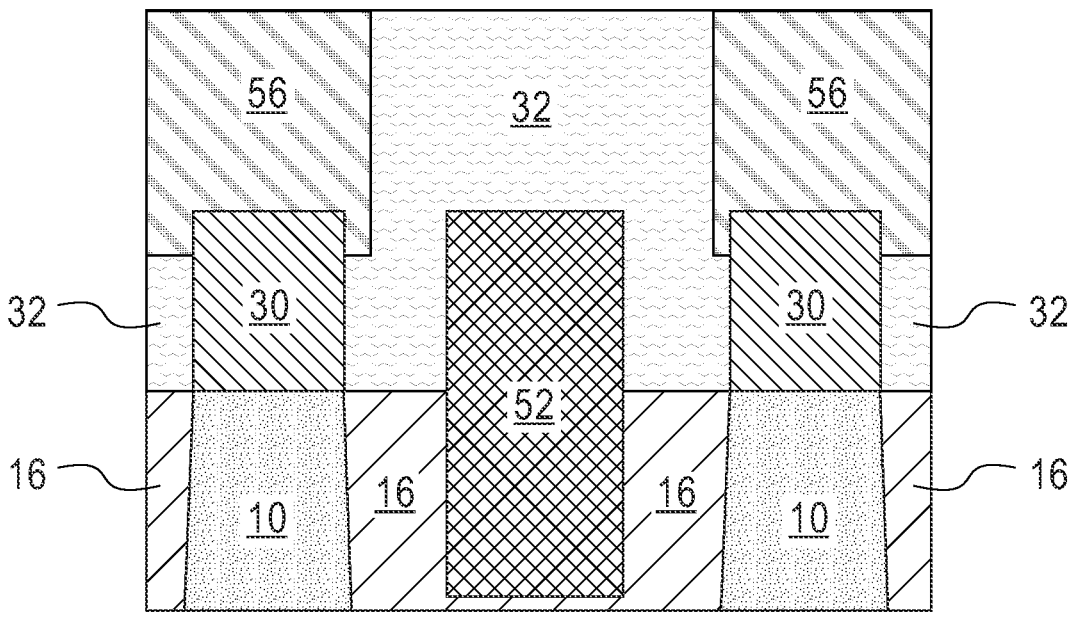
Figure 33A:
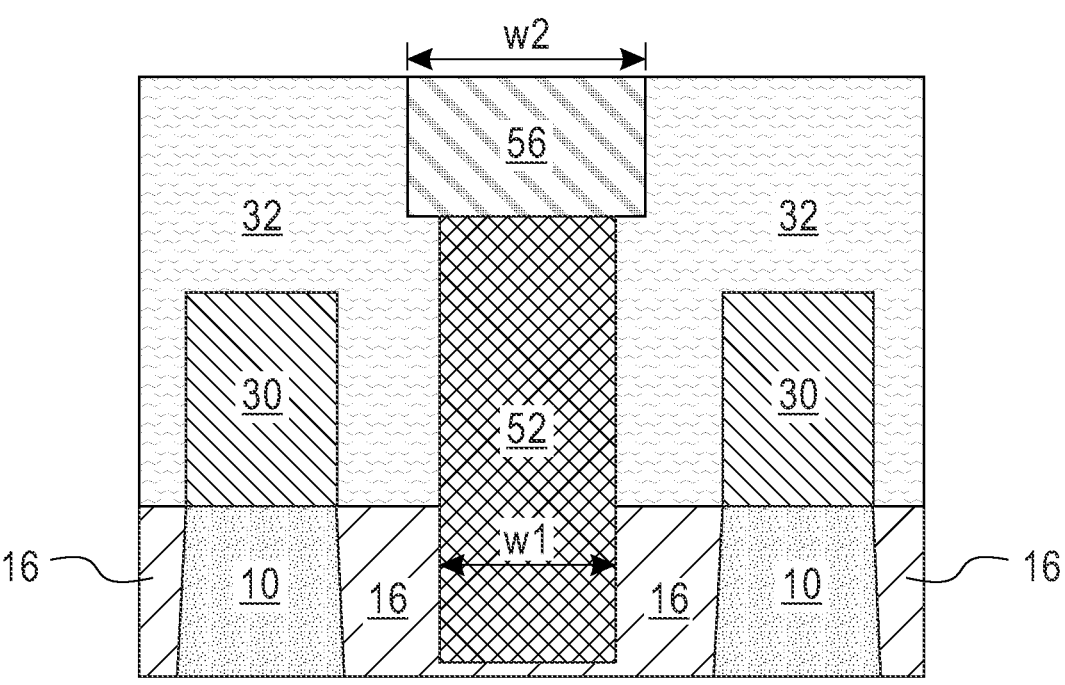
FIGS. 33A and 33B are cross sectional views of exemplary structures of the present application and in the source/drain regions showing different buried power rail and conductive contact structure design combinations.
Figure 33B:
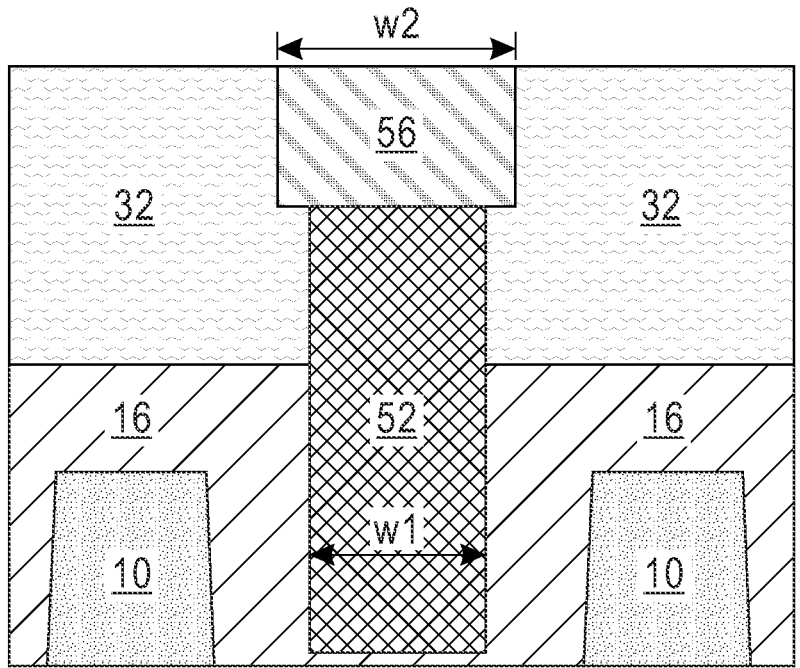

Referring now to FIGS. 32A, 32B, 33A and 33B, there are illustrated exemplary structures in the source/drain regions showing different buried power rail 52 and conductive contact structure 56 design combinations; the structures illustrated in FIGS. 32A, 32B, 33A and 33B are in accordance with the present application. In FIGS. 32A, 32B, 33A and 33B, element 10 is a pedestal portion of a semiconductor substrate, element 16 is a shallow trench isolation, element 30 is a source/drain region, element 32 is an ILD material layer, element 52 is a buried power rail, and element 56 is a conductive contact structure, each as defined above. Notably, FIG. 32A illustrates a first flexible design in which only a single conductive contact structure 56 directly contacts the buried power rail 52; the direct contact occurs along an upper sidewall portion of the buried power rail 52 and along a portion of the topmost surface of the buried power rail 52. FIG. 32B illustrates a second flexible design in which there is no direct physical contact with the conductive contact structures 56 and the buried power rail 52, instead, each conductive contact structure 56 directly contacts a surface of one of the source/drain regions 30. FIG. 33A illustrates a third flexible design in which the conductive contact structure 56 directly contacts a topmost surface of the buried power rail 52, but not any portion of the source/drain regions 30, while FIG. 33A illustrates a fourth flexible design in which the conductive contact structure 56 directly contacts a topmost surface of the buried power rail 52, note that no source/drain regions 30 are connected with the illustrated buried power rail 52 and could be wiring out from other places. In FIGS. 33A and 33B, the buried power rail 52 has a first width w1, while the conductive contact structure 56 has a second width w2 that is greater than the first width w1. The structure shown in FIGS. 32A, 32B, 33A and 33B can be formed using the placeholder material layer as is illustrated in the embodiment depicted FIGS. 4, 5, 7A-18C, or without using the placeholder material layer as is illustrated in the embodiment depicted FIGS. 19-31B. Thus, the buried power rail 52 can be a combination of the buried power rail conductive material layer 60 and the additional power rail conductive material 66 as mentioned above.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
   a first semiconductor device region comprising at least one semiconductor device;
   a second semiconductor device region comprising at least one other semiconductor device;
   a buried power rail located between the first semiconductor device region and the second semiconductor device region, wherein a first portion of the buried power rail having a first height is present in a gate cut trench and terminates on a first surface of a shallow trench isolation structure, a second portion of the buried power rail having a second height, which is greater than the first height, is present in a source/drain cut trench and terminates on a second surface of the shallow trench isolation structure, and a third portion of the buried power rail that is located between a source/drain region of the at least one semiconductor device and a source/drain region of the at least on other semiconductor device is entirely surrounded by, and entirely embedded in, the shallow trench isolation structure; and
   a conductive contact structure directly contacting at least the source/drain region of the at one semiconductor device present in the first semiconductor device region and the second portion of the buried power rail that is present in the source/drain cut trench.

2. The semiconductor structure of claim 1, wherein the conductive contact structure further directly contacts the source/drain region of the at least one other semiconductor device that is present in the second semiconductor device region.

3. The semiconductor structure of claim 1, further comprising another conductive contact structure directly contacting the source/drain region of the at least one other semiconductor device that is present in the second semiconductor device region.

4. The semiconductor structure of claim 1, wherein the first portion of the buried power rail and the second portion of the buried power rail are composed of a single electrically conductive power rail material.

5. The semiconductor structure of claim 1, wherein the second portion of the buried power rail is composed of a buried power rail conductive material layer and an additional buried power rail conductive material, and the first portion of the buried power rail is composed of only the buried power rail conductive material layer.

6. The semiconductor structure of claim 5, wherein the buried power rail conductive material layer and an additional buried power rail conductive material are composed of a compositionally different electrically conductive power rail material.

7. The semiconductor structure of claim 1, wherein the first portion of the buried power rail is located entirely beneath a topmost surface of the shallow trench isolation structure and the second portion of the buried power rail has an upper portion that extends above the topmost surface of the shallow trench isolation structure.

8. The semiconductor structure of claim 1, wherein the at least one semiconductor device present in the first semiconductor device region comprises a nanosheet containing device, a finFET containing semiconductor device, a semiconductor nanowire containing device or at least one planar semiconductor device, and the at least one other semiconductor device present in the second semiconductor device region comprises a nanosheet containing device, a finFET containing semiconductor device, a semiconductor nanowire semiconductor device, or a planar semiconductor device.

9. The semiconductor structure of claim 8, wherein the at least one semiconductor device present in the first semiconductor device region comprises a first combined sheet device, and the at least one other semiconductor device present in the second semiconductor device region comprises a second combined sheet device, wherein the first combined sheet device comprises a first nanosheet device and a second nanosheet device, wherein the first nanosheet device is located on a first side of a first dielectric pillar and the second nanosheet device is located on a second side of the first dielectric pillar, and the first side of the first dielectric pillar is opposite the second side of the first dielectric pillar; and the second combined sheet device comprises a third nanosheet device and a fourth nanosheet device, wherein the third nanosheet device is located on a first side of a second dielectric pillar and the fourth nanosheet device is located on a second side of the second dielectric pillar, and the first side of the second dielectric pillar is opposite the second side of the second dielectric pillar, and wherein the second nanosheet device of the first combined sheet device faces the third nanosheet device of the second combined sheet device.

* * * * *